US010553284B2

(12) United States Patent
Tsubouchi et al.

(10) Patent No.: US 10,553,284 B2
(45) Date of Patent: Feb. 4, 2020

(54) TRANSMITTER AND RECEIVER

(71) Applicant: Toshiba Memory Corporation, Minato-ku, Tokyo (JP)

(72) Inventors: Yuta Tsubouchi, Tokyo (JP); Jun Deguchi, Kawasaki Kanagawa (JP); Daisuke Miyashita, Kawasaki Kanagawa (JP); Makoto Morimoto, Yokohama Kanagawa (JP); Junji Wadatsumi, Tokyo (JP); Fumihiko Tachibana, Yokohama Kanagawa (JP); Yuji Satoh, Kawasaki Kanagawa (JP); Takashi Toi, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 49 days.

(21) Appl. No.: 15/919,965

(22) Filed: Mar. 13, 2018

(65) Prior Publication Data
US 2019/0074063 A1 Mar. 7, 2019

(30) Foreign Application Priority Data
Sep. 6, 2017 (JP) .................................. 2017-171529

(51) Int. Cl.
| G11C 16/08 | (2006.01) |
| H04J 1/04 | (2006.01) |
| H04J 1/08 | (2006.01) |
| H03K 5/08 | (2006.01) |
| G11C 16/26 | (2006.01) |
| H03K 5/24 | (2006.01) |

(Continued)

(52) U.S. Cl.
CPC .............. *G11C 16/08* (2013.01); *G11C 16/10* (2013.01); *G11C 16/26* (2013.01); *H03K 5/02* (2013.01); *H03K 5/06* (2013.01); *H03K 5/08* (2013.01); *H03K 5/24* (2013.01); *H04J 1/045* (2013.01); *H04J 1/08* (2013.01)

(58) Field of Classification Search
USPC ......................................................... 708/270
See application file for complete search history.

(56) References Cited

U.S. PATENT DOCUMENTS

| 3,488,445 A | 1/1970 | Chang |
| 7,079,445 B2 | 7/2006 | Choi et al. |

(Continued)

FOREIGN PATENT DOCUMENTS

| JP | 2005-044499 A | 2/2005 |
| JP | 2008-009963 A | 1/2008 |
| JP | 2013-513297 A | 4/2013 |

Primary Examiner — Tan V Mai
(74) Attorney, Agent, or Firm — White & Case LLP

(57) ABSTRACT

According to one embodiment, a transmitter includes a 1st circuit configured to execute a 1st band limitation by waveform shaping in a time region with respect to 1st data relating to a 1st channel to generate a 1st signal; a 2nd circuit configured to execute a 2nd band limitation by the waveform shaping in the time region with respect to 2nd data relating to a 2nd channel to generate a 2nd signal; a 3rd circuit configured to generate a 3rd signal based on the 1st signal and a 1st frequency relating to the 1st channel; a 4th circuit configured to generate a 4th signal based on the 2nd signal and a 2nd frequency relating to the 2nd channel; and a 5th circuit configured to generate a 5th signal by multiplexing the 3rd signal and the 4th signal.

13 Claims, 50 Drawing Sheets

(51) Int. Cl.
*H03K 5/06* (2006.01)
*G11C 16/10* (2006.01)
*H03K 5/02* (2006.01)

(56) References Cited

U.S. PATENT DOCUMENTS 8,396,150 B2 3/2013 Kenney et al.
2007/0245061 A1 10/2007 Harriman
2007/0280365 A1* 12/2007 Seki ..................... H04L 5/0046
375/260

* cited by examiner

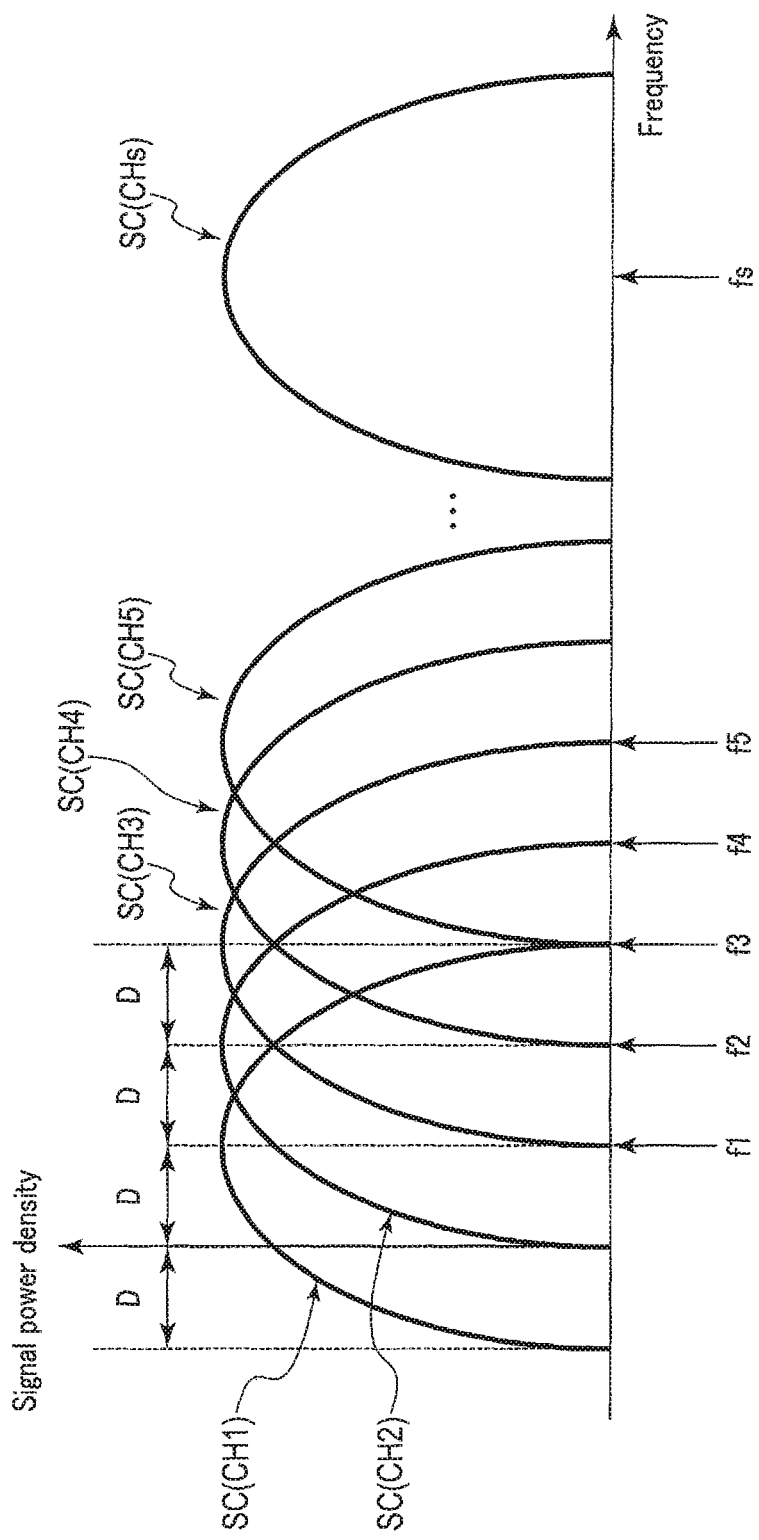
F I G. 5

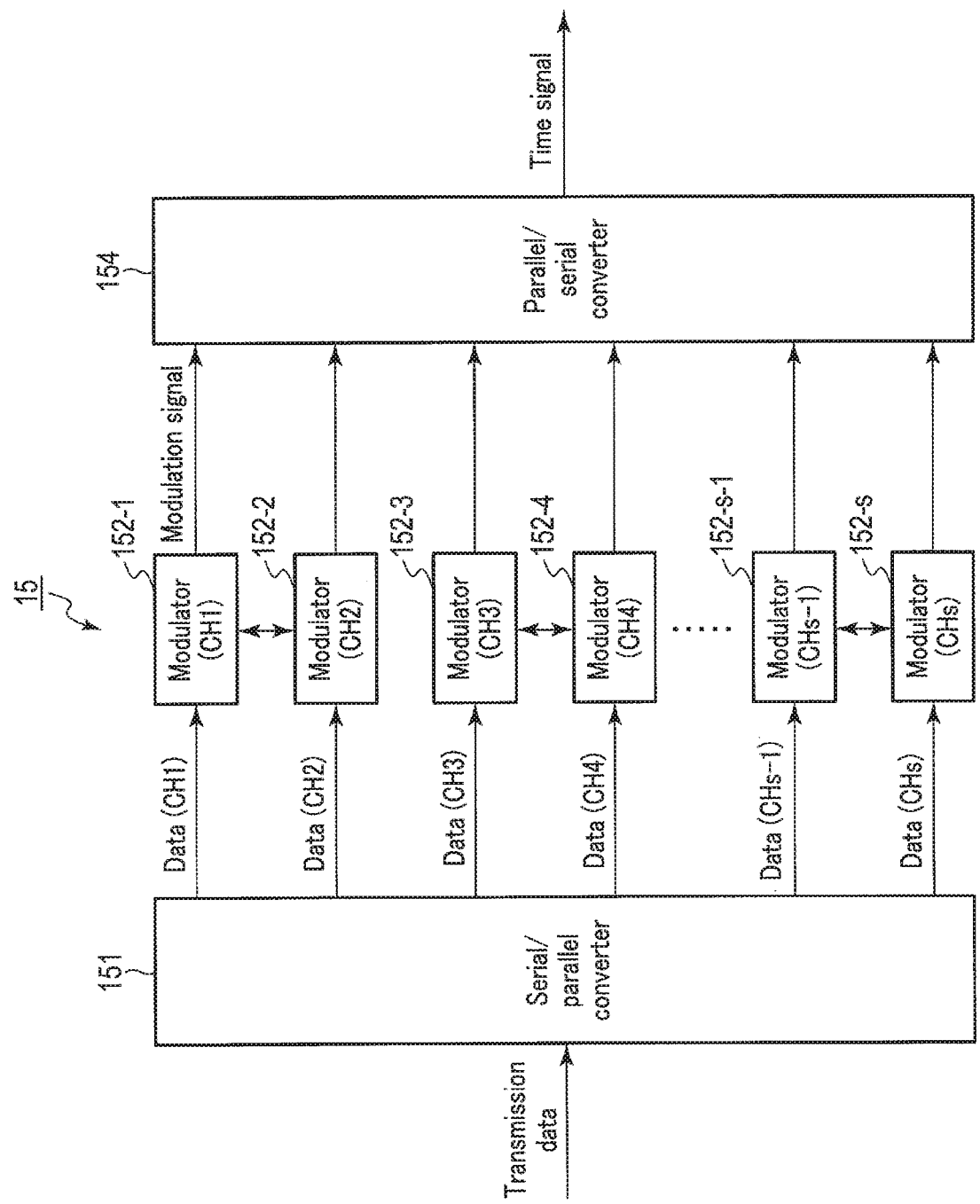
F I G. 6

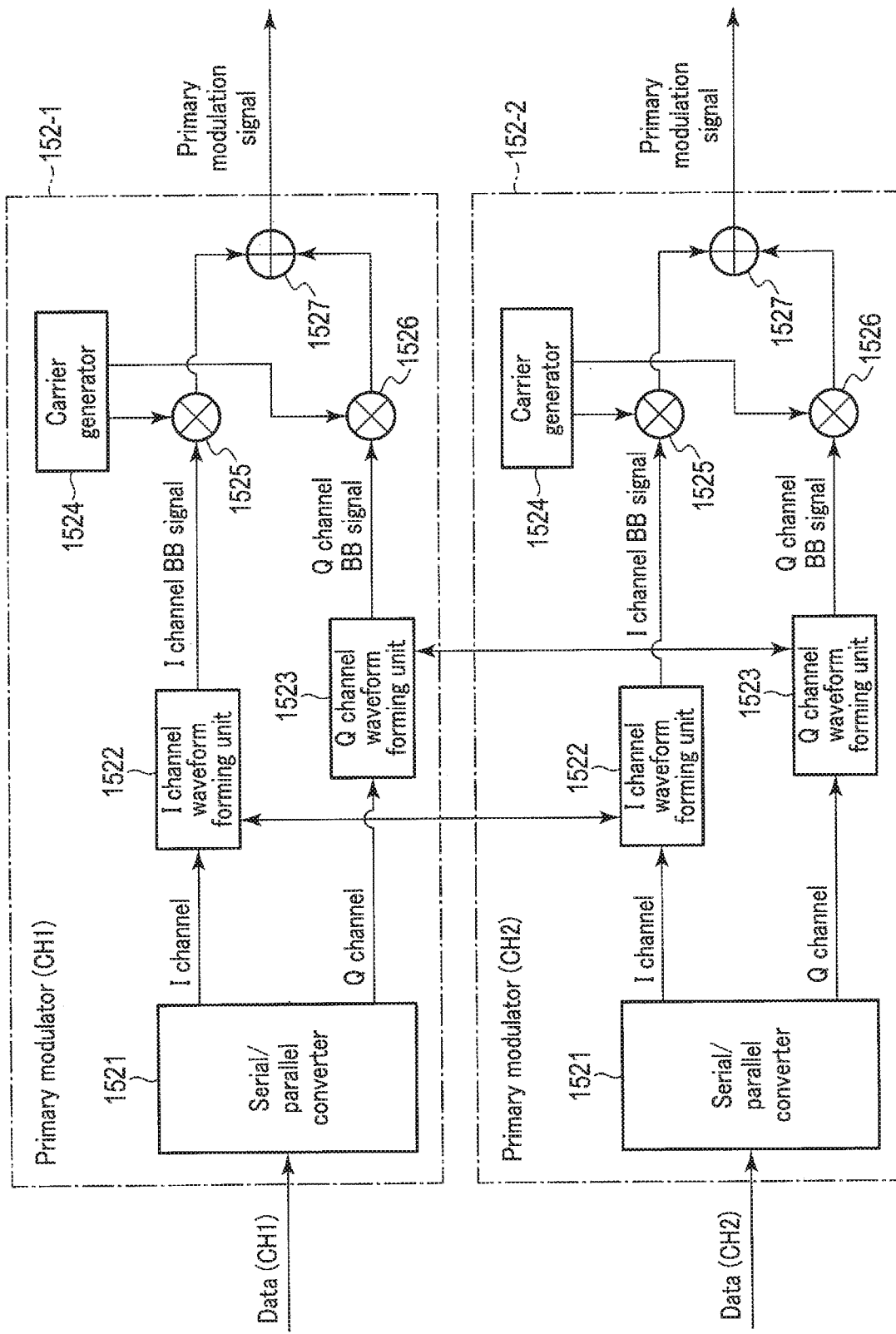
F I G. 10

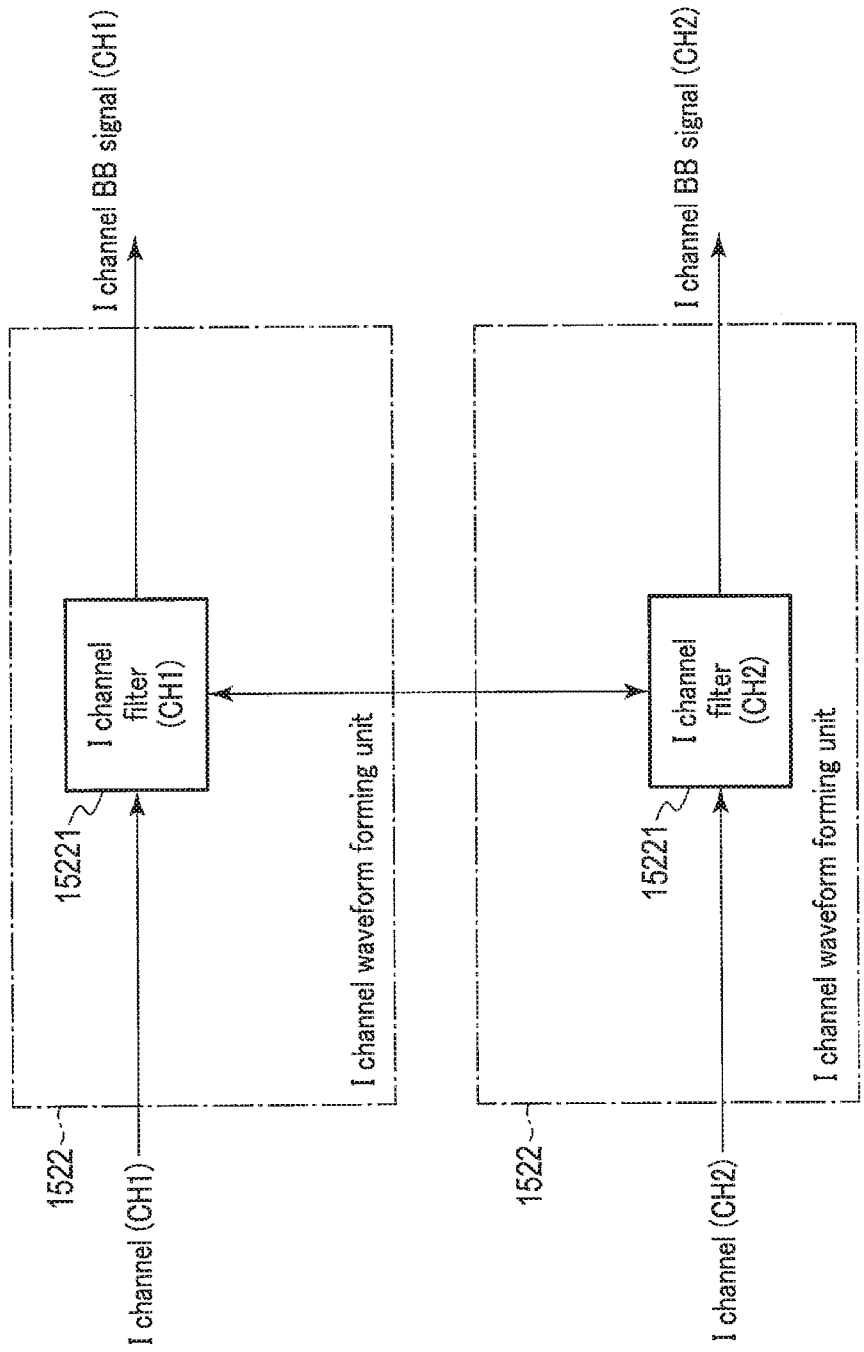
F I G. 11

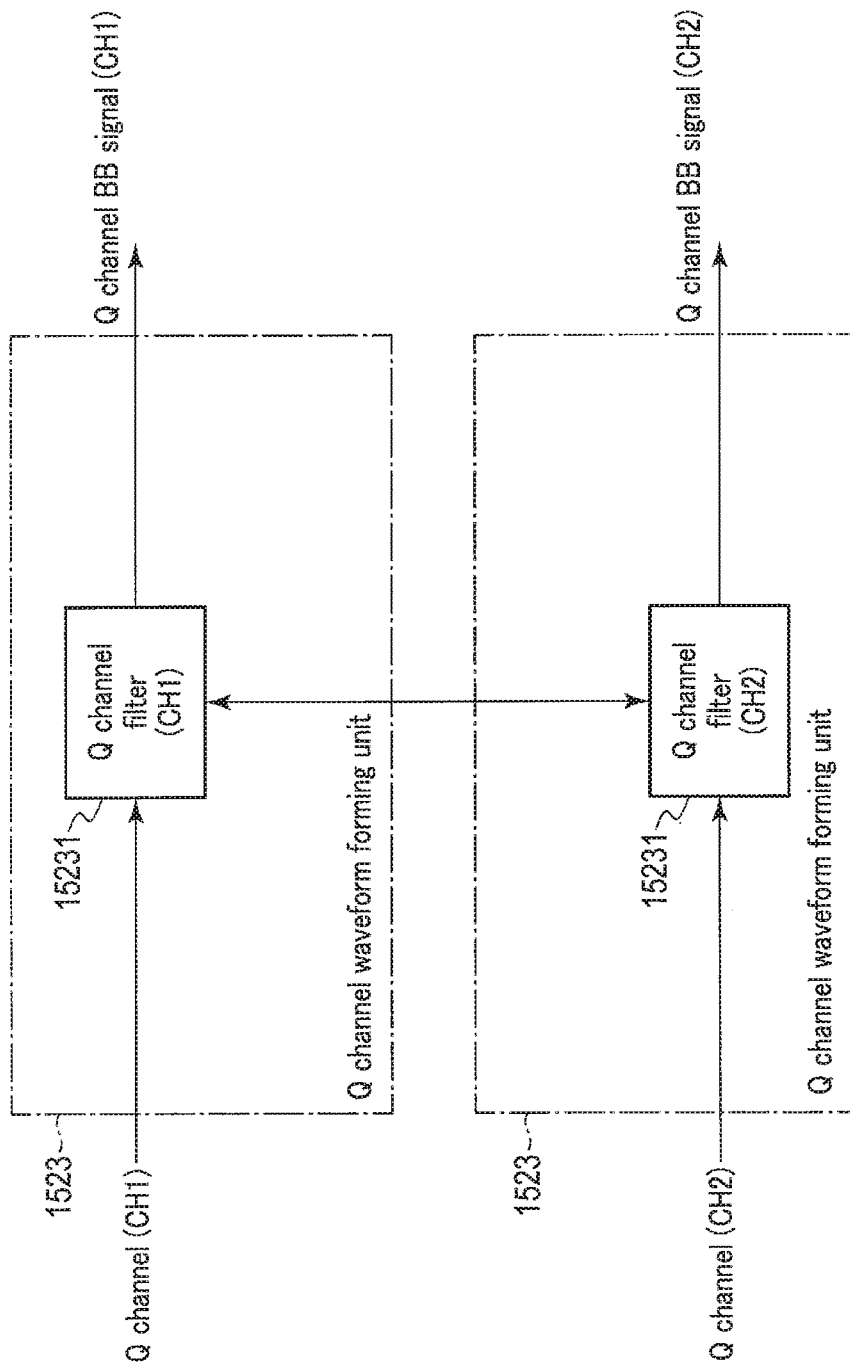
F I G. 12

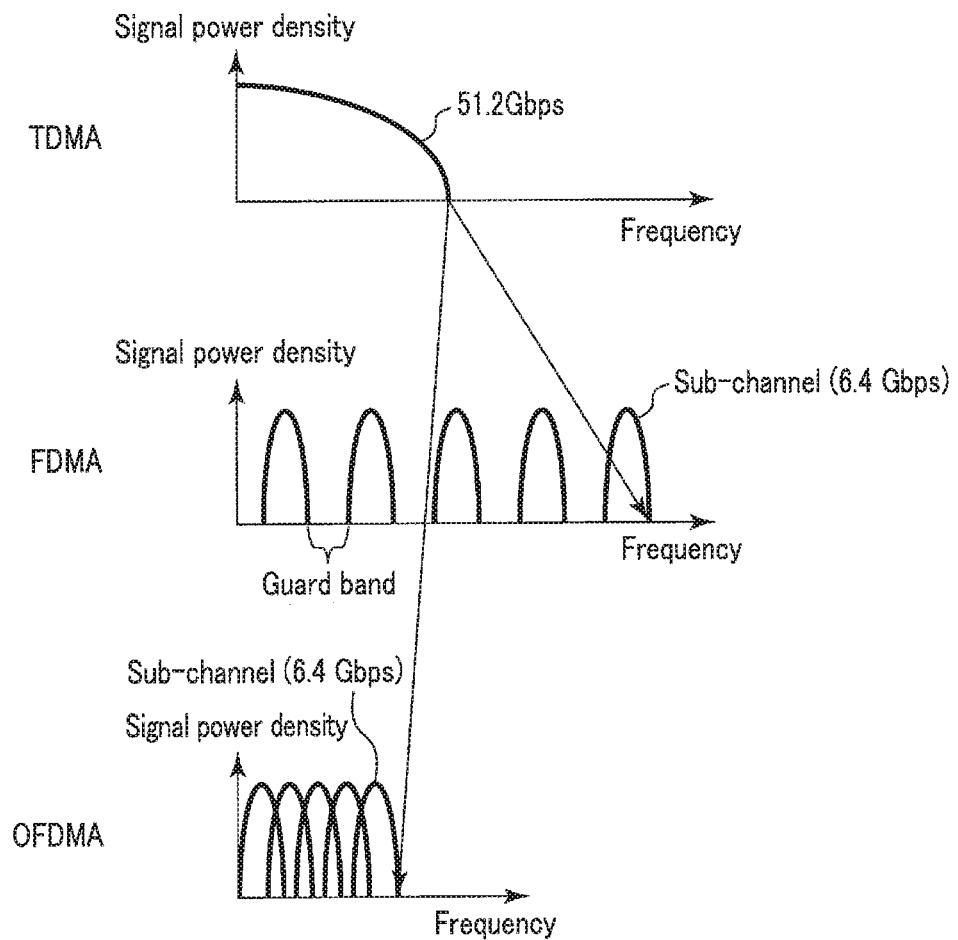
F I G. 15

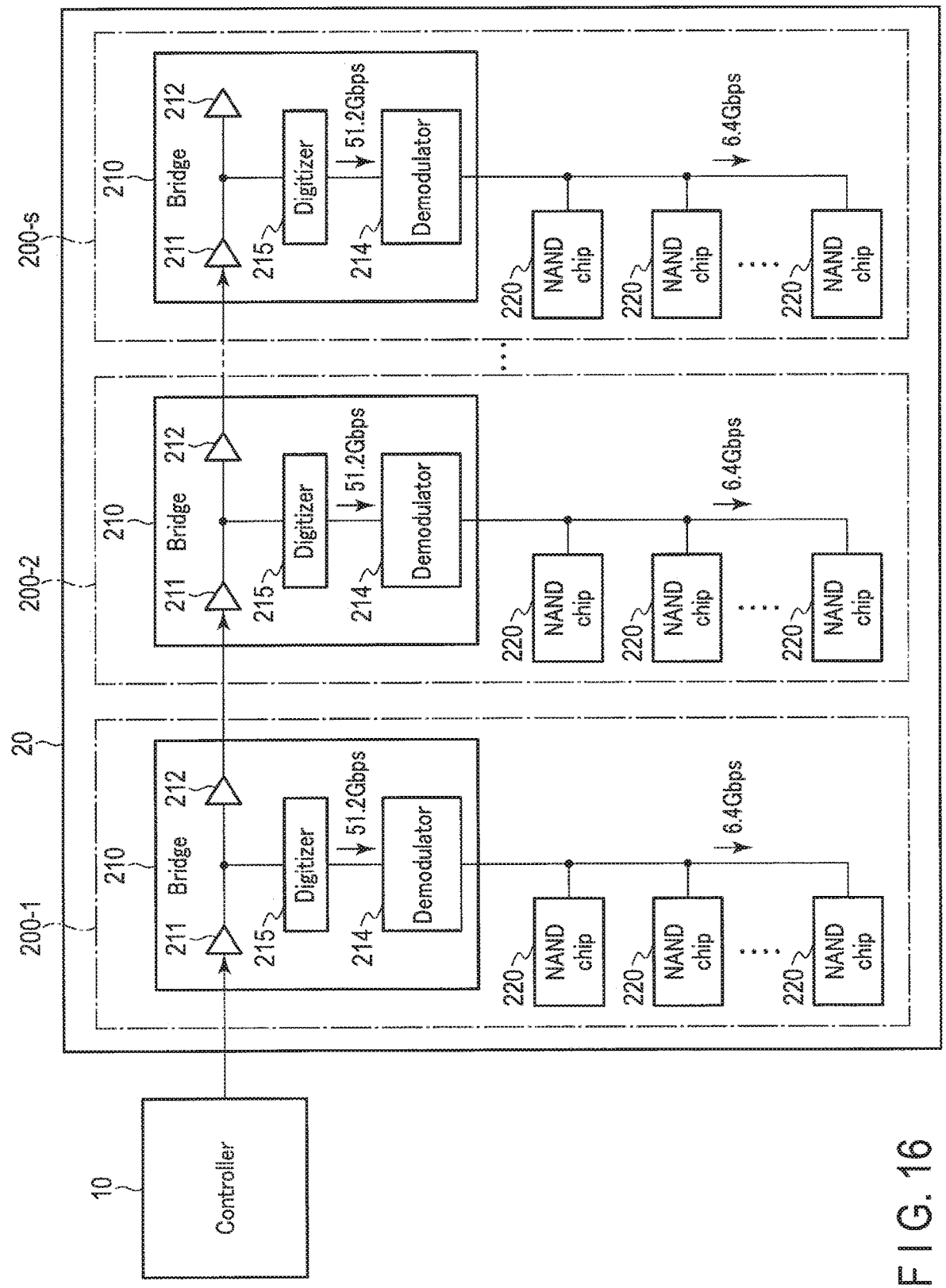
F I G. 16

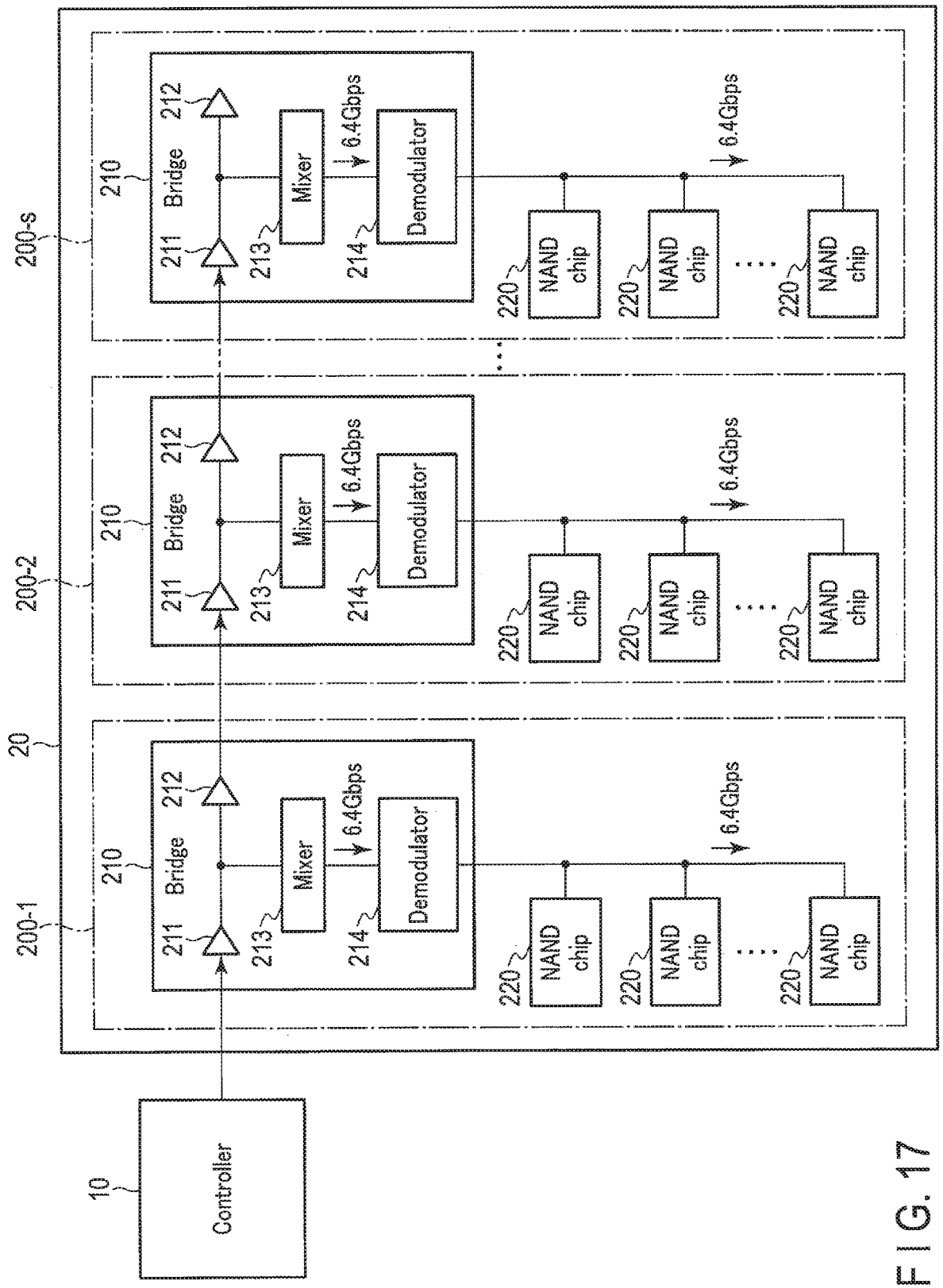
F I G. 17

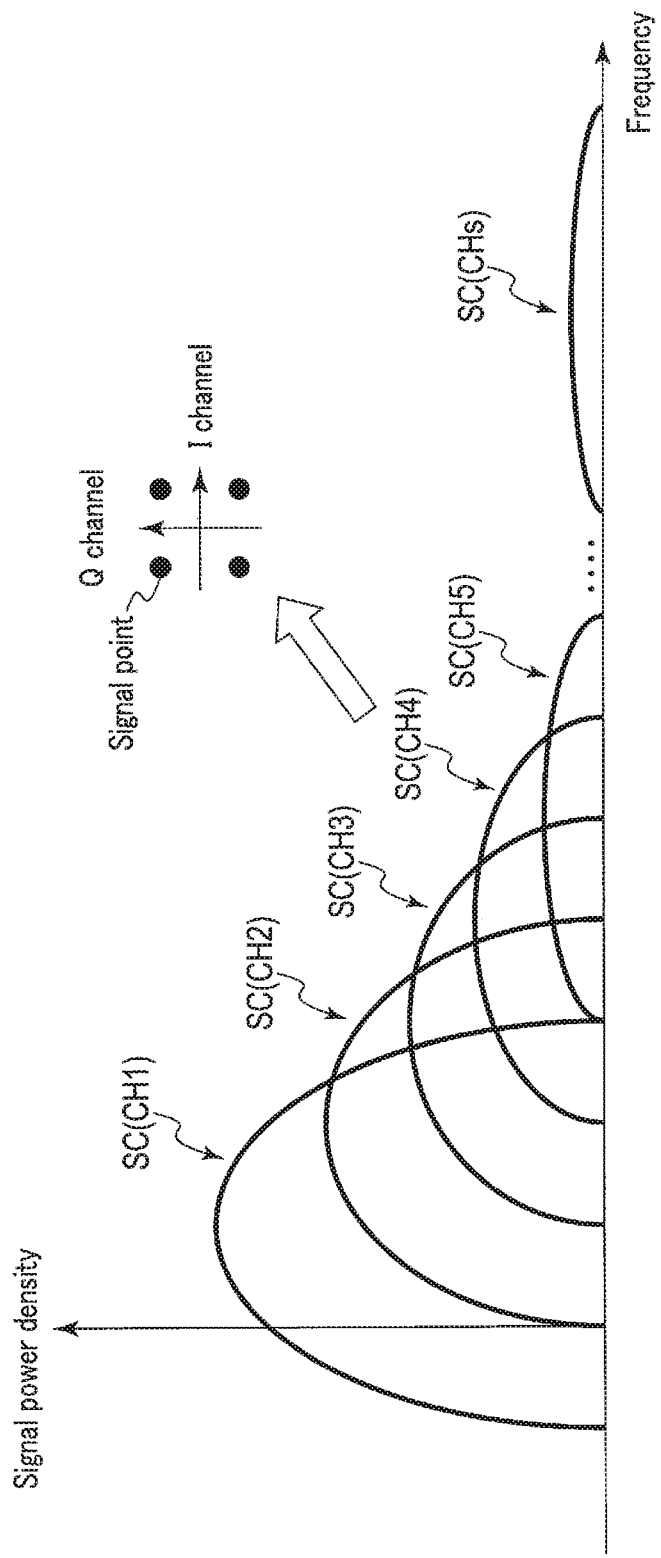
F I G. 20

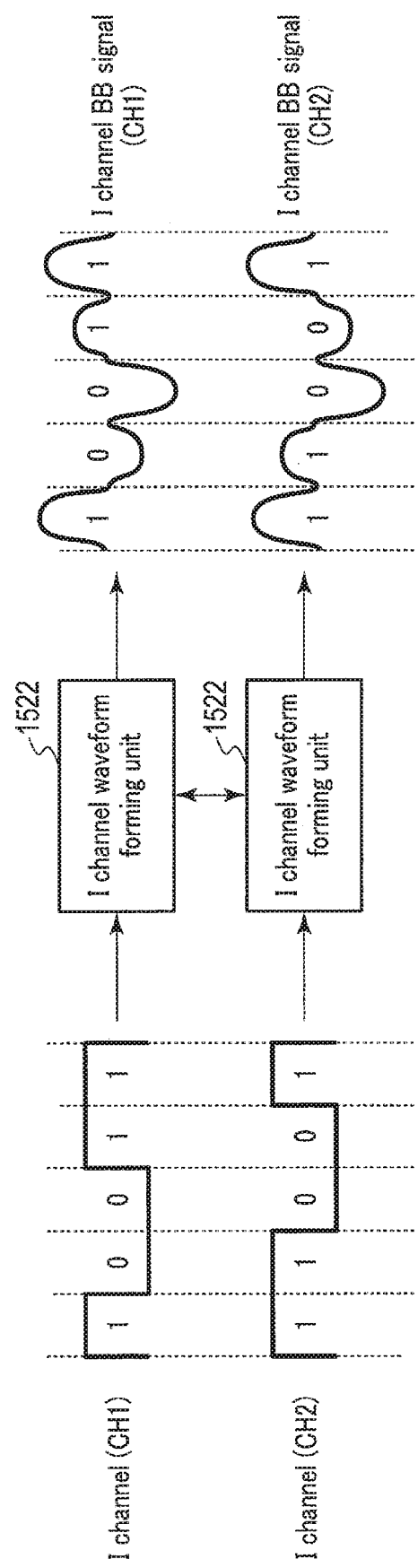
F I G. 21

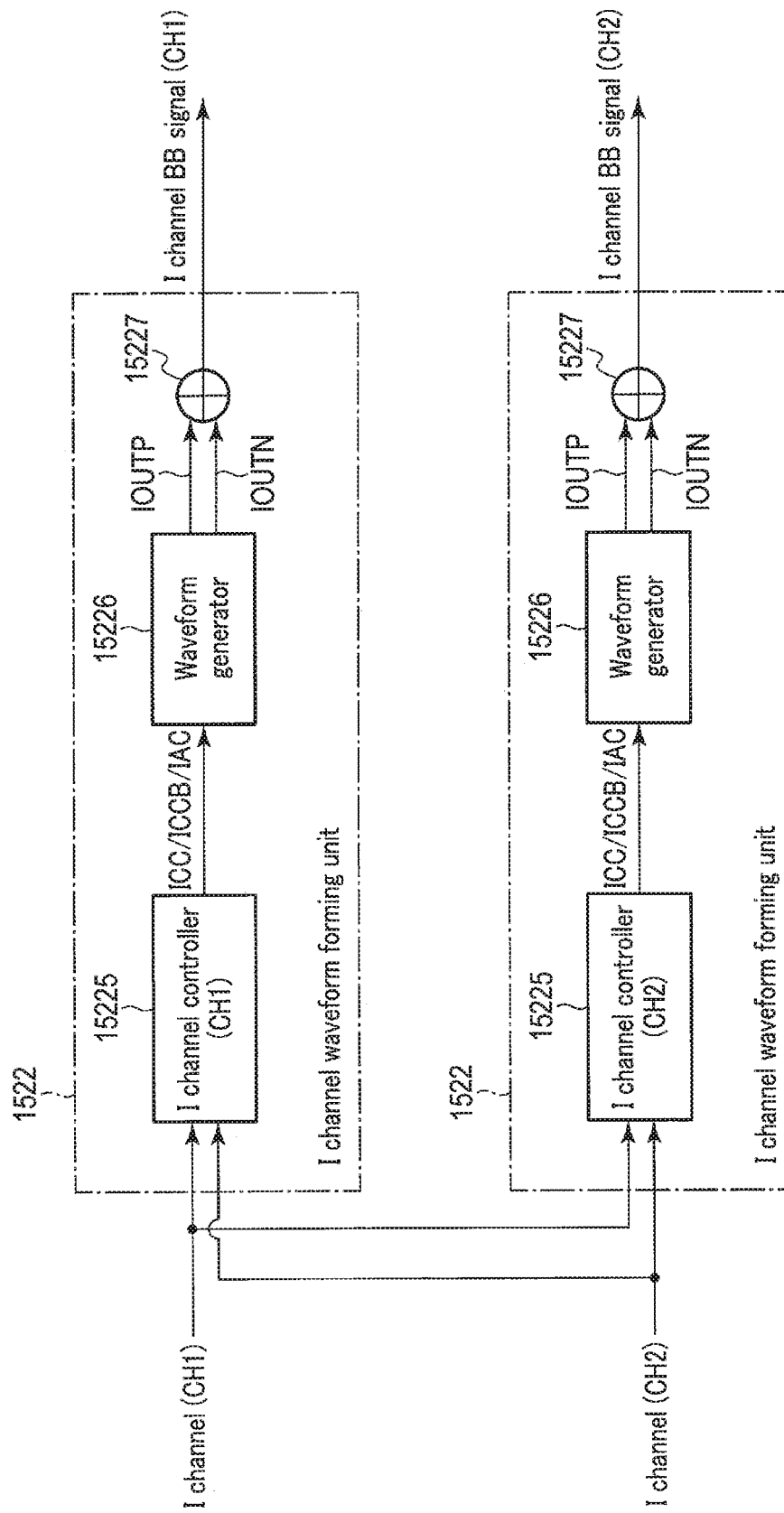
F I G. 22

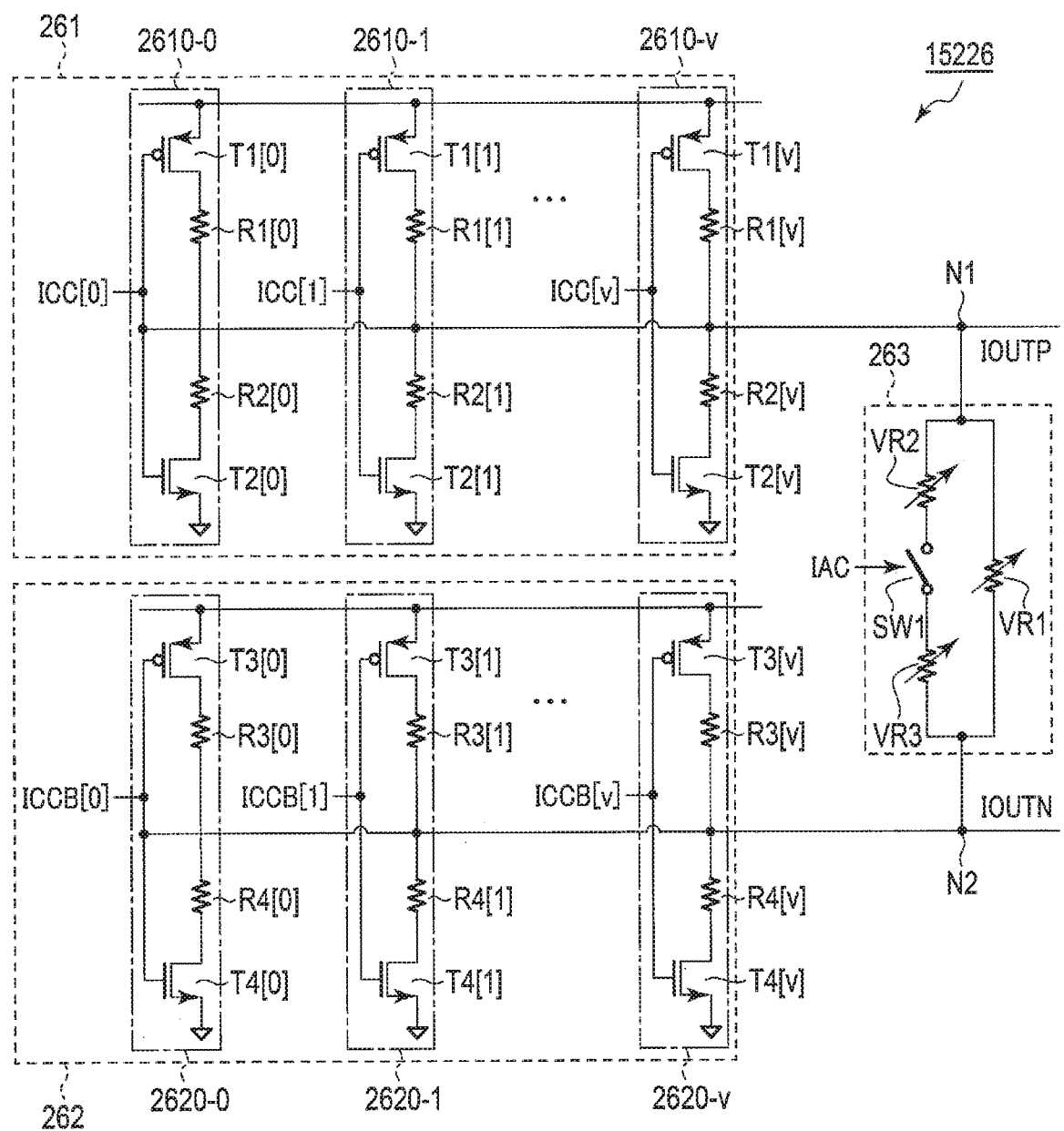
F I G. 23

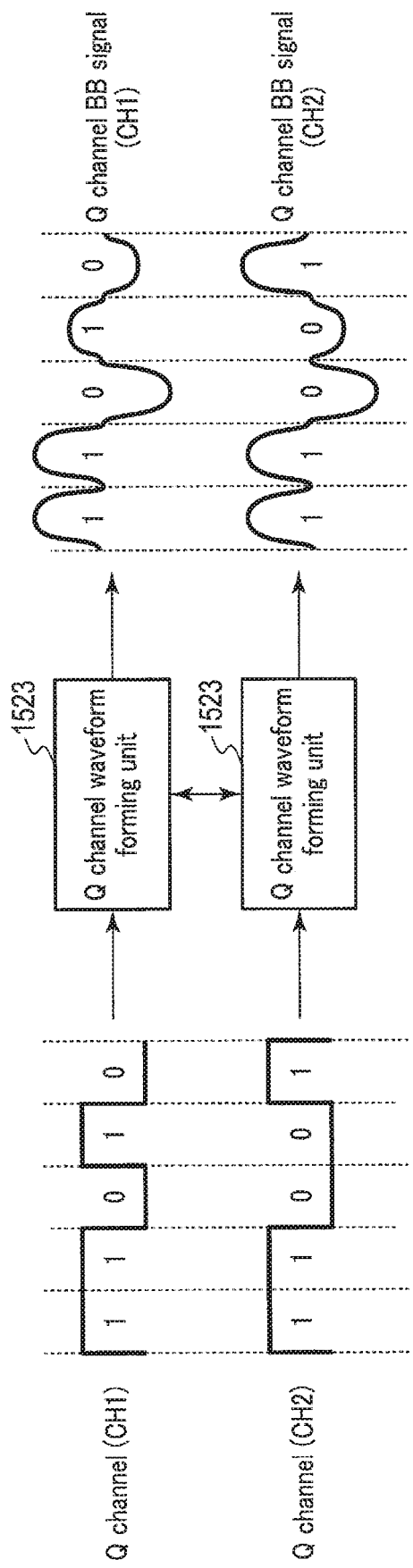
F I G. 24

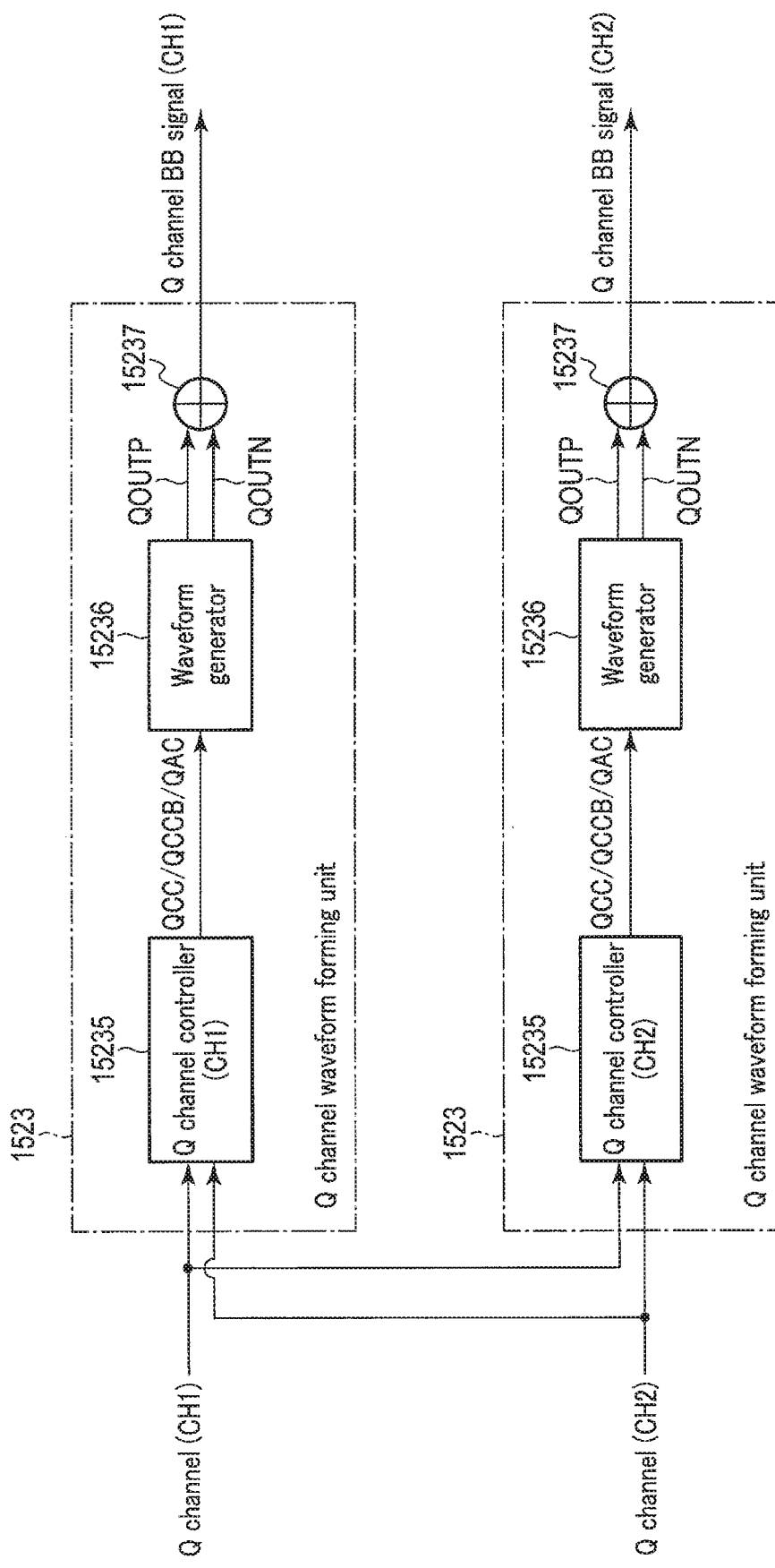
F I G. 25

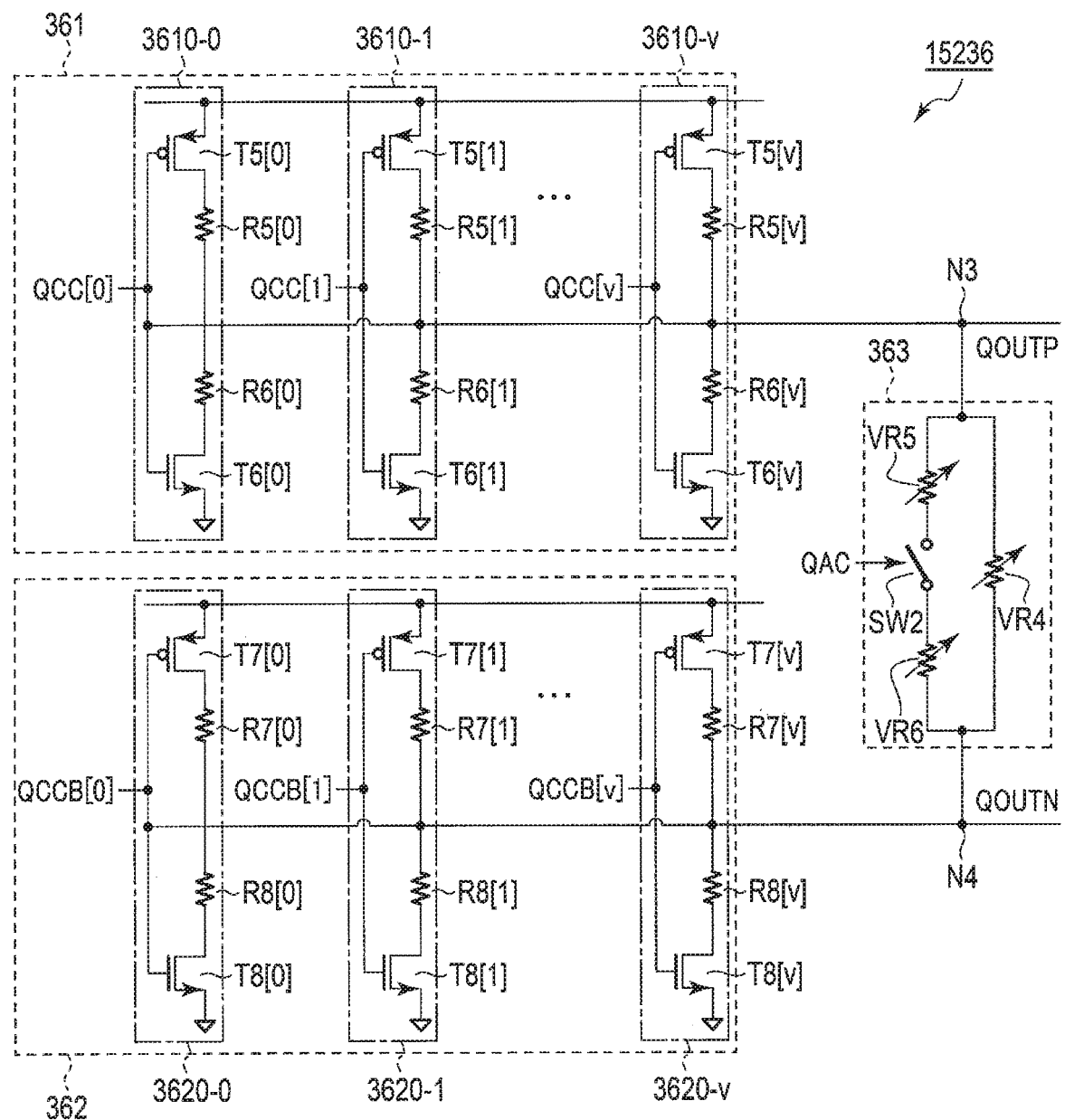
F I G. 26

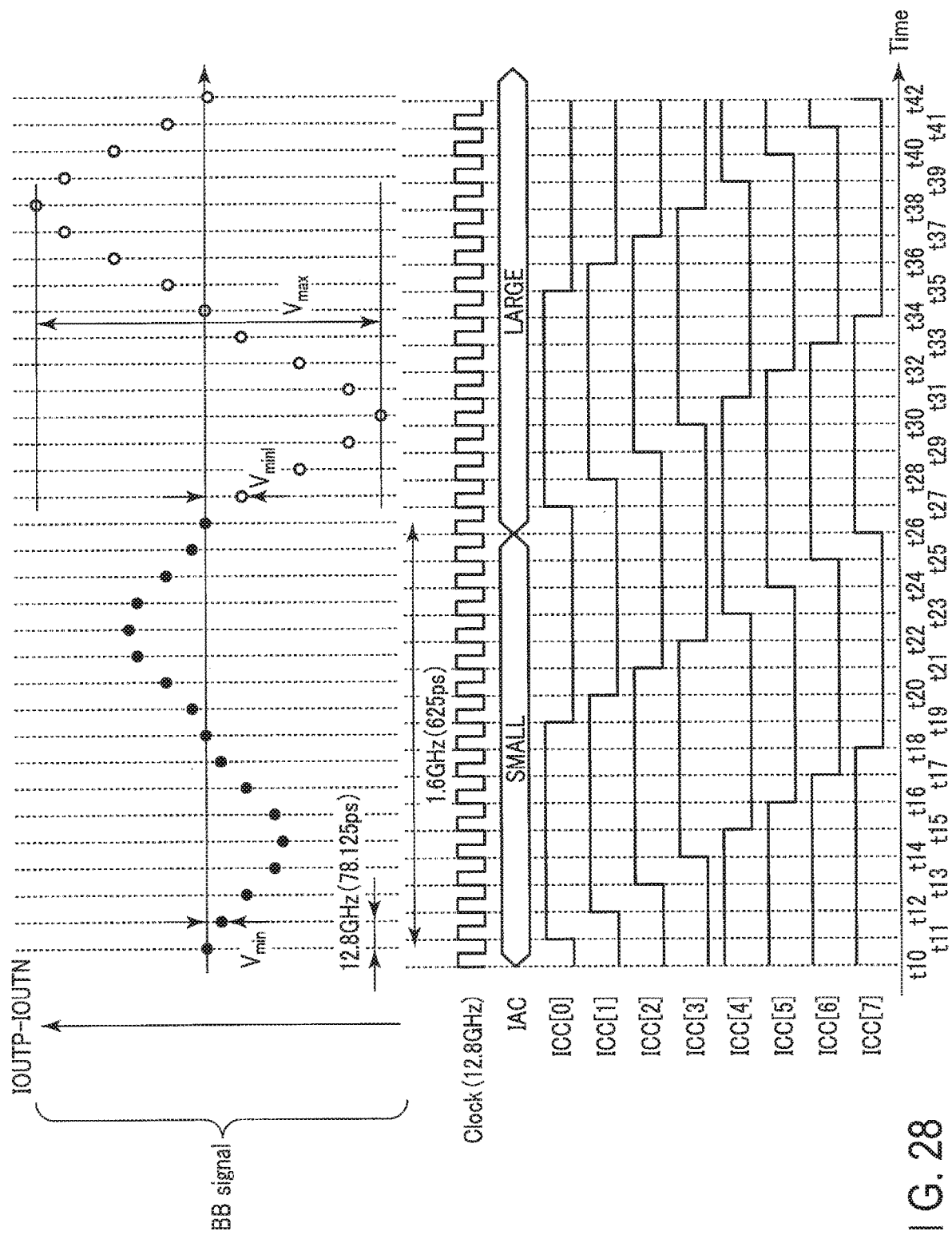
F I G. 28

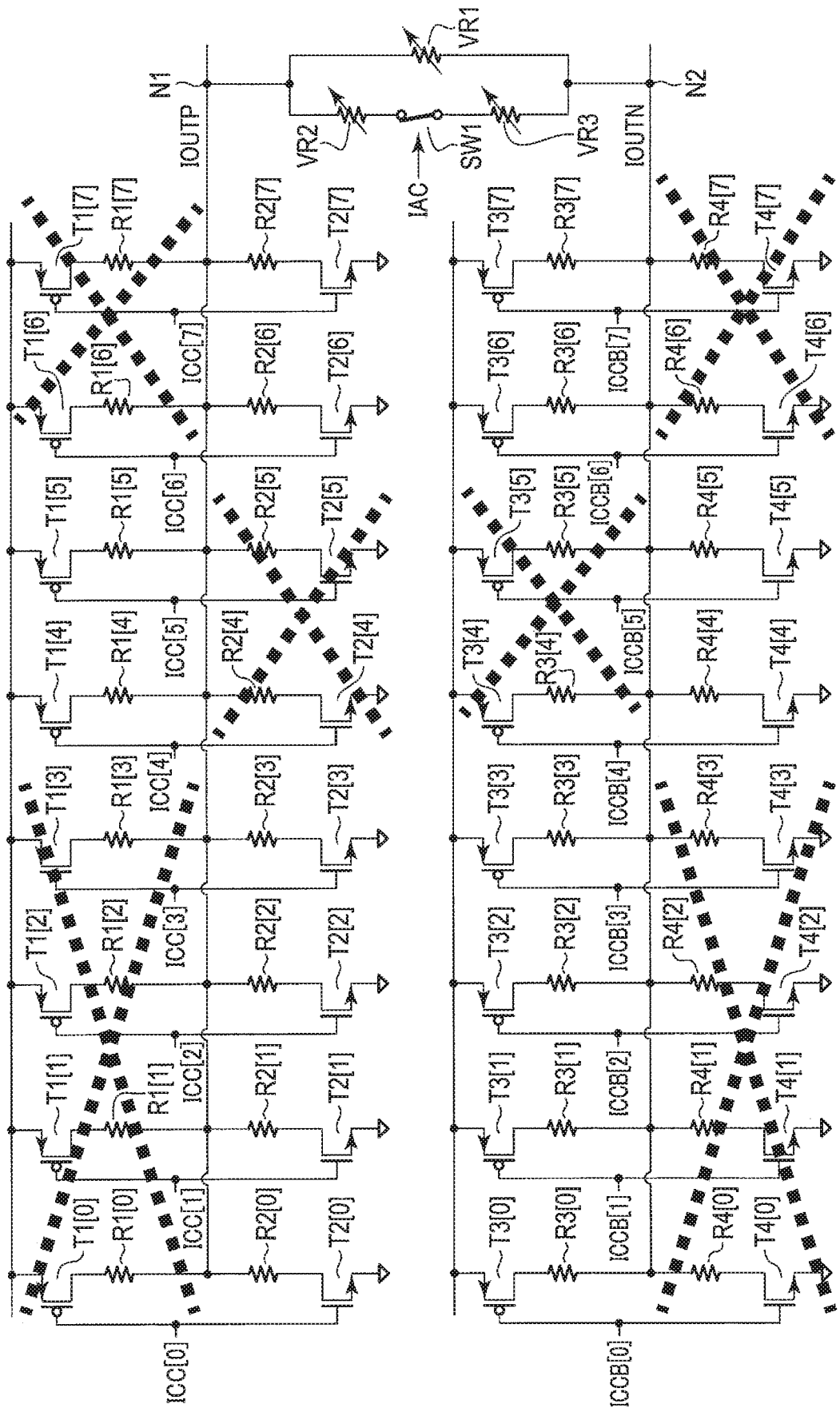
F I G. 35

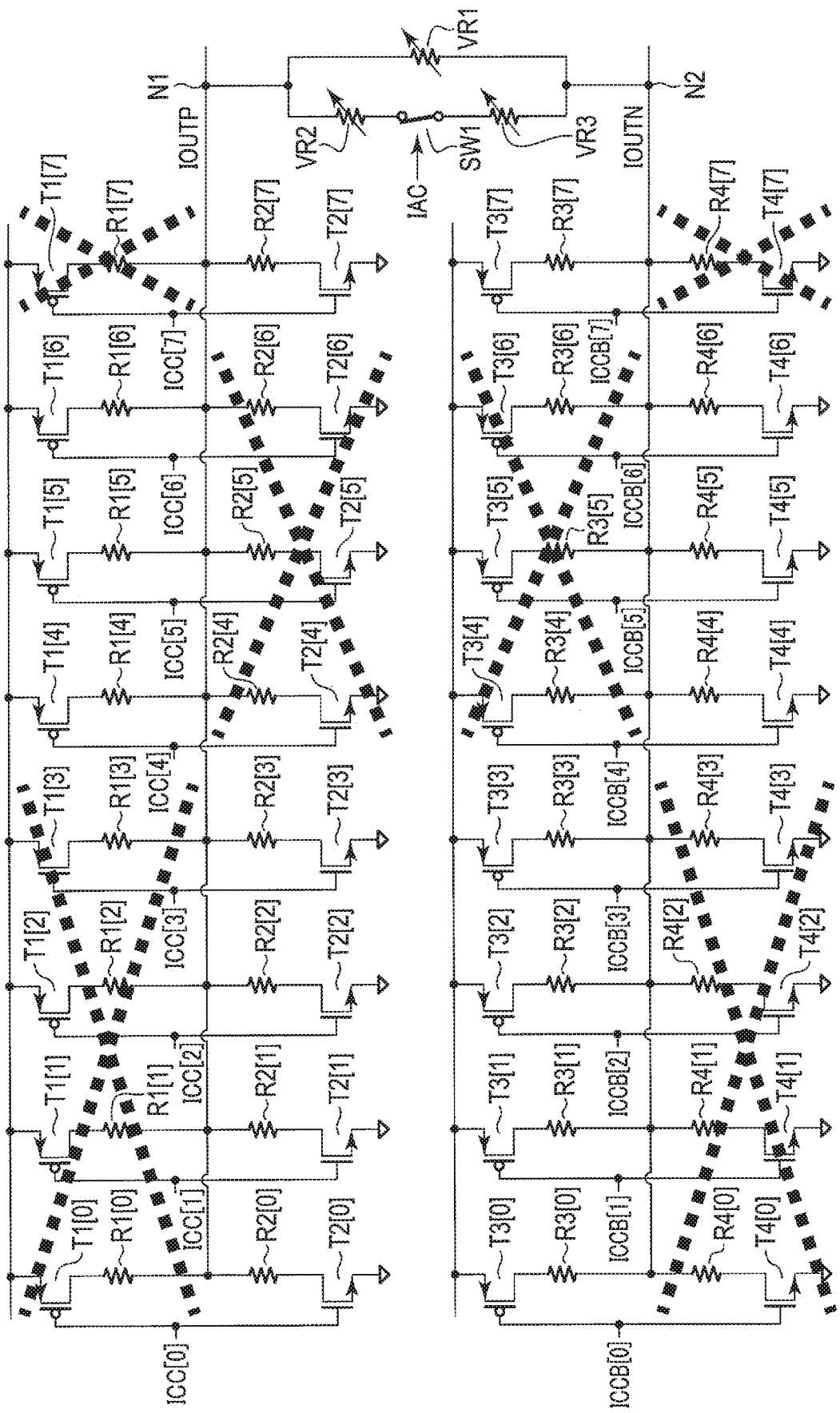
F I G. 36

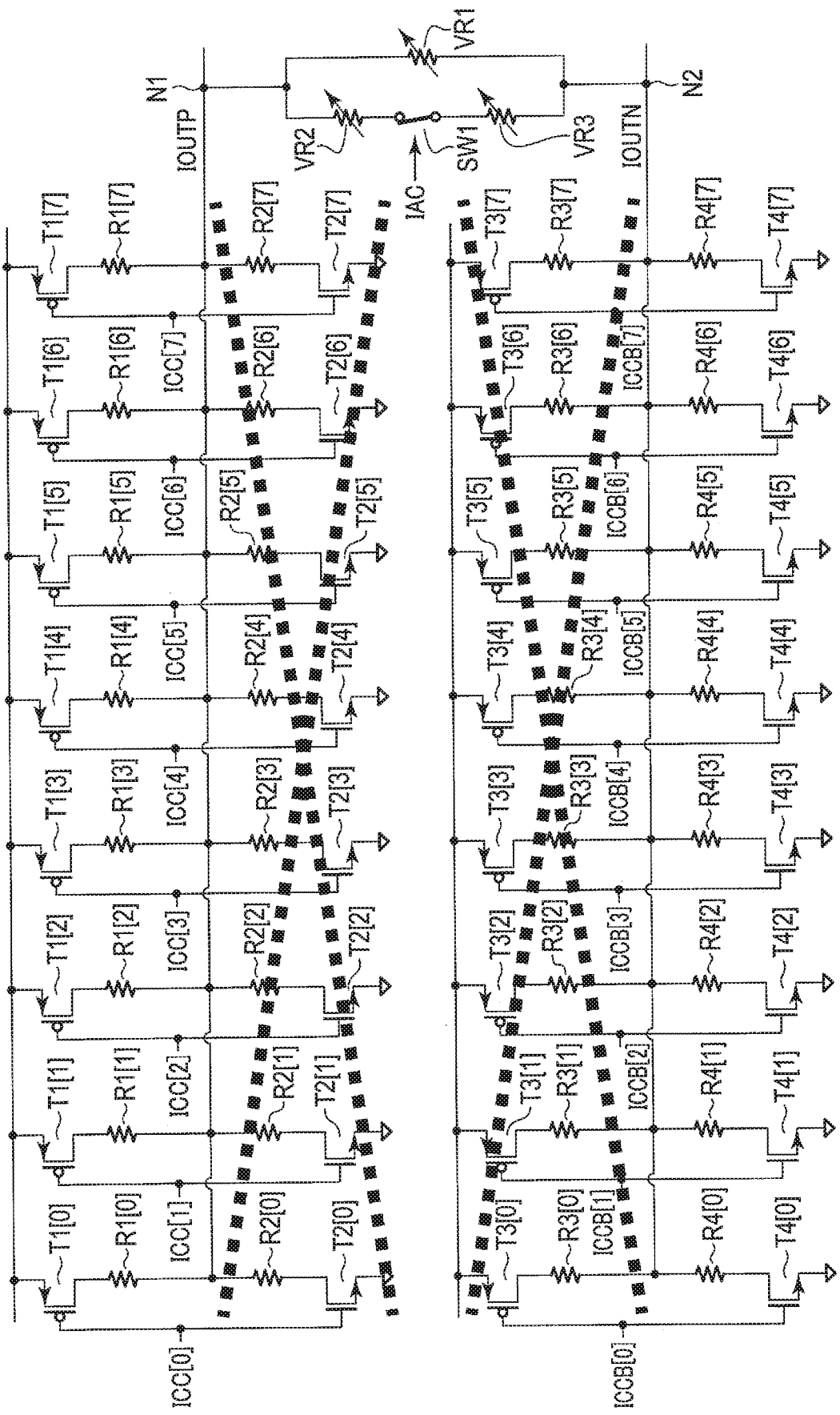
F I G. 41

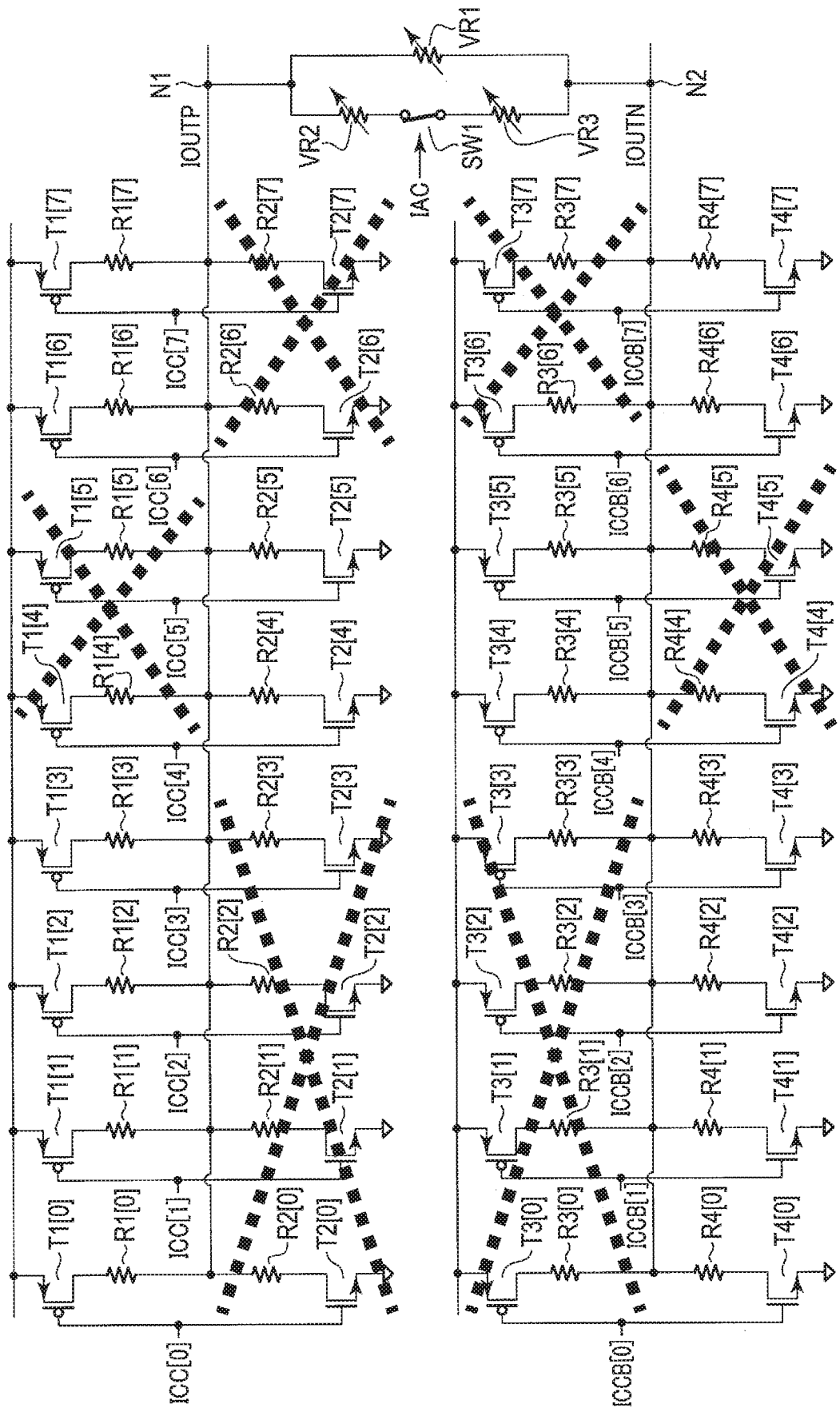
F I G. 43

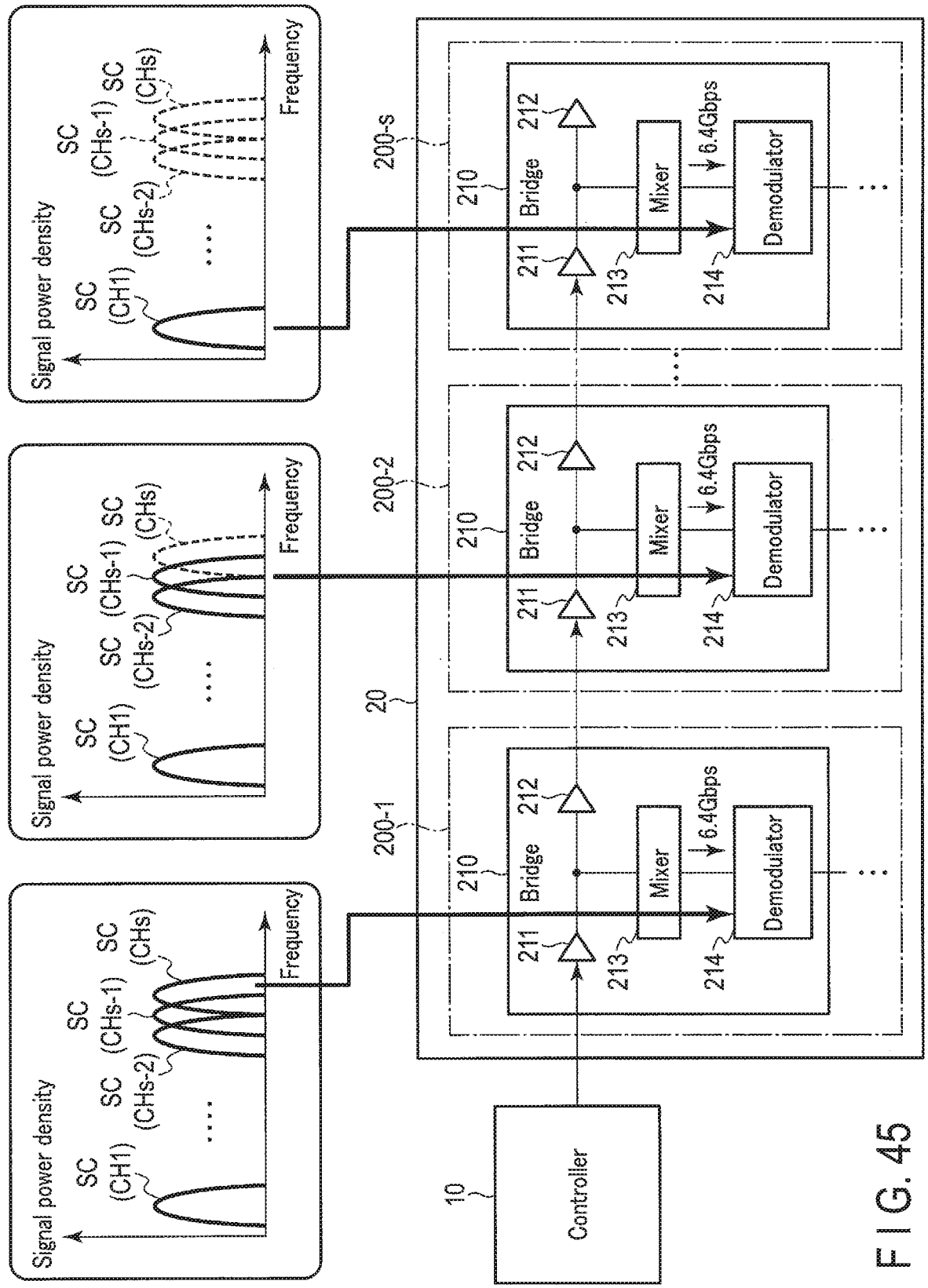
F I G. 45

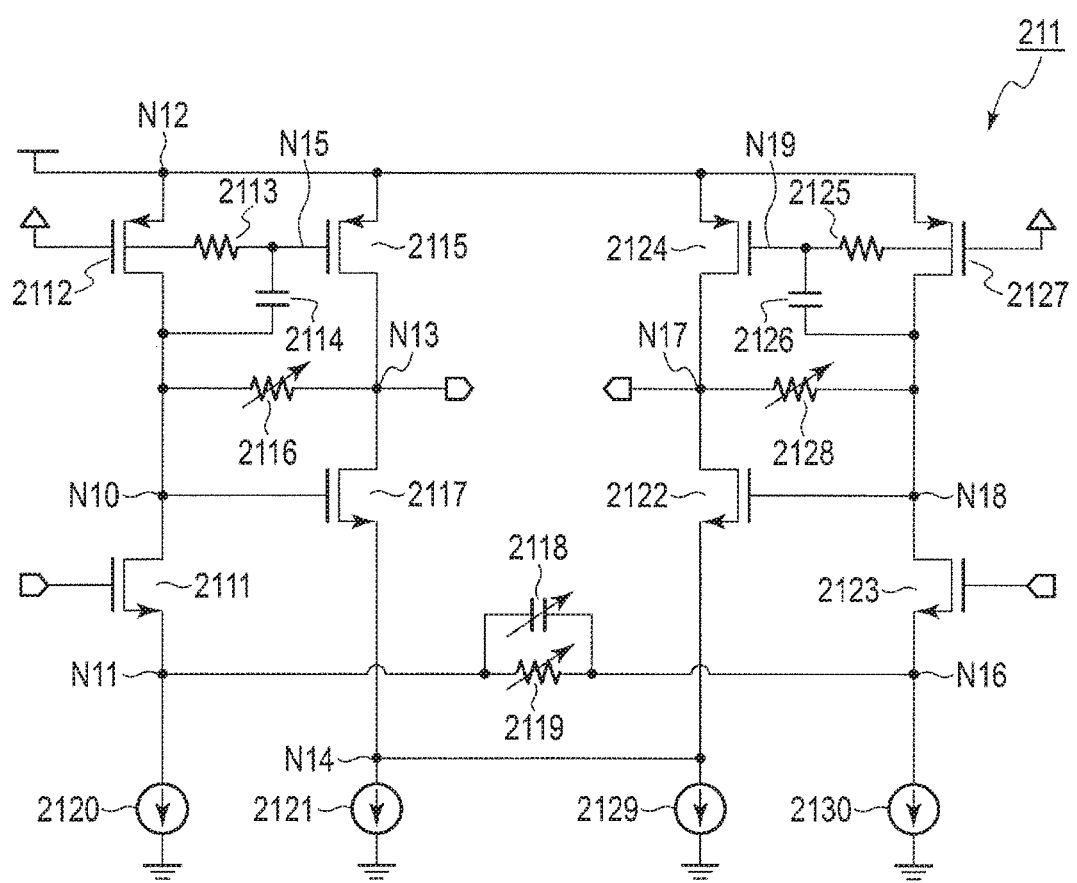
F I G. 46

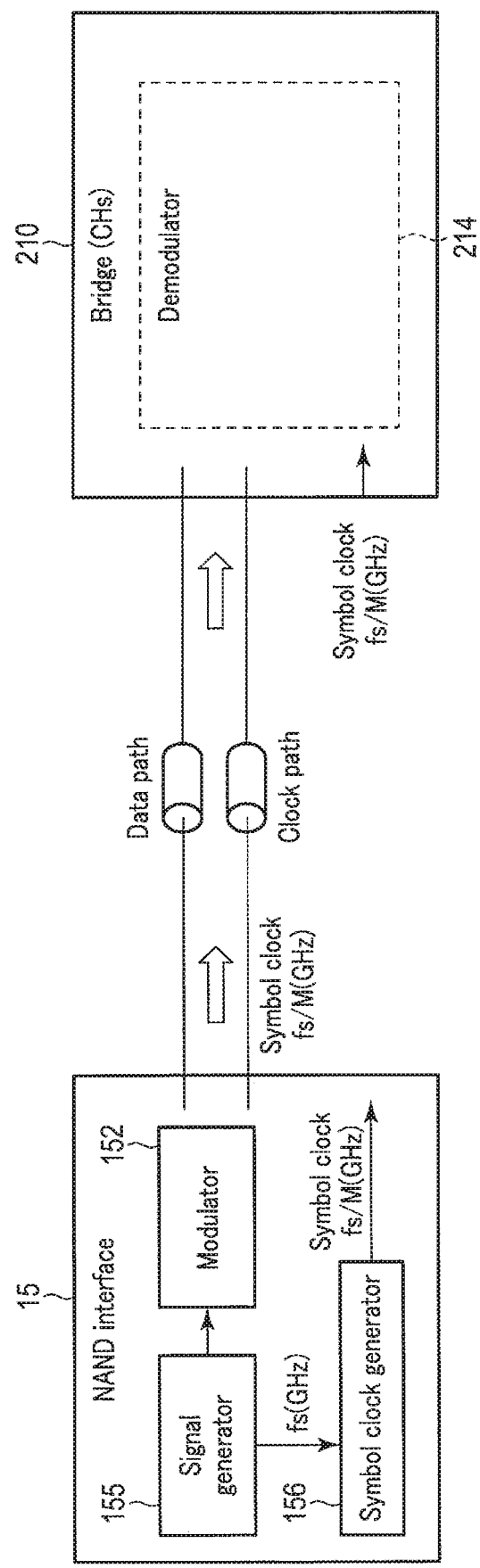
F I G. 47

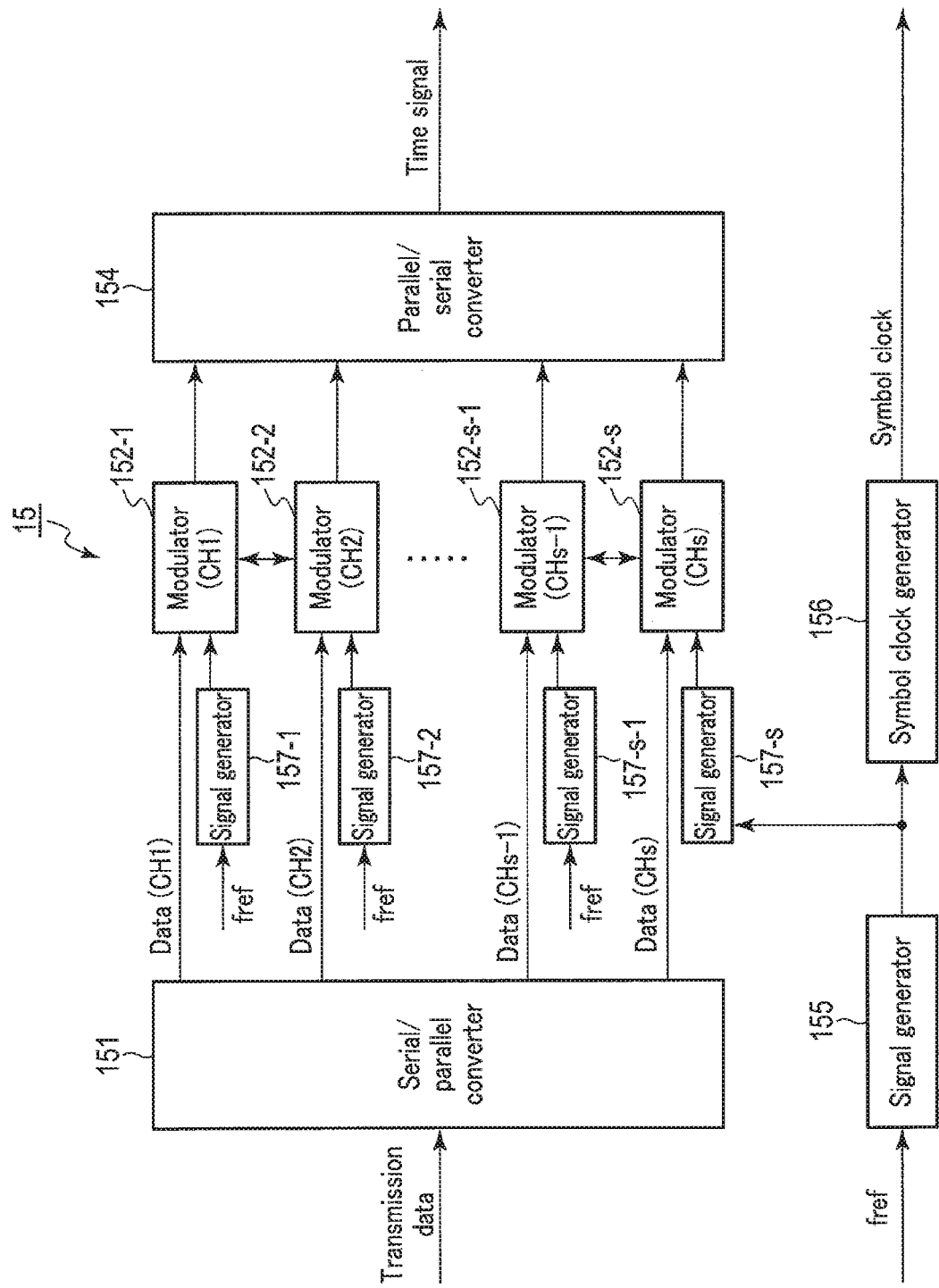
F I G. 48

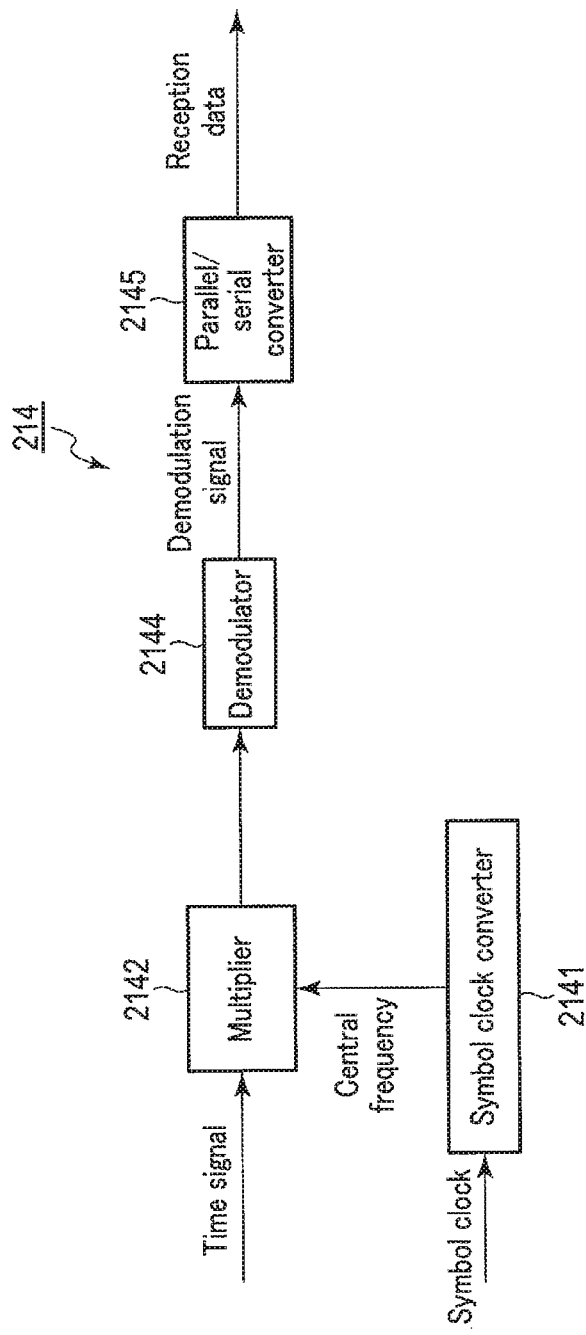
F I G. 49

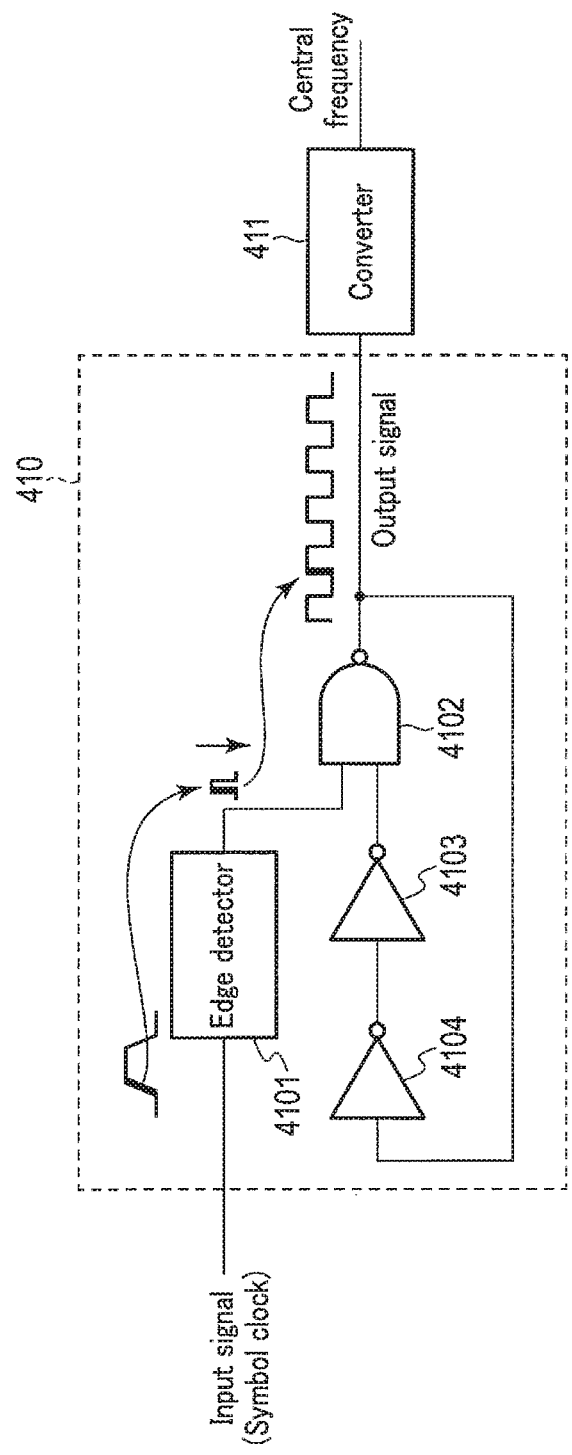
F I G. 50

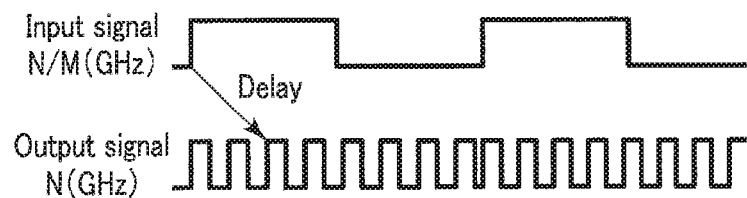
F I G. 51
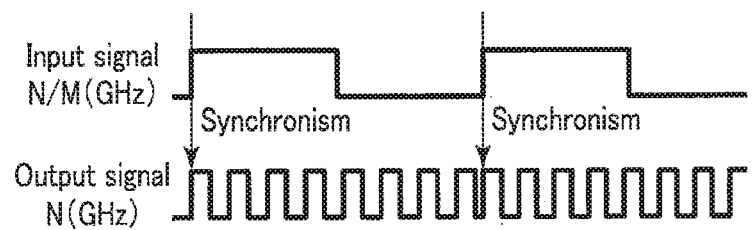
F I G. 52
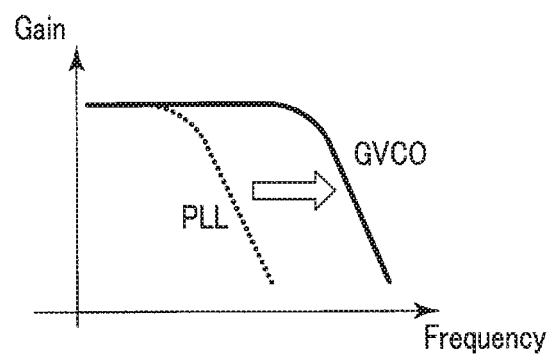
F I G. 53

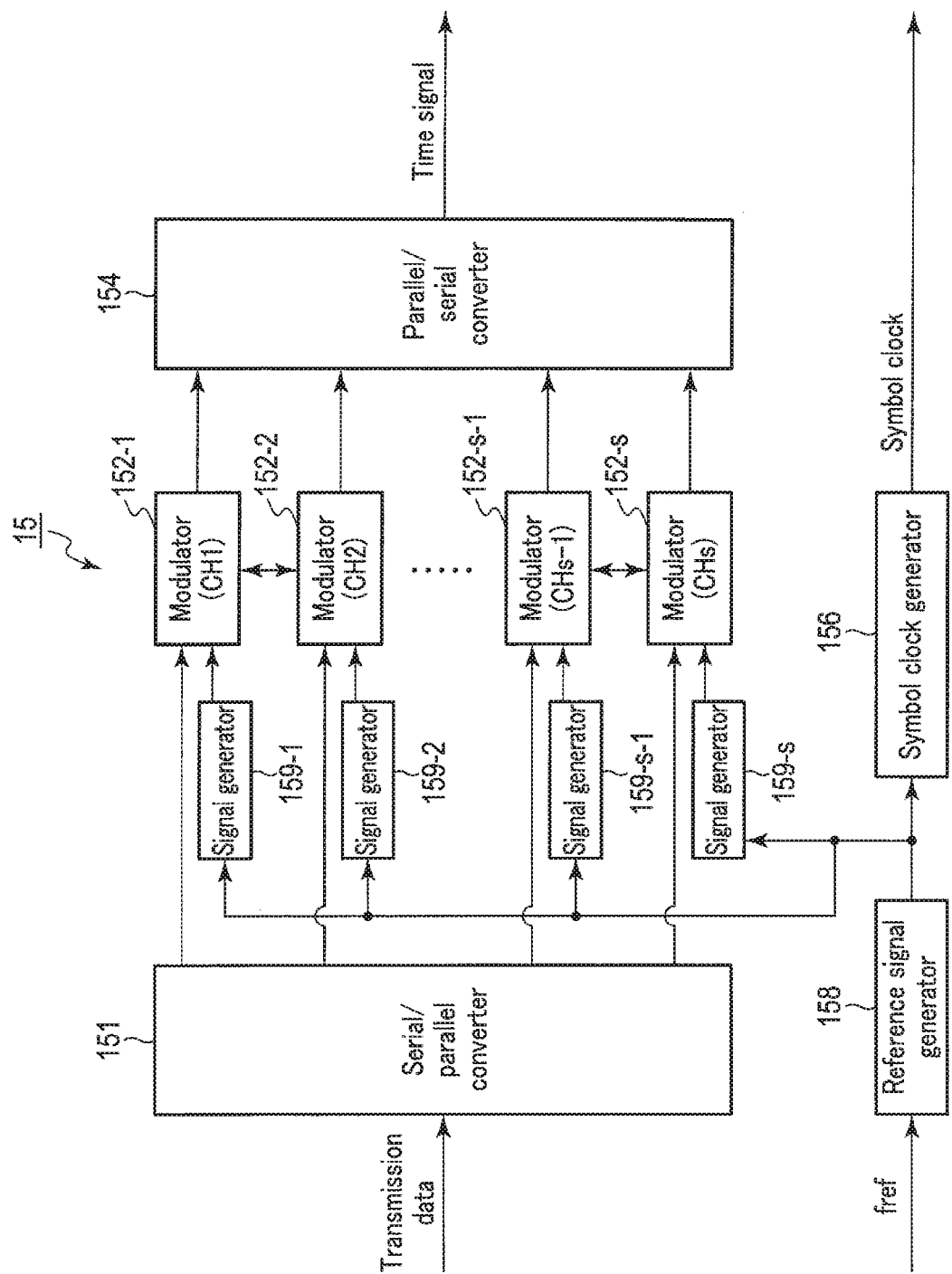
F I G. 54

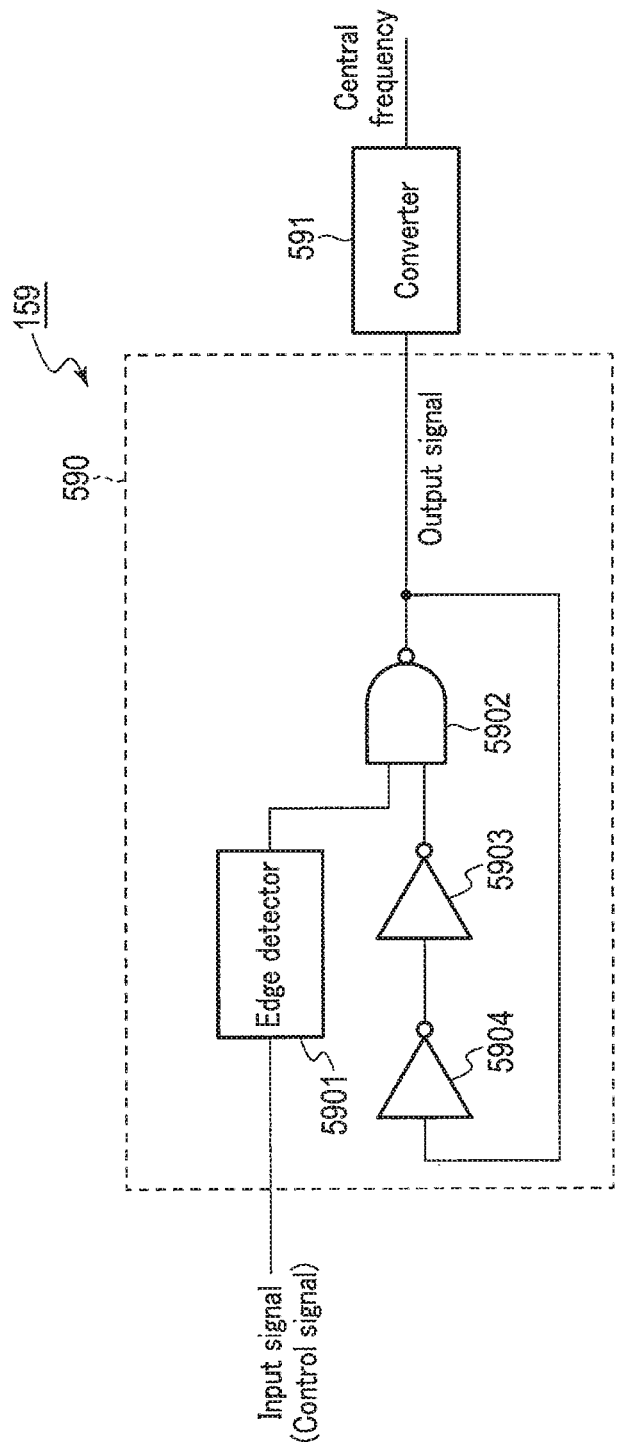
F I G. 55

TRANSMITTER AND RECEIVER

CROSS-REFERENCE TO RELATED APPLICATIONS

This application is based upon and claims the benefit of priority from prior Japanese Patent Application No. 2017-171529, filed Sep. 6, 2017; the entire contents of which are incorporated herein by reference.

FIELD

Embodiments described herein relate generally to a transmitter and a receiver.

BACKGROUND

In recent years, a storage capacity of a semiconductor storage device has been increasing.

BRIEF DESCRIPTION OF THE DRAWINGS

In FIG. 4, the ordinate axis indicates a signal power density (logarithm indication) and the abscissa axis indicates a frequency.

FIG. 5 is a graph illustrating a multiplexed frequency waveform which is applied to a signal that is communicated between the controller and NAND package. In FIG. 5, the ordinate axis indicates a signal power density (logarithm indication) and the abscissa axis indicates a frequency.

FIG. 6 is a block diagram illustrating a part of a NAND interface (transmitter).

FIG. 10 is a block diagram illustrating a modulator relating to a channel CH1 and a modulator relating to a channel CH2.

FIG. 11 is a block diagram illustrating an I channel waveform forming unit relating to the channel CH1 and an I channel waveform forming unit relating to the channel CH2.

FIG. 12 is a block diagram illustrating a Q channel waveform forming unit relating to the channel CH1 and a Q channel waveform forming unit relating to the channel CH2.

FIG. 15 is a view in which frequency waveforms of three communication methods are compared. In each of the three frequency waveforms shown in FIG. 15, the ordinate axis indicates a signal amplitude (voltage) and the abscissa axis indicates time.

FIG. 16 is a block diagram illustrating a NAND package of a memory system according to comparative example 2.

FIG. 17 is a block diagram illustrating the NAND package of the memory system according to the first embodiment.

In FIG. 18, the ordinate axis indicates a signal power density (logarithm indication) and the abscissa axis indicates a frequency.

FIG. 20 is a graph illustrating a relationship between a frequency waveform which a memory set according to the first embodiment receives and data mapped on the I/Q plane. In FIG. 20, the ordinate axis indicates a signal power density (logarithm indication) and the abscissa axis indicates a frequency.

FIG. 21 is a block diagram illustrating an I channel waveform forming unit relating to the channel CH1 and an I channel waveform forming unit relating to the channel CH2.

FIG. 22 is a block diagram illustrating an I channel waveform forming unit relating to the channel CH1 and an I channel waveform forming unit relating to the channel CH2.

FIG. 23 is a circuit diagram illustrating a waveform generator of the I channel waveform forming unit.

FIG. 24 is a block diagram illustrating a Q channel waveform forming unit relating to the channel CH1 and a Q channel waveform forming unit relating to the channel CH2.

FIG. 25 is a block diagram illustrating a Q channel waveform forming unit relating to the channel CH1 and a Q channel waveform forming unit relating to the channel CH2.

FIG. 26 is a circuit diagram illustrating a waveform generator of the Q channel waveform forming unit.

FIG. 28 is a view illustrating a relationship between control signals and an I channel baseband signal.

FIG. 35 is a circuit diagram illustrating the operation of the waveform generator of the I channel waveform forming unit.

FIG. 36 is a circuit diagram illustrating the operation of the waveform generator of the I channel waveform forming unit.

FIG. 41 is a circuit diagram illustrating the operation of the waveform generator of the I channel waveform forming unit.

FIG. 43 is a circuit diagram illustrating the operation of the waveform generator of the I channel waveform forming unit.

FIG. 45 is a view illustrating a relationship between memory sets of a NAND package according to a third embodiment, and sub-channels.

FIG. 46 is a circuit diagram illustrating an amplifier according to the third embodiment.

FIG. 47 is a view illustrating an outline of a fourth embodiment.

FIG. 48 is a block diagram illustrating a part of a NAND interface.

FIG. 49 is a block diagram illustrating a part of a demodulator included in a bridge.

FIG. 50 is a block diagram illustrating a symbol clock converter.

FIG. 51 is a view illustrating a relationship between an input signal and an output signal in an injection-locked oscillator of a memory system according to a comparative example.

FIG. 52 is a view illustrating a relationship between an input signal and an output signal in an injection-locked oscillator of a memory system according to the fourth embodiment.

FIG. 53 is a view for comparing transmission characteristics of a GVCO (Gated Voltage Control Oscillator) relative to an input signal and transmission characteristics of a PLL (Phase Locked Loop) relative to an input signal.

FIG. 54 is a block diagram illustrating a part of a NAND interface.

FIG. 55 is a block diagram illustrating a part of a signal generator.

DETAILED DESCRIPTION

In general, according to one embodiment, a transmitter includes a first circuit configured to execute a first band limitation by waveform shaping in a time region with respect to first data relating to a first channel to generate a first signal; a second circuit configured to execute a second band limitation by the waveform shaping in the time region with respect to second data relating to a second channel to generate a second signal, the second channel differing from the first channel; a third circuit configured to generate a third signal based on the generated first signal and a first frequency relating to the first channel; a fourth circuit configured to generate a fourth signal based on the generated second signal and a second frequency relating to the second channel; and a fifth circuit configured to generate a fifth signal by multiplexing the generated third signal and the generated fourth signal.

Hereinafter, embodiments, which have been constructed, will be described with reference to the accompanying drawings. In the description below, structural elements having substantially the same functions and structures are denoted by like signs. A numeral in parentheses after a numeral, which constitutes a reference sign, is used in order to distinguish elements which are referred to by reference signs including the same numeral and have the same structure. When it is not necessary to distinguish elements which are indicated by reference signs including the same numeral, these elements are referred to by a reference sign including only the numeral. For example, when it is not necessary to distinguish elements with reference signs 1-1, 1-2, etc., these elements are comprehensively referred to by a reference sign 1.

In addition, each of functional blocks can be realized as hardware, computer software, or a combination of both. Thus, each block will be described below, in general, from the standpoint of the function thereof, so as to make it clear that each block is any one of hardware, computer software, or a combination of both. Whether such a function is implemented as hardware or implemented as software depends on design restrictions which are imposed on a specific embodiment or the entire system. A person skilled in the art may realize these functions by various methods in each of specific embodiments, and to determine such realization is within the scope of the present invention.

<1> First Embodiment

A memory system according to a first embodiment will be described.

<1-1> Configuration of the Memory System

Figure 1:
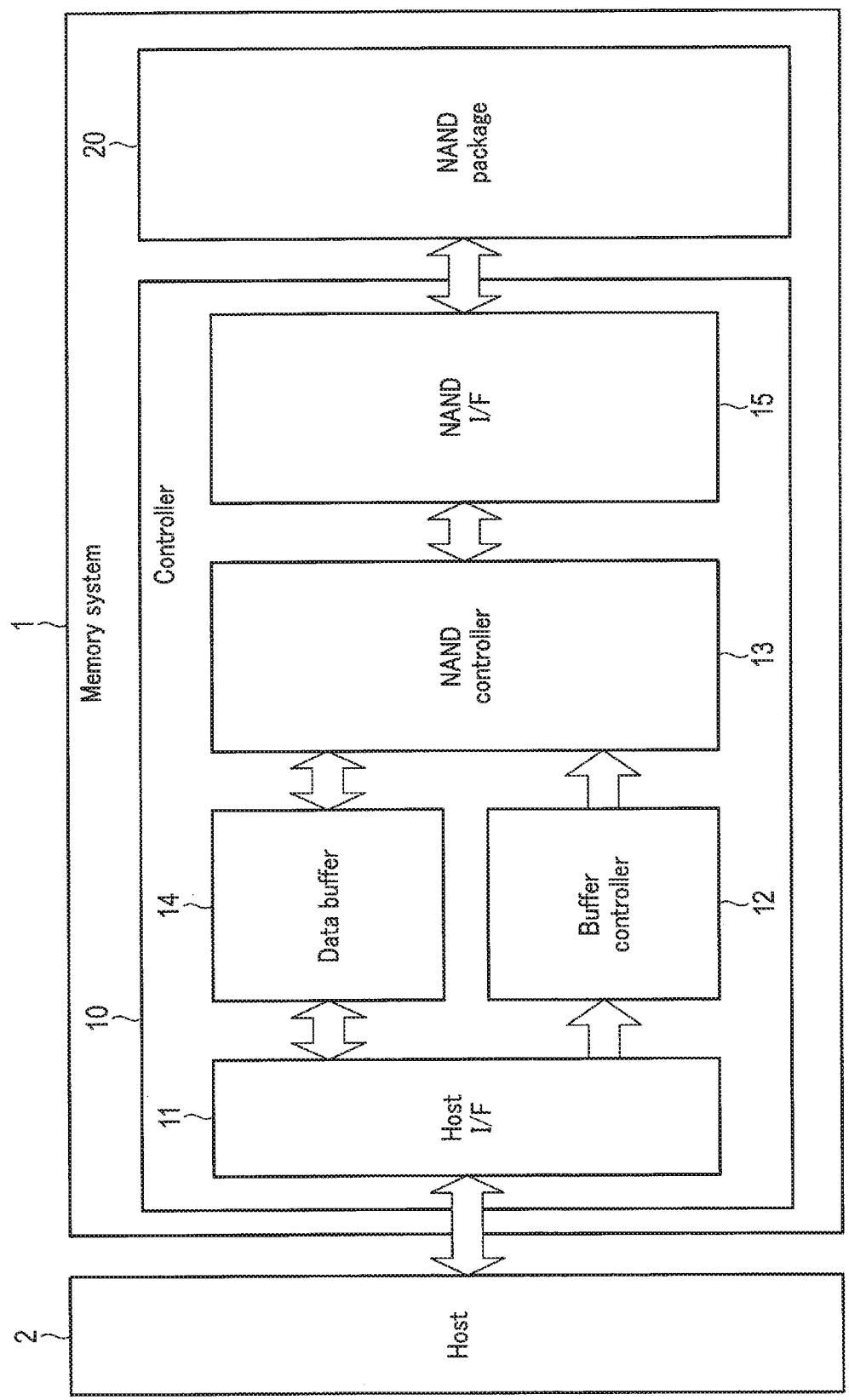
FIG. 1 is a block diagram of a memory system according to a first embodiment.

To begin with, referring to FIG. 1, a configuration of a memory system according to the first embodiment will be described. FIG. 1 is a block diagram of the memory system according to the first embodiment.

A memory system 1 is connected to a host device (hereinafter, simply referred to as a host) 2 via a host interface (I/F) 11, and functions as an external storage device of the host 2. The host 2 is, for example, a personal computer, a mobile phone, or an imaging device. In addition, the memory system 1 is, for example, a memory card such as an SD™ card, or an SSD (solid state drive).

As illustrated in FIG. 1, the memory system 1 includes a controller 10 and a NAND package 20.

<1-1-1> Configuration of the Controller

The controller 10 includes the host interface 11, a buffer controller 12, a NAND controller 13, a data buffer 14, and a NAND interface (I/F) 15.

The host interface 11 is a communication interface such as SATA (Serial Advanced Technology Attachment) or SAS (Serial Attached SCSI), and connects the memory system 1 to the host 2. The host interface 11 receives commands, such as a read command and a write command, from the host 2.

The buffer controller 12 controls the NAND controller 13, based on an instruction received via the host interface 11.

The NAND controller 13 controls the NAND package 20. A function of the NAND controller 13 can be realized by, for example, a processor or hardware which executes firmware stored in a ROM (Read Only Memory) that the NAND package 20 or NAND controller 13 includes. In accordance with a command from the host 2, the NAND controller 13 reads data from the NAND package 20 or writes data into the NAND package 20.

The data buffer 14 temporarily stores data which is transferred between the data buffer 14 and the host 2, and data which is transferred between the data buffer 14 and the NAND package 20. In addition, the data buffer 14 stores information for managing the NAND package 20. The details of this management information will be described later. The data buffer 14 is, for example, a general-purpose memory such as an SRAM (Static Random Access Memory) or a DRAM (Dynamic Random Access Memory).

The NAND interface 15 (transmitter) is a communication interface and connects the controller 10 and NAND package 20. The NAND interface 15 and NAND package 20 are connected by a bus (data path and clock path) according to the NAND interface. Signals, which are transmitted/received on the bus, are, for example, a chip enable signal /CE, an address latch enable signal ALE, a command latch enable signal CLE, a write enable signal /WE, a read enable signal /RE, and input/output signals I/O. The signal /CE is a signal for enabling a NAND chip included in the NAND package 20. The signal ALE is a signal which notifies the NAND chip that the input signal is an address. The signal CLE is a signal which notifies the NAND chip that the input signal is a command. The signal /WE is a signal for enabling the input signal to be taken in the NAND chip. The signal /RE is a signal for enabling the output signal to be taken in the controller 10. The input/output signals I/O are substantial signals such as commands, addresses, data, etc.

<1-1-1-1> Communication Method

In the present embodiment, a communication method of transmitting signals to a plurality of channels via a single bus is adopted as a communication method between the controller and NAND package.

Figure 2:
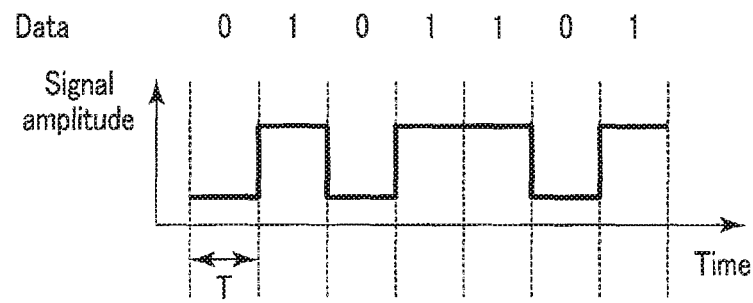
FIG. 2 is a graph illustrating a relationship between a waveform with time of a transmission signal (transmission data) and data. In the waveform with time shown in FIG. 2, the ordinate axis indicates a signal amplitude (voltage) and the abscissa axis indicates time.
Figure 3:
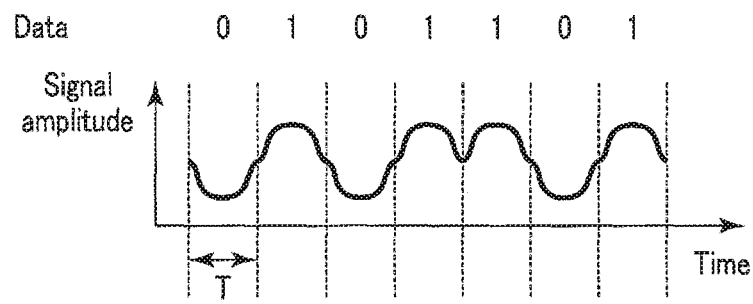
FIG. 3 is a graph illustrating a relationship between a waveform with time of a transmission signal (transmission data) and data. In the waveform with time shown in FIG. 3, the ordinate axis indicates a signal amplitude (voltage) and the abscissa axis indicates time.
Figure 4:
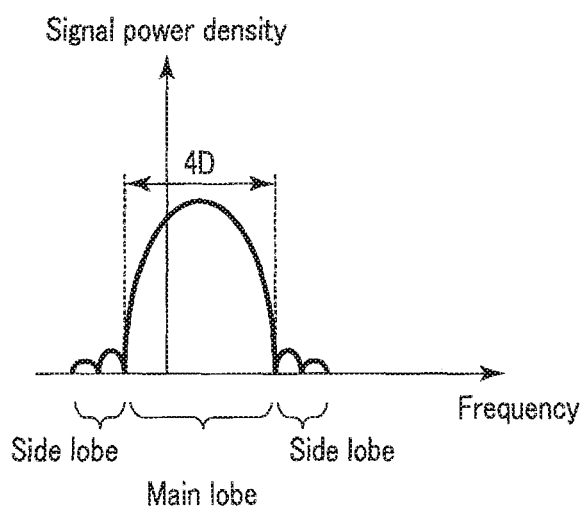
FIG. 4 is a graph illustrating a frequency waveform (power spectrum) which is applied to a signal that is communicated between a controller and a NAND package.

Referring to FIG. 2 to FIG. 5, a description is given of a basic concept of the communication method adopted between the controller and NAND package. FIG. 2 is a graph illustrating a relationship between a waveform with time of a transmission signal (data) and data. In the waveform with time shown in FIG. 2, the ordinate axis indicates a signal amplitude (voltage) and the abscissa axis indicates time. FIG. 3 is a graph illustrating a relationship between a waveform with time of a transmission signal (data) and data. In the waveform with time shown in FIG. 3, the ordinate axis indicates a signal amplitude (voltage) and the abscissa axis indicates time. FIG. 4 is a graph illustrating a frequency waveform (power spectrum) which is applied to a signal that is communicated between the controller and NAND package. In FIG. 4, the ordinate axis indicates a signal power density (logarithm indication) and the abscissa axis indicates a frequency. FIG. 5 is a graph illustrating a multiplexed frequency waveform which is applied to a signal that is communicated between the controller and NAND package. In FIG. 5, the ordinate axis indicates a signal power density (logarithm indication) and the abscissa axis indicates a frequency.

To begin with, referring to FIG. 2, the transmission signal is described in brief. FIG. 2 shows, as the transmission signal, a digital signal sequence composed of 1's and 0's at random. As illustrated in FIG. 2, the transmission signal is a "rectangular wave" in which the frequency band is not limited.

In the present embodiment, the frequency band is limited on this transmission signal of "rectangular wave". Thereby, as illustrated in FIG. 3, a baseband (BB) signal having a "smooth wave (e.g. '-cos wave')", in which the frequency band is limited, is generated from the "rectangular wave". In the communication method according this embodiment, reverse interference correction (preliminary correction) is executed on the baseband signal between channels neighboring on a frequency region (hereinafter, simply referred to as "neighboring"), and a mixture signal between the neighboring channels is subtracted. The details of the reverse interference correction will be described later.

By Fourier-transforming the corrected baseband signal, a frequency waveform in which the frequency width of a main lobe is 4 D, as shown in FIG. 4, is generated. Compared to a frequency waveform which is converted from the baseband signal in which the frequency band is not limited, the frequency waveform converted from the baseband signal, in which the frequency band is limited, has side lobe components (high-frequency components) suppressed.

In the communication method according to the present embodiment, as illustrated in FIG. 5, a range (transmission band) of frequencies of electric waves is divided into sub-channels (frequency bands) SC. Channels (in FIG. 5, channels CH1 to CHs; s is an integer of 2 or more) are allocated to the respective divided sub-channels. In this embodiment, the frequency waveform shown in FIG. 4 is defined as the sub-channel SC, and the sub-channels SC are multiplexed at intervals of a frequency width D.

Then, each sub-channel SC is allocated to the frequency corresponding to the center of each divided sub-channel SC (also referred to as "central frequency" or "symbol rate frequency"; in FIG. 5, frequencies f1 to fs).

As illustrated in FIG. 5, in the communication method adopted in this embodiment, the frequency width of one sub-channel SC is 4 D. For example, the central frequencies f1 to fs are set for each frequency width D. For example, the interval of sub-channels SC is a natural number multiple of the central frequency of the sub-channel SC.

As described above, when the communication method adopted in this embodiment is realized, the transmitter executes the band limitation by the waveform shaping (hereinafter, simply referred to as "band limitation") in the time region with respect to the digital signal (rectangular wave), and generates the baseband signal. In addition, the transmitter performs the reverse interference correction on the baseband signal between the neighboring channels, and generates frequency waveforms, based on the corrected baseband signal. In this manner, the communication method adopted in the present embodiment is realized. In the communication method adopted in this embodiment, since the reverse interference correction is executed on the baseband signal between the neighboring channels, the receiver side can receive a signal without a mixture signal between the neighboring channels.

Besides, the communication method adopted in this embodiment is similar to OFDM (Orthogonal Frequency Division Multiplexing), but differs from OFDM.

<1-1-1-2> Concrete Example of the NAND Interface

Figure 7:
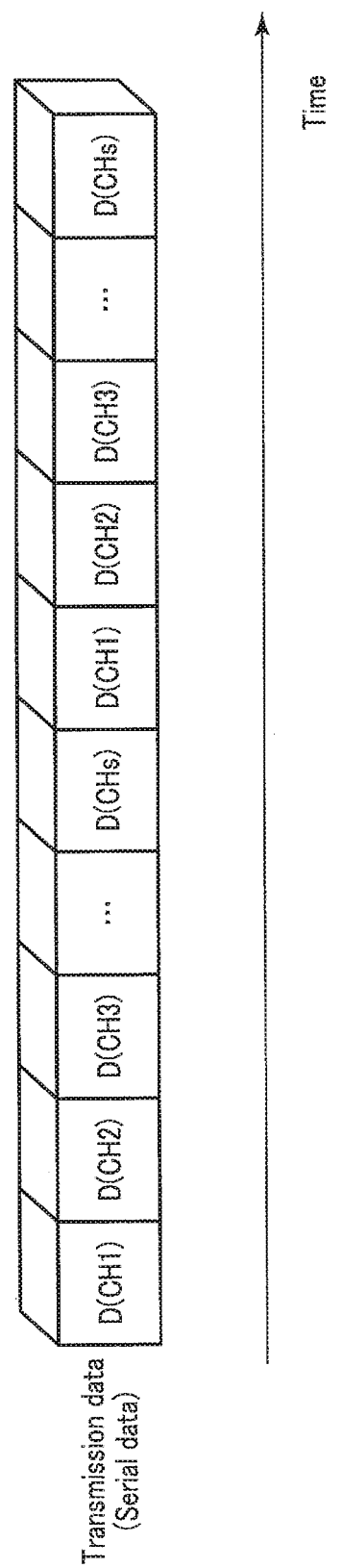
FIG. 7 is a view illustrating an outline of transmission data (serial data).
Figure 8:
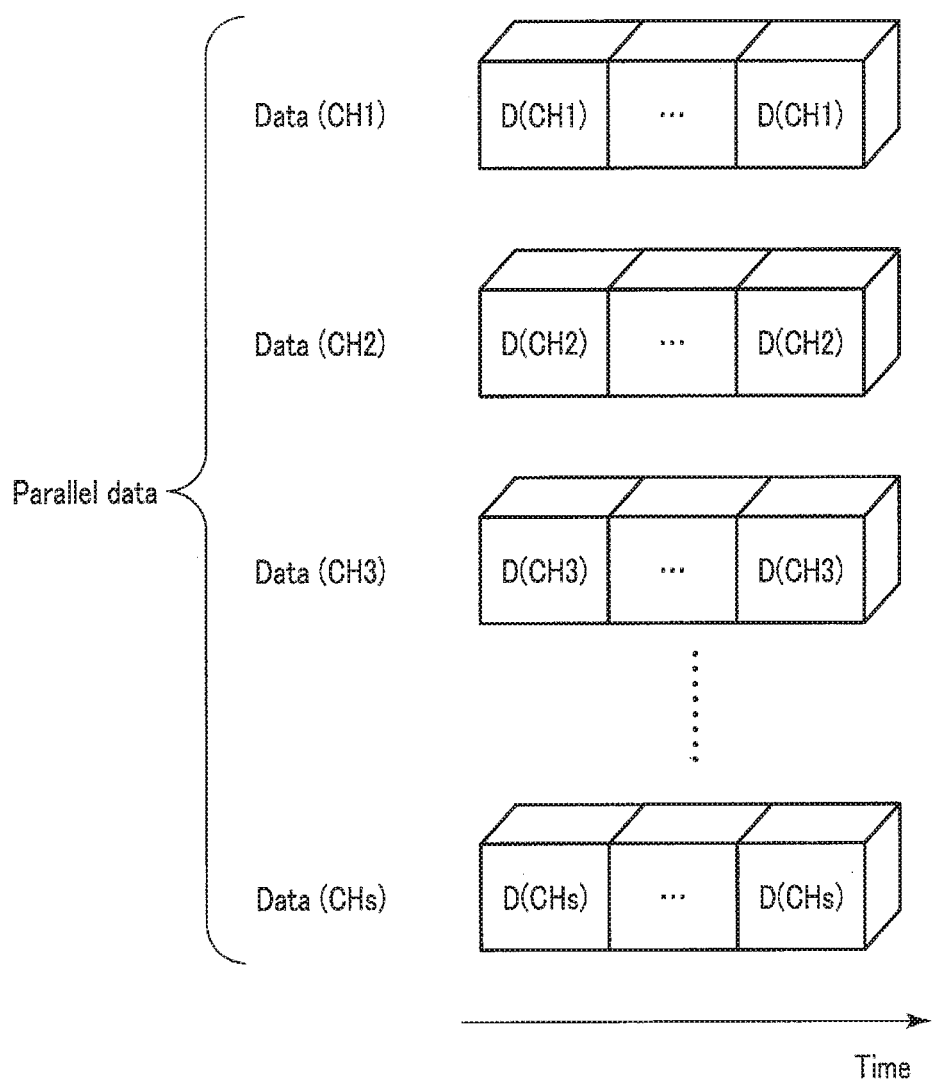
FIG. 8 is a view illustrating an outline of transmission data (parallel data).

Next, referring to FIG. 6, FIG. 7 and FIG. 8, a concrete configuration of the NAND interface 15, which adopts the above-described communication method, will be described. FIG. 6 is a block diagram illustrating a part of the NAND interface 15. FIG. 7 is a view illustrating an outline of transmission data (serial data). FIG. 8 is a view illustrating an outline of transmission data (parallel data).

As illustrated in FIG. 6, the NAND interface 15 includes a serial/parallel converter 151, modulators 152 (in FIG. 6, 152-1 to 152-s), and a parallel/serial converter 154.

The serial/parallel converter 151 receives transmission data from the NAND controller 13. As illustrated in FIG. 7, the transmission data is serial data in which data (in FIG. 7, data D(CH1) to D(CHs)) allocated to channels (in FIG. 7, channels CH1 to CHs) are arranged in series. The plural data are supplied serially and in an arbitrary order. The serial/parallel converter 151 converts the serial data to parallel data arranged in association with respective channels, as illustrated in FIG. 8. In addition, as illustrated in FIG. 6, the serial/parallel converter 151 supplies the parallel data to the modulators 152 provided in association with the respective channels.

The modulators 152 are provided in association with the respective channels, and receive the data corresponding to the channels. The modulator 152 modulates the received data. As examples of modulation, modulation methods such as QPSK (Quadrature Phase Shift Keying) and 16QAM (Quadrature Amplitude Modulation) are applicable. In this embodiment, QPSK is described by way of example. In addition, the modulator 152 receives an inter-channel interference correction signal from the modulator 152 relating to the neighboring channel. Based on the inter-channel interference correction signal, the modulator 152 generates a modulation signal from which an interference between the neighboring channels is subtracted. The elimination of the inter-channel interference is effective between mutually neighboring two channels (pair). In the example illustrated in FIG. 6, "channels CH1 and CH2", "channels CH3 and CH4, . . . , "channels CHs-1 and CHs" constitute pairs, respectively. The modulation signal is a sub-channel SC of each channel (see FIG. 4). Incidentally, the details of the configuration of the modulator 152 will be described later. Besides, a channel neighboring a channel CHt (t is an integer of one or more) is CHt+1.

The parallel/serial converter 154 receives the sub-channels SC from the respective modulators 152. Then, the parallel/serial converter 154 converts the sub-channels, which were received in parallel, to a serial signal, and outputs the serial signal to the NAND package 20 as a time signal.

<1-1-1-2-1> QPSK

Figure 9:
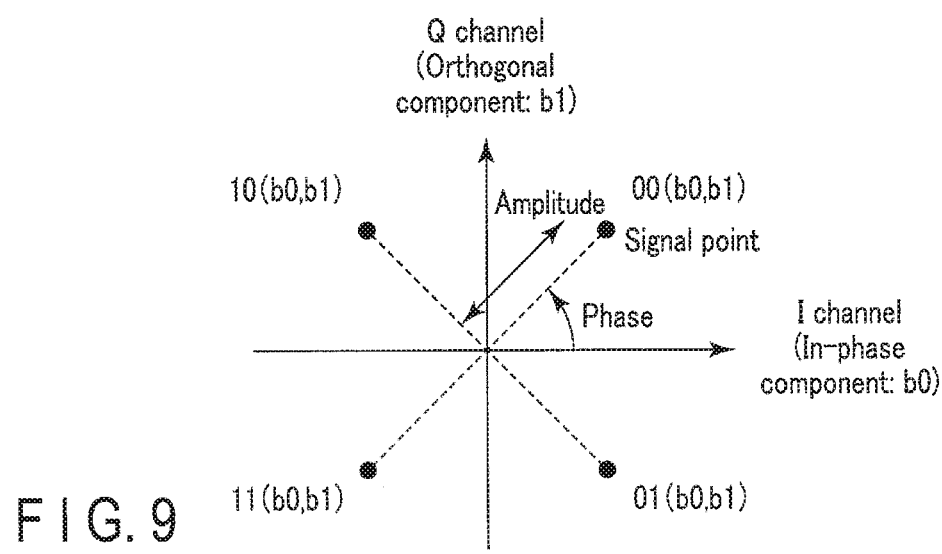
FIG. 9 is a view illustrating a relationship between an I/Q plane and data.

Before describing the details of the modulator 152, the outline of the QPSK will be schematically described with reference to FIG. 9. FIG. 9 is a view illustrating a relationship between an I/Q plane and data.

QPSK is a phase modulation method which sends information by varying the phase of a carrier. The QPSK is a modulation method which can transmit four values (four symbols) of "00", "01", "10" and "11". The four values are expressed as "b0, b1". "b0" is allocated to "1 channel", and "b1" is allocated to "Q channel".

In the QPSK, a BPSK (Binary Phase Shift Keying) modulation signal relating to an I channel and a BPSK modulation signal relating to a Q channel are generated. The BPSK modulation signal is generated such that a binary value (0 and 1) of the digital signal is "0" in the case of a waveform of the same phase (in phase) as the carrier, and is "1" in the case of a waveform having a difference of 180 degrees from the carrier. The BPSK modulation signal relating to the I channel is allocated to an x axis, and the BPSK modulation signal relating to the Q channel is allocated to a y axis.

The BPSK modulation signal relating to the I channel and the BPSK modulation signal relating to the Q channel, which are orthogonal, are composited, and thereby QPSK modulation signals are generated. Four signal points shown in FIG. 9 are obtained by mapping (associating) the QPSK modulation signals on the I/Q plane. In FIG. 9, the inclination of the signal point corresponds to the phase of the QPSK modulation signal. Besides, the distance of the signal point from the intersection between the x axis and y axis corresponds to the amplitude of the QPSK modulation signal.

<1-1-1-2-2> Concrete Example of the Modulator

Here, referring to FIG. 10, a concrete configuration of the modulator 152 will be described. A description is given of the case in which the modulation method of QPSK is adopted in the modulator 152 as described above. FIG. 10 is a block diagram illustrating a modulator 152-1 relating to a channel CH1 and a modulator 152-2 relating to a channel CH2. In the description of FIG. 10, of the plural modulators 152, attention is paid to the modulator 152-1 relating to the channel CH1 and a modulator 152-2 relating to the channel CH2.

As illustrated in FIG. 10, the modulator 152-1 relating to the channel CH1 includes a serial/parallel converter 1521, an I channel waveform forming unit 1522, a Q channel waveform forming unit 1523, a carrier generator 1524, a multiplier 1525, a multiplier 1526, and an adder 1527.

The serial/parallel converter 1521 distributes reception data (serial data) to two parallel data by serial/parallel conversion. One of the two data sequences is distributed as an I channel, and the other is distributed as a Q channel. Specifically, the serial/parallel converter 1521 alternately receives the above-described "b0" component and "b1" component, such as "b0, b1, b0, b1, . . . " Then, the serial/parallel converter 1521 outputs the "b0" component as the I channel, and outputs the "b1" component as the Q channel.

The I channel waveform forming unit 1522 generates an I channel baseband signal (see FIG. 3), based on the I channel and an inter-channel interference correction signal which is supplied from the I channel waveform forming unit 1522 relating to the neighboring channel (CH2 in this example). Besides, the I channel waveform forming unit 1522 generates an inter-channel interference correction signal, based on the I channel. In addition, the I channel waveform forming unit 1522 supplies the inter-channel interference correction signal to the I channel waveform forming unit 1522 relating to the neighboring channel (CH2 in this example).

The Q channel waveform forming unit 1523 generates a Q channel baseband signal (see FIG. 3), based on the Q channel and an inter-channel interference correction signal which is supplied from the Q channel waveform forming unit 1523 relating to the neighboring channel (CH2 in this example). Besides, the Q channel waveform forming unit 1523 generates an inter-channel interference correction signal, based on the Q channel. In addition, the Q channel waveform forming unit 1523 supplies the inter-channel interference correction signal to the Q channel waveform forming unit 1523 relating to the neighboring channel (CH2 in this example).

The carrier generator 1524 generates a central frequency f1 relating to the channel associated with the modulator 152. In addition, the carrier generator 1524 supplies the central frequency f1 to the multiplier 1525 and multiplier 1526. Further, the carrier generator 1524 supplies a modulation signal, which executes, for example, a 90° phase shift, to the multiplier 1526.

The multiplier 1525 generates a BPSK modulation signal relating to the I channel of the channel CH1, based on the I channel baseband signal and central frequency f1.

The multiplier 1526 generates a BPSK modulation signal relating to the Q channel of the channel CH1, based on the Q channel baseband signal and central frequency f1.

The adder 1527 generates a QPSK modulation signal by compositing the BPSK modulation signal relating to the I channel and the BPSK modulation signal relating to the Q channel. Specifically, the adder 1527 maps the I channel (data sequence relating to b0) and the Q channel (data sequence relating to b1) on the I/Q plane. In addition, the adder 1527 superimposes the QPSK modulation signal on the sub-channel and generates the modulation signal.

Besides, the modulator 152-2 relating to the channel CH2 is similar to the modulator 152-1 relating to the channel CH1, except for the I channel waveform forming unit 1522 and Q channel waveform forming unit 1523.

Here, a description will be given of the I channel waveform forming unit 1522 and Q channel waveform forming unit 1523 of the modulator 152-2 relating to the channel CH2.

The I channel waveform forming unit 1522 of the modulator 152-2 generates an I channel baseband signal, based on the I channel and an inter-channel interference correction signal which is supplied from the I channel waveform forming unit 1522 relating to the neighboring channel (CH1 in this example). Besides, the I channel waveform forming unit 1522 generates an inter-channel interference correction signal, based on the I channel. In addition, the I channel waveform forming unit 1522 supplies the inter-channel interference correction signal to the I channel waveform forming unit 1522 relating to the neighboring channel (CH1 in this example).

The Q channel waveform forming unit 1523 of the modulator 152-2 generates a Q channel baseband signal, based on the Q channel and an inter-channel interference correction signal which is supplied from the Q channel waveform forming unit 1523 relating to the neighboring channel (CH1 in this example). Besides, the Q channel waveform forming unit 1523 generates an inter-channel interference correction signal, based on the Q channel. In addition, the Q channel waveform forming unit 1523 supplies the inter-channel interference correction signal to the Q channel waveform forming unit 1523 relating to the neighboring channel (CH1 in this example).

In addition, the modulators 152 relating to the other channels have the same configuration as the above-described modulator 152.

<1-1-1-2-3> I Channel Waveform Forming Unit

Referring to FIG. 11, the I channel waveform forming unit will be described. FIG. 11 is a block diagram illustrating the I channel waveform forming unit relating to the channel CH1 and the I channel waveform forming unit relating to the channel CH2. In the description of FIG. 11, of the I channel waveform forming units, attention is paid to the I channel waveform forming unit relating to the channel CH1 and the I channel waveform forming unit relating to the channel CH2.

As illustrated in FIG. 11, the I channel waveform forming unit 1522 relating to the channel CH1 includes an I channel filter 15221.

The I channel filter 15221 multiplies the digital signal (see FIG. 2) relating to the received I channel (CH1) by a Hanning window function, thereby executing band limitation by the waveform shaping in the time region with respect to the I channel (CH1), and generating a provisional I channel baseband signal (CH1) which is a source of the I channel baseband signal.

The I channel filter 15221 generates such an arbitrary correction coefficient (e.g. −0.5) as to cause a reverse interference on the provisional I channel baseband signal.

The I channel filter 15221 generates an inter-channel interference correction signal, based on the provisional I channel baseband signal (CH1) and the correction coefficient, and supplies the inter-channel interference correction signal to the I channel filter 15221 relating to the neighboring channel (channel CH2 in this example).

The I channel filter 15221 generates an I channel baseband signal (CH1), based on the provisional I channel baseband signal (CH1) and the inter-channel interference correction signal supplied from the I channel filter 15221 relating to the neighboring channel (channel CH2 in this example). By receiving the inter-channel interference correction signal, the I channel filter 15221 can cause the reverse interference on the provisional I channel baseband signal (CH1) by using the provisional I channel baseband signal (CH2) of the neighboring channel. Thereby, a mixture signal from the neighboring channel (CH2) can be subtracted from the provisional I channel baseband signal (CH1).

In this manner, the I channel waveform forming unit 1522 relating to the channel CH1 can generate the I channel baseband signal (CH1) in which the interference from the neighboring channel on the frequency region is preliminarily compensated.

In the meantime, the I channel waveform forming unit 1522 relating to the channel CH2 is basically the same as the I channel waveform forming unit 1522 relating to the channel CH1.

Here, the I channel filter 15221 relating to the channel CH2 will be described in brief.

The I channel filter 15221 generates an inter-channel interference correction signal, based on the provisional I channel baseband signal (CH2) and the correction coefficient, and supplies the inter-channel interference correction signal to the I channel filter 15221 relating to the neighboring channel (channel CH1 in this example).

The I channel filter 15221 generates an I channel baseband signal (CH2), based on the provisional I channel baseband signal (CH2) and the inter-channel interference correction signal supplied from the I channel filter 15221 relating to the neighboring channel (channel CH1 in this example).

For example, the I channel waveform forming unit 1522 relating to the channel CH2 generates an inter-channel interference correction signal for subtracting a signal component (provisional I channel baseband signal (CH2)) of the I channel relating to the channel CH2, and supplies the inter-channel interference correction signal to the I channel waveform forming unit 1522 relating to the channel CH1.

Thereby, the I channel waveform forming unit 1522 relating to the channel CH1 can generate the I channel baseband signal (CH1) from which the signal component of the I channel relating to the channel CH2 neighboring the channel CH1 is subtracted.

In addition, the I channel waveform forming unit 1522 relating to the channel CH1 generates an inter-channel interference correction signal for subtracting a signal component (provisional I channel baseband signal (CH1)) of the I channel relating to the channel CH1, and supplies the inter-channel interference correction signal to the I channel waveform forming unit 1522 relating to the channel CH2.

Thereby, the I channel waveform forming unit 1522 relating to the channel CH2 can generate the I channel baseband signal (CH2) from which the signal component of the I channel relating to the channel CH1 neighboring the channel CH2 is subtracted.

Besides, the I channel waveform forming units 1522 relating to the other channels have the same configuration as the above-described I channel waveform forming unit 1522.

<1-1-1-2-4> Q Channel Waveform Forming Unit

Referring to FIG. 12, the Q channel waveform forming unit will be described. FIG. 12 is a block diagram illustrating the Q channel waveform forming unit relating to the channel CH1 and the Q channel waveform forming unit relating to the channel CH2. In the description of FIG. 12, of the Q channel waveform forming units, attention is paid to the Q channel waveform forming unit relating to the channel CH1 and the Q channel waveform forming unit relating to the channel CH2.

As illustrated in FIG. 12, the Q channel waveform forming unit 1523 relating to the channel CH1 includes a Q channel filter 15231.

The Q channel filter 15231 multiplies the digital signal (see FIG. 2) relating to the received Q channel (CH1) by a Hanning window function, thereby executing band limitation by the waveform shaping in the time region with respect to the Q channel (CH1), and generating a provisional Q channel baseband signal (CH1) which is a source of the Q channel baseband signal.

The Q channel filter 15231 generates such an arbitrary correction coefficient (e.g. −0.5) as to cause a reverse interference on the provisional Q channel baseband signal.

The Q channel filter 15231 generates an inter-channel interference correction signal, based on the provisional Q channel baseband signal (CH1) and the correction coefficient, and supplies the inter-channel interference correction signal to the Q channel filter 15231 relating to the neighboring channel (channel CH2 in this example).

The Q channel filter 15231 generates a Q channel baseband signal (CH1), based on the provisional Q channel baseband signal (CH1) and the inter-channel interference correction signal supplied from the Q channel filter 15231 relating to the neighboring channel (channel CH2 in this example).

In the meantime, the Q channel waveform forming unit 1523 relating to the channel CH2 is basically the same as the Q channel waveform forming unit 1523 relating to the channel CH1.

Here, the Q channel filter 15231 relating to the channel CH2 will be described in brief.

The Q channel filter 15231 generates an inter-channel interference correction signal, based on the provisional Q channel baseband signal (CH2) and the correction coefficient, and supplies the inter-channel interference correction signal to the Q channel filter 15231 relating to the neighboring channel (channel CH1 in this example).

The Q channel filter 15231 generates a Q channel baseband signal (CH2), based on the provisional Q channel baseband signal (CH2) and the inter-channel interference correction signal supplied from the Q channel filter 15231 relating to the neighboring channel (channel CH1 in this example).

For example, the Q channel waveform forming unit 1523 relating to the channel CH2 generates an inter-channel interference correction signal for subtracting a signal component (provisional Q channel baseband signal (CH2)) of the Q channel relating to the channel CH2, and supplies the inter-channel interference correction signal to the Q channel waveform forming unit 1523 relating to the channel CH1.

Thereby, the Q channel waveform forming unit 1523 relating to the channel CH1 can generate the Q channel baseband signal (CH1) from which the signal component of the Q channel relating to the channel CH2 neighboring the channel CH1 is subtracted.

In addition, the Q channel waveform forming unit 1523 relating to the channel CH1 generates an inter-channel interference correction signal for subtracting a signal component (provisional Q channel baseband signal (CH1)) of the Q channel relating to the channel CH1, and supplies the inter-channel interference correction signal to the Q channel waveform forming unit 1522 relating to the channel CH2.

Thereby, the Q channel waveform forming unit 1523 relating to the channel CH2 can generate the Q channel baseband signal (CH2) from which the signal component of the Q channel relating to the channel CH1 neighboring the channel CH2 is subtracted.

Besides, the Q channel waveform forming units 1523 relating to the other channels have the same configuration as the above-described Q channel waveform forming unit 1523.

By adopting the above-described modulator 152, the modulation signal, from which the interference of the neighboring channel is subtracted, can be generated.

Thereby, as described in FIG. 5, even if the sub-channels SC are multiplexed, the interference of the neighboring channel can be avoided.

<1-1-2> Configuration of the NAND Package

Figure 13:
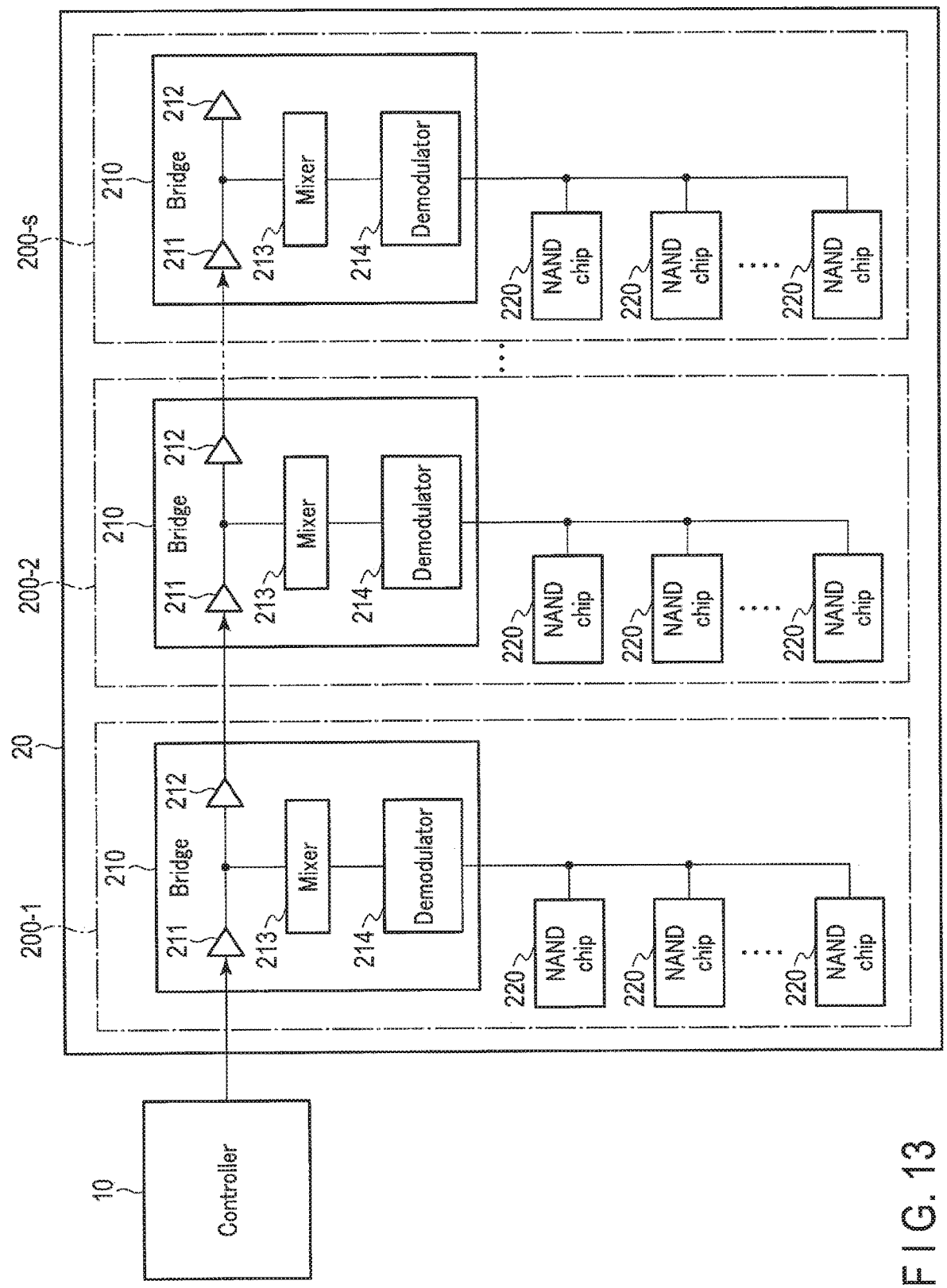
FIG. 13 is a block diagram illustrating the NAND package of the memory system according to the first embodiment.

Next, referring to FIG. 13, the NAND package 20 will be described. FIG. 13 is a block diagram illustrating the NAND package 20.

The NAND package 20 stores data which is delivered from the host 2, and data for managing the memory system 1.

As illustrated in FIG. 13, the NAND package 20 includes memory sets 200 (in FIG. 13, 200-1 to 200-s). The memory sets 200 are connected in series.

The memory set 200 includes a bridge (receiver) 210, and chips (e.g. NAND chips that are NAND flash memories) 220.

The bridge 210 includes an amplifier 211, an amplifier 212, a mixer 213 and a demodulator 214.

The amplifier 211 amplifies a reception signal (time signal) supplied from the controller 10 or from an immediately preceding memory set 200, and supplies the amplified signal (time signal) to the amplifier 212 and mixer 213.

The amplifier 212 amplifies the time signal supplied from the amplifier 211 and supplies the amplified signal (time signal) to the amplifier 211 of a subsequent memory set 200.

The mixer 213 extracts a necessary component from the time signal supplied from the amplifier 211 and supplies the extracted necessary component to the demodulator 214.

The demodulator 214 executes demodulation, based on the time signal supplied from the mixer 213. In addition, the demodulator 214 supplies data, which is obtained by the demodulation, to the NAND chips 220.

The respective NAND chips 220 can operate, for example, independently from each other. Needless to say, the number of NAND chips 220 is discretionary.

Channels are allocated to the memory sets 200, respectively. For example, channels CH1 to CHs are successively allocated to the memory sets 200-1 to 200-s.

For example, the bridge 210 of the memory set 200-1 demodulates a sub-channel SC(CHt) relating to a channel CHt, and supplies demodulated data D(CHt) to the NAND chips of a memory set 200-t.

<1-2> Advantageous Effects

According to the above-described embodiment, the controller (transmitter) generates the baseband signal in which the frequency band is limited, based on the digital signal, and causes a reverse interference between the baseband signals of mutually neighboring channels, thereby generating the frequency waveform.

Here, comparative examples will be described in order to describe the advantageous effects of the above-described embodiment.

<1-2-1> Comparative Example 1

Figure 14:
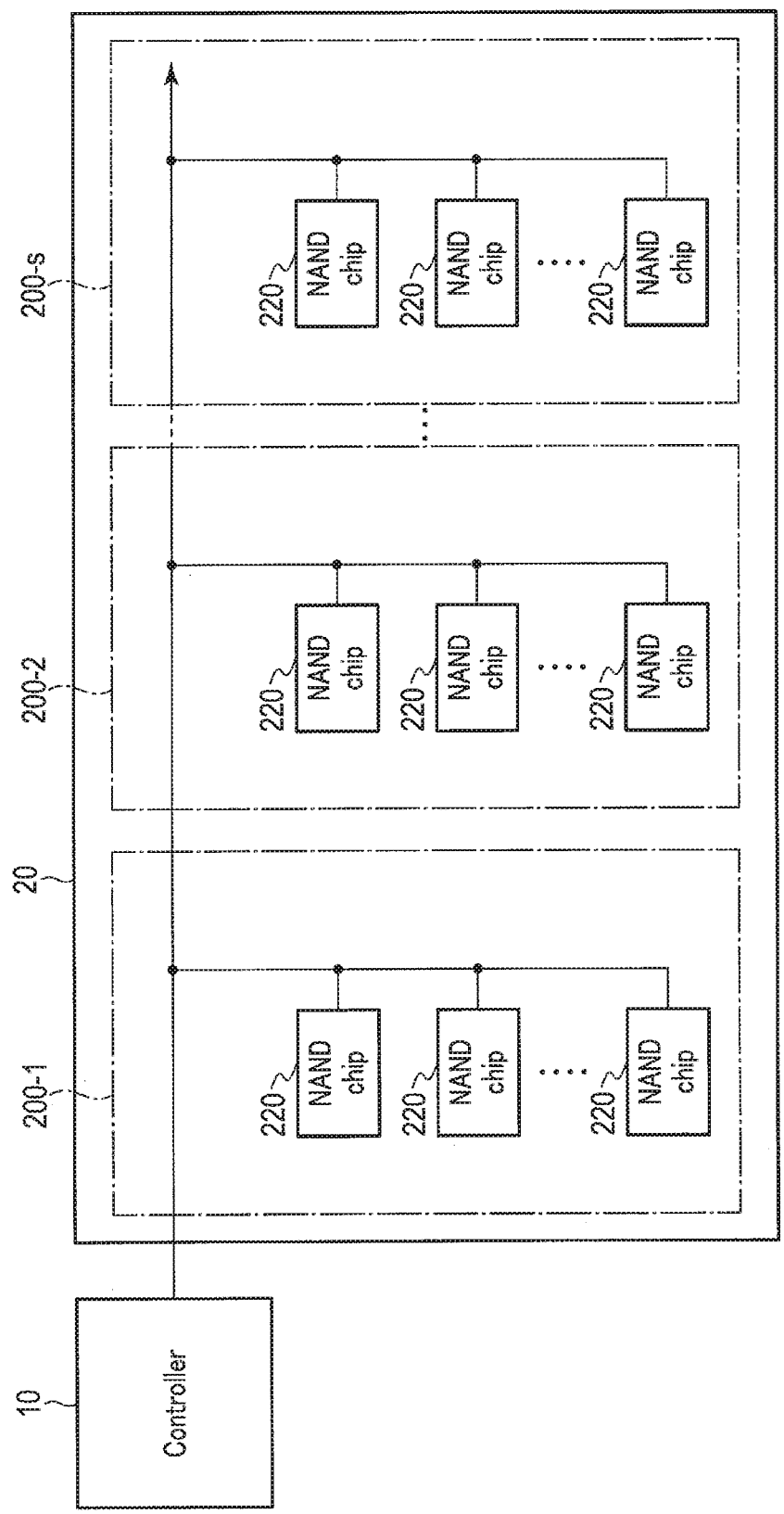
FIG. 14 is a block diagram illustrating a NAND package of a memory system according to comparative example 1.

Referring to FIG. 14, comparative example 1 will be described. FIG. 14 is a block diagram illustrating a NAND package 20 according to comparative example 1.

As illustrated in FIG. 14, in the NAND package 20 of comparative example 1, memory sets 200 are connected in series. Unlike the memory set 200 of the first embodiment, the memory set 200 of comparative example 1 does not include the bridge. Thus, in comparative example 1, a greater number of NAND chips are connected to the bus which connects the controller 10 and NAND package 20. Specifically, when each memory set 200 includes a y-number of NAND chips 220 (y is an integer of one or more), (y×s) NAND chips 220 are connected to the bus. In some cases, the NAND chip 220 becomes a load capacitance. Thus, as the number of NAND chips 220 connected to the bus becomes larger, the load capacitance becomes greater. If the load capacitance increases, the transmission band between the controller 10 and NAND package 20 narrows. As a result, there is a possibility that the communication speed between the controller 10 and NAND package 20 is limited.

On the other hand, in the first embodiment, each memory set 200 includes the bridge 210. Thus, the NAND chips 220 connected to the bus, which connects the controller 10 and NAND package 20, can be regarded as the NAND chips 220 of the memory set 200-1. Specifically, when the memory set 200-1 includes a y-number of NAND chips 220, the y-number of NAND chips 220 are connected to the bus. Similarly, the NAND chips 220 connected to the bus between a memory set 200-t and a memory set 200-t+1 can be regarded as the NAND chips 220 of the memory set 200-t+1. Specifically, when the memory set 200-1+1 includes a y-number of NAND chips 220, the y-number of NAND chips 220 are connected to the bus. In this manner, in the first embodiment, compared to comparative example 1, the load capacitance of the bus can be reduced. Thus, the transmission band between the controller 10 and NAND package 20 can be made greater than in comparative example 1.

<1-2-2> Comparative Example 2

Next, referring to FIG. 15 and FIG. 16, comparative example 2 will be described. FIG. 15 is a view in which frequency waveforms of three communication methods are compared. In the three graphs of FIG. 15, the ordinate axis indicates a signal amplitude (voltage) and the abscissa axis indicates time. FIG. 16 is a block diagram illustrating a NAND package 20 according to comparative example 2.

In comparative example 2, the case is described in which TDMA (Time Division Multiple Access) is adopted as a communication method between the controller 10 and NAND package 20.

As illustrated in FIG. 15, TDMA is a method which uses one frequency and performs communication by varying the time of transmission of transmission data. In the TDMA, the communication speed required for communication of one frequency is, for example, 51.2 Gbps.

As illustrated in FIG. 16, when TDMA is adopted as the communication method between the controller 10 and NAND package 20, communication is performed by allocating time to each channel, for example, such that the memory set 200-t uses a time T1 and then the memory set 200-t+1 uses a time T2. In this method, the respective memory sets 200 execute communication in different time slots, thereby avoiding a collision of signals. In addition, in this method, it is necessary that all bridges 210 operate at high speed (51.2 Gbps). If all bridges 210 are operated at high speed, there is a possibility that the power consumption increases. Besides, when a rapid increase in speed and capacity of memory systems is taken into account, there is concern that the power consumption for compensating the effect of transmission line loss characteristics becomes considerably large.

On the other hand, in the method adopted in the first embodiment, the communication speed required for communication of one sub-channel SC is, for example, 6.4 Gbps. Thus, as illustrated in FIG. 17, it should suffice if the bridge 210 according to the first embodiment operates at 6.4 Gbps. In other words, it should suffice if the bridge 210 according to the first embodiment operates at a lower speed than the bridge 210 of comparative example 2, and the power consumption is suppressed by that much.

<1-2-3> Comparative Example 3

Referring to FIG. 15, comparative example 3 will be described. In comparative example 3, the case is described in which FDMA (Frequency Division Multiple Access) is adopted as a communication method between the controller 10 and NAND package 20.

As illustrated in FIG. 15, FDMA is a method which performs communication by varying the frequency. In this method, a region called "guard band" where no signal component exists needs to be secured in order to prevent an interference between modulation signals of mutually neighboring sub-channels. However, due to the provision of the guard band, the frequency band becomes wider. There is a possibility that the power consumption increases as the frequency band becomes wider.

On the other hand, in the method adopted in the first embodiment, since the sub-channels are multiplexed, the frequency band is prevented from becoming wider. Thus, in the first embodiment, communication can be performed in a narrower frequency band than in comparative example 3. As a result, in the first embodiment, an increase in power consumption can be suppressed.

<1-2-4> Comparative Example 4

Figure 18:
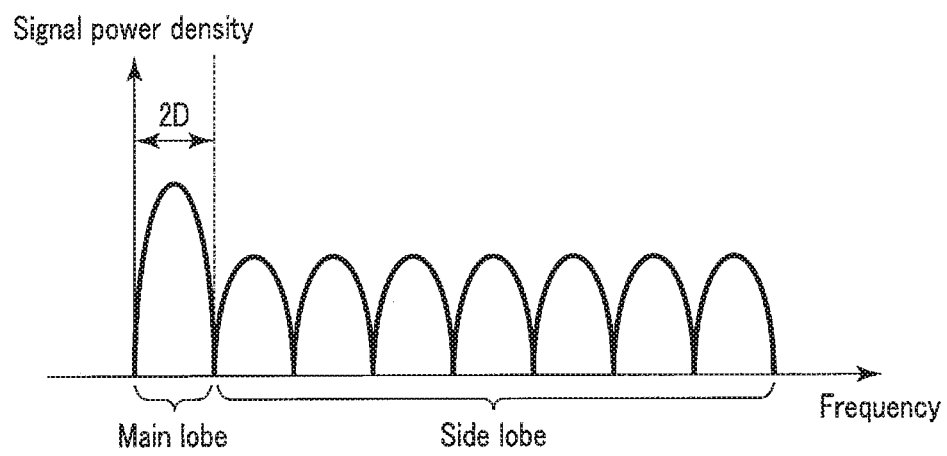
FIG. 18 is a graph illustrating a frequency waveform which is applied to a signal that is communicated between a controller and a NAND package of a memory system according to comparative example 4.
Figure 19:
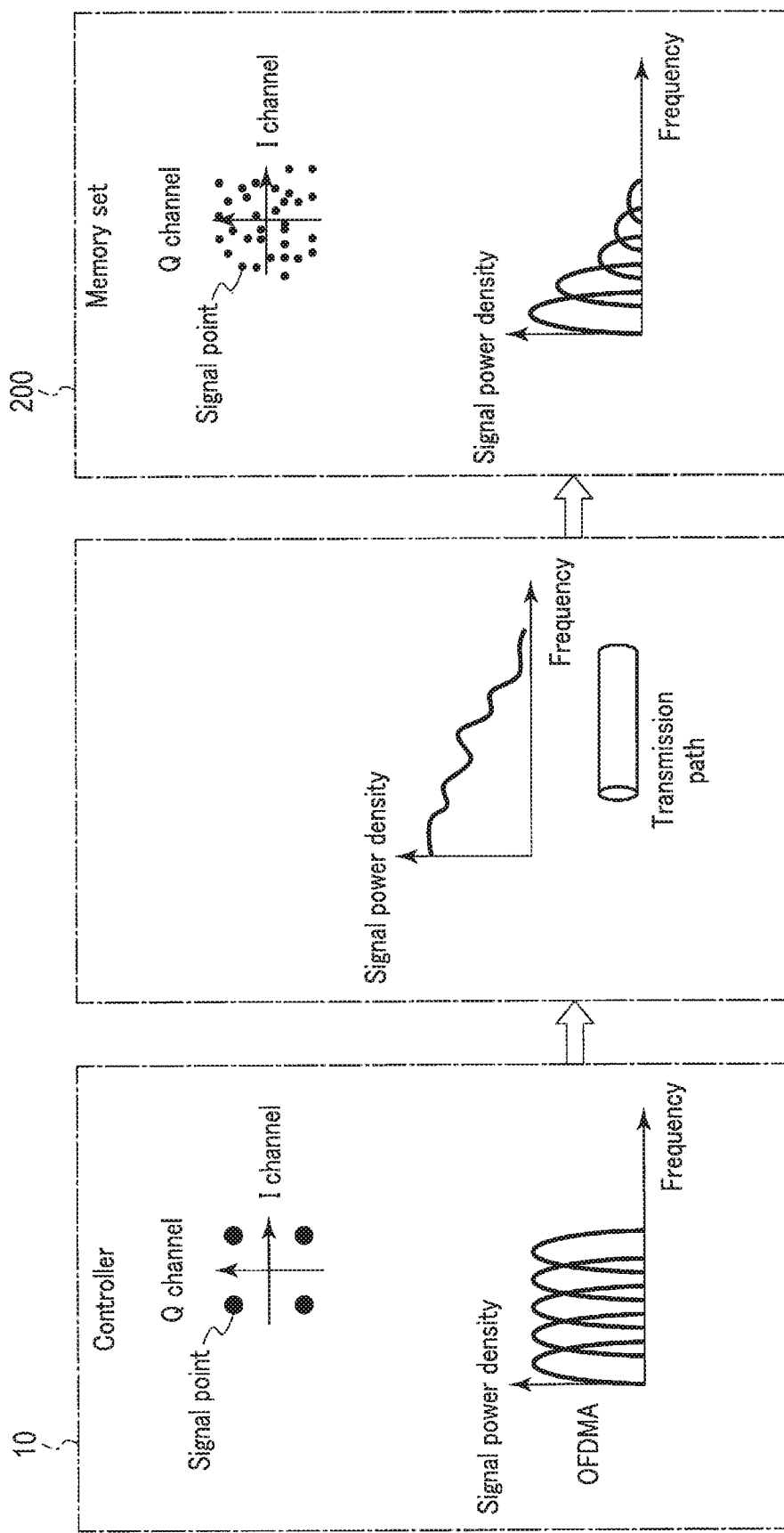
FIG. 19 is a view illustrating a relationship between the frequency waveform in the controller of the memory system according to the comparative example 4, a characteristics of a transmission path, and a frequency waveform in a memory set.

Referring to FIG. 2, FIG. 15, FIG. 18, FIG. 19 and FIG. 20, comparative example 4 will be described. FIG. 18 is a graph illustrating a frequency waveform which is applied to a signal that is communicated between a controller and a NAND package according to comparative example 4. In FIG. 18, the ordinate axis indicates a signal power density (logarithm indication) and the abscissa axis indicates a frequency. FIG. 19 is a view illustrating a relationship between the signal in the controller, the characteristics of a transmission path, and the signal in the memory set. FIG. 20 is a graph illustrating a relationship between a frequency waveform supplied to the memory set according to the first embodiment and the I/Q plane. In FIG. 20, the ordinate axis indicates a signal power density (logarithm indication) and the abscissa axis indicates a frequency.

In comparative example 4, the case is described in which OFDMA (Orthogonal Frequency Division Multiple Access) is adopted as a communication method between the controller 10 and NAND package 20.

As illustrated in FIG. 15, OFDMA is a method which performs communication by orthogonalizing and multiplexing different sub-channels and allocating the respective sub-channels to a plurality of channels.

In the OFDMA, the frequency band of the transmission signal is not limited (see FIG. 2). Specifically, the transmission signal in the OFDMA is "rectangular wave".

By Fourier-transforming the transmission signal that is the "rectangular wave", a frequency waveform as shown in FIG. 18 is generated. As illustrated in FIG. 18, the frequency width of the main lobe of the sub-channel becomes 2D, and there exist many side lobe components (high-frequency components). The side lobe component relating to the OFDMA has a higher signal power density than the side lobe component (see FIG. 4) relating to the communication method of the present embodiment, and the number of side lobe components is greater than in the present embodiment.

Next, referring to FIG. 19, the relationship between degradation of the signal of OFDMA and the I/Q plane will be described.

As illustrated in FIG. 19, the controller 10 generates a signal of OFDMA. At this time, data is properly mapped on the I/Q plane. In addition, the controller 10 supplies the signal of OFDMA to the memory set 200 via the bus. As illustrated in FIG. 19, the bus has uneven frequency characteristics. Thus, the signal that is transmitted via the bus is affected by the frequency characteristics of the bus. It is possible, therefore, that the signal that is supplied to the memory set 200 is fatally degraded, as illustrated in FIG. 19. There is a possibility that this is due to the degradation of the side lobe component.

On the other hand, in the first embodiment, the side lobe component of the sub-channel SC is negligibly small. Thus, in the first embodiment, the degradation of the signal due to the degradation of the side lobe component is suppressed. Therefore, as illustrated in FIG. 20, even if the signal is affected by the uneven frequency characteristics of the bus and the quality is degraded, the data can properly be demodulated.

<1-2-5> Summary

According to the above-described embodiment, a decrease of the transmission speed between the controller and NAND package can be suppressed. In addition, according to the above embodiment, an increase in the number of output pins relating to the NAND package of the controller can be suppressed. Besides, according to the above embodiment, an increase in power consumption can be suppressed. Moreover, according to the above embodiment, the transmission band can be widened. As a result, the number of connectable NAND chips can be increased. According to the above embodiment, a proper signal can be received by the receiver.

In the first embodiment, it is presupposed that one sub-channel is allocated to one memory set 200, but the embodiment is not limited to this. For example, a plurality of sub-channels may be allocated to one memory set 200.

<1-3> Modification

Next, referring to FIG. 13, a NAND package 20 according to a modification of the first embodiment will be described.

The bridge 210 of the NAND package 20 according to the modification of the first embodiment is configured to selectively receive only the signal relating to the channel (sub-channel) allocated to the bridge 210 itself, and relays the signals other than the received channel to the rear-stage bridges 210. The power consumption can be suppressed by the bridge 210 receiving the signal relating to the channel allocated to the bridge 210 itself.

<2> Second Embodiment

A second embodiment will be described. In the second embodiment, a concrete example of the circuit, which performs waveform shaping in modulation, will be described. Incidentally, the basic configuration and basic operation of the apparatus according to the second embodiment are the same as those of the apparatus according to the above-described first embodiment. Thus, a description is omitted of matters described in the first embodiment and matters which are easily guessable from the first embodiment.

<2-1> Configuration

<2-1-1> Outline

In the second embodiment, concrete configurations of the I channel waveform forming unit 1522 and Q channel waveform forming unit 1523 will be described. The I channel waveform forming unit 1522 and Q channel waveform forming unit 1523 according to the second embodiment increase the amplitude of the baseband signal when the data of neighboring channels are equal, and decrease the amplitude of the baseband signal when the data of neighboring channels are different.

<2-1-2> I Channel Waveform Forming Unit

<2-1-2-1> Outline of I Channel Waveform Forming Unit

Referring to FIG. 21, the I channel waveform forming unit 1522 according to the second embodiment will be described. FIG. 21 is a block diagram illustrating the I channel waveform forming unit relating to the channel CH1 and the I channel waveform forming unit relating to the channel CH2. In the description of FIG. 21, of the I channel waveform forming units, attention is paid to the I channel waveform forming unit relating to the channel CH1 and the I channel waveform forming unit relating to the channel CH2.

As illustrated in FIG. 21, an I channel (CH1) that is a rectangular wave is input to the I channel waveform forming unit 1522 relating to the channel CH1. The I channel waveform forming unit 1522 compares data with data of the I channel (CH2) relating to the neighboring channel (CH2). In addition, when the data of the I channel (CH1) and the data of the I channel (CH2) are identical, the amplitude of the I channel baseband signal (CH1) is increased. When the data of the I channel (CH1) and the data of the I channel (CH2) are different, the amplitude of the I channel baseband signal (CH1) is decreased. The waveform of the I channel baseband signal (CH1) is the waveform described with reference to FIG. 3.

Similarly, an I channel (CH2) that is a rectangular wave is input to the I channel waveform forming unit 1522 relating to the channel CH2. The I channel waveform forming unit 1522 compares data with data of the I channel (CH1) relating to the neighboring channel (CH1). In addition, when the data of the I channel (CH1) and the data of the I channel (CH2) are identical, the amplitude of the I channel baseband signal (CH2) is increased. When the data of the I channel (CH1) and the data of the I channel (CH2) are different, the amplitude of the I channel baseband signal (CH2) is decreased. The waveform of the I channel baseband signal (CH2) is the waveform described with reference to FIG. 3.

<2-1-2-2> Concrete Example of I Channel Waveform Forming Unit

Referring to FIG. 22, a concrete example of the I channel waveform forming unit 1522 according to the second embodiment will be described. FIG. 22 is a block diagram illustrating the I channel waveform forming unit relating to the channel CH1 and the I channel waveform forming unit relating to the channel CH2. In the description of FIG. 22, of the I channel waveform forming units, attention is paid to the I channel waveform forming unit relating to the channel CH1 and the I channel waveform forming unit relating to the channel CH2.

As illustrated in FIG. 22, the I channel waveform forming unit 1522 relating to the channel CH1 includes an I channel controller 15225, a waveform generator 15226 and an adder 15227.

An I channel (CH1) and an I channel (CH2) are input to the I channel controller 15225 relating to the channel CH1. Based on the I channel (CH1) and I channel (CH2), the I channel controller 15225 relating to the channel CH1 generates control signals relating to the channel CH1. The control signals include signals ICC and ICCB (an inverted signal of ICC) for generating an I channel baseband signal based on the I channel (CH1), and a signal IAC indicating whether the I channel (CH1) and I channel (CH2) are identical or not.

Based on the control signals relating to the channel CH1, the waveform generator 15226 relating to the channel CH1 generates signals IOUTP and IOUTN relating to the channel CH1.

Based on the signals IOUTP and IOUTN relating to the channel CH1, the adder 15227 relating to the channel CH1 generates an I channel baseband signal relating to the channel CH1. For example, the adder 15227 relating to the channel CH1 generates the I channel baseband signal relating to the channel CH1 by subtracting the signal IOUTN from the signal IOUTP relating to the channel CH1.

Similarly, the I channel waveform forming unit 1522 relating to the channel CH2 includes an I channel controller 15225, a waveform generator 15226 and an adder 15227.

An I channel (CH1) and an I channel (CH2) are input to the I channel controller 15225 relating to the channel CH2. Based on the I channel (CH1) and I channel (CH2), the I channel controller 15225 relating to the channel CH2 generates control signals relating to the channel CH2. The control signals include signals ICC and ICCB (an inverted signal of ICC) for generating an I channel baseband signal based on the I channel (CH2), and a signal IAC indicating whether the I channel (CH1) and I channel (CH2) are identical or not.

Based on the control signals relating to the channel CH2, the waveform generator 15226 relating to the channel CH2 generates signals IOUTP and IOUTN relating to the channel CH2.

Based on the signals IOUTP and IOUTN relating to the channel CH2, the adder 15227 relating to the channel CH2 generates an I channel baseband signal relating to the channel CH2. For example, the adder 15227 relating to the channel CH2 generates the I channel baseband signal relating to the channel CH2 by subtracting the signal IOUTN from the signal IOUTP relating to the channel CH2.

<2-1-2-3> Waveform Generator

Referring to FIG. 23, a waveform generator of the I channel waveform forming unit according to the second embodiment will be described. FIG. 23 is a circuit diagram illustrating the waveform generator of the I channel waveform forming unit.

As illustrated in FIG. 23, the waveform generator 15226 includes a digital-to-analog converter (DAC) 261, a digital-to-analog converter 262, and an amplitude controller 263.

The digital-to-analog converter 261 includes drivers 2610 (in FIG. 23, drivers 2610-0 to 2610-$v$; v is an integer). Signals ICC[0] to ICC[v] are input to the drivers 2610-0 to 2610-$v$.

The driver 2610 includes a PMOS transistor T1, a resistor R1, a resister R2 and an NMOS transistor T2. A power supply voltage is supplied to a first end (source) of the PMOS transistor T1. A second end (drain) of the PMOS transistor T1 is connected to a first end of the resistor R1. A signal ICC is supplied to the gate electrode of the PMOS transistor T1. A second end of the resistor R1 is connected to a node N1. A first end (drain) of the NMOS transistor T2 is connected to a first end of the resistor R2. A second end (source) of the NMOS transistor T2 is supplied with a ground voltage, and the signal ICC is supplied to the gate electrode of the NMOS transistor T2. A second end of the resistor R2 is connected to the node N1. The drivers 2610-0 to 2610-$v$ receive signals ICC[0] to ICC[v] as the signals ICC.

Besides, the driver 2610 includes the PMOS transistor T1 and NMOS transistor T2 to which the signal ICC is input. Thus, either the PMOS transistor T1 or the NMOS transistor T2 is in an ON state.

The digital-to-analog converter 262 includes drivers 2620 (in FIG. 23, drivers 2620-0 to 2620-$v$). Signals ICCB[0] to ICCB[v] are input to the drivers 2620-0 to 2620-$v$.

The driver 2620 includes a PMOS transistor T3, a resistor R3, a resister R4 and an NMOS transistor T4. A power supply voltage is supplied to a first end (source) of the PMOS transistor T3. A second end (drain) of the PMOS transistor T3 is connected to a first end of the resistor R3. A signal ICCB is supplied to the gate electrode of the PMOS transistor T3. A first end (drain) of the NMOS transistor T4 is connected to a first end of the resistor R4. A second end (source) of the NMOS transistor T4 is supplied with a ground voltage, and the signal ICCB is supplied to the gate electrode of the NMOS transistor T4. A second end of the resistor R4 is connected to a node N2. The drivers 2620-0 to 2620-v receive signals ICCB[0] to ICCB[v] as the signals ICCB.

Besides, the driver 2620 includes the PMOS transistor T3 and NMOS transistor T4 to which the signal ICCB is input. Thus, either the PMOS transistor T3 or the NMOS transistor T4 is in an ON state.

The amplitude controller 263 includes variable resistors VR1, VR2 and VR3, and a switch SW1. The variable resistor VR1 has a first end connected to the node N1 and has a second end connected to the node N2. The variable resistor VR2 has a first end connected to the node N1 and has a second end connected to a first end of the switch SW1. The variable resistor R3 has a first end connected to a second end of the switch SW1 and has a second end connected to the node N2. Based on a signal IAC, the switch SW1 controls a connection between the variable resistors VR2 and VR3. For example, when it is determined that the data of neighboring channels are identical, the switch SW1 is set in an OFF state by the signal IAC. When it is determined that the data of the neighboring channels are different, the switch SW1 is set in an ON state by the signal IAC.

An output of the node N1 is the signal IOUTP. Similarly, an output of the node N2 is the signal IOUTN.

<2-1-3> Q Channel Waveform Forming Unit

<2-1-3-1> Outline of Q Channel Waveform Forming Unit

Referring to FIG. 24, the Q channel waveform forming unit 1523 according to the second embodiment will be described. FIG. 24 is a block diagram illustrating the Q channel waveform forming unit relating to the channel CH1 and the Q channel waveform forming unit relating to the channel CH2. In the description of FIG. 24, of the Q channel waveform forming units, attention is paid to the Q channel waveform forming unit relating to the channel CH1 and the Q channel waveform forming unit relating to the channel CH2.

As illustrated in FIG. 24, a Q channel (CH1) that is a rectangular wave is input to the Q channel waveform forming unit 1523 relating to the channel CH1. The Q channel waveform forming unit 1523 compares data with data of the Q channel (CH2) relating to the neighboring channel (CH2). In addition, when the data of the Q channel (CH1) and the data of the Q channel (CH2) are identical, the amplitude of the Q channel baseband signal (CH1) is increased. When the data of the Q channel (CH1) and the data of the Q channel (CH2) are different, the amplitude of the Q channel baseband signal (CH1) is decreased. The waveform of the Q channel baseband signal (CH1) is the waveform described with reference to FIG. 3.

Similarly, a Q channel (CH2) that is a rectangular wave is input to the Q channel waveform forming unit 1523 relating to the channel CH2. The Q channel waveform forming unit 1523 compares data with data of the Q channel (CH1) relating to the neighboring channel (CH1). In addition, when the data of the Q channel (CH1) and the data of the Q channel (CH2) are identical, the amplitude of the Q channel baseband signal (CH2) is increased. When the data of the Q channel (CH1) and the data of the Q channel (CH2) are different, the amplitude of the Q channel baseband signal (CH2) is decreased. The waveform of the Q channel baseband signal (CH2) is the waveform described with reference to FIG. 3.

<2-1-3-2> Concrete Example of Q Channel Waveform Forming Unit

Referring to FIG. 25, a concrete example of the Q channel waveform forming unit 1523 according to the second embodiment will be described. FIG. 25 is a block diagram illustrating the Q channel waveform forming unit relating to the channel CH1 and the Q channel waveform forming unit relating to the channel CH2. In the description of FIG. 25, of the Q channel waveform forming units, attention is paid to the Q channel waveform forming unit relating to the channel CH1 and the Q channel waveform forming unit relating to the channel CH2.

As illustrated in FIG. 25, the Q channel waveform forming unit 1523 relating to the channel CH1 includes a Q channel controller 15235, a waveform generator 15236 and an adder 15237.

A Q channel (CH1) and a Q channel (CH2) are input to the Q channel controller 15235 relating to the channel CH1. Based on the Q channel (CH1) and Q channel (CH2), the Q channel controller 15235 relating to the channel CH1 generates control signals relating to the channel CH1. The control signals include signals QCC and QCCB (an inverted signal of QCC) for generating a Q channel baseband signal based on the Q channel (CH1), and a signal QAC indicating whether the Q channel (CH1) and Q channel (CH2) are identical or not.

Based on the control signals relating to the channel CH1, the waveform generator 15236 relating to the channel CH1 generates signals IOUTP and IOUTN relating to the channel CH1.

Based on the signals IOUTP and IOUTN relating to the channel CH1, the adder 15237 relating to the channel CH1 generates a Q channel baseband signal relating to the channel CH1. For example, the adder 15237 relating to the channel CH1 generates the Q channel baseband signal relating to the channel CH1 by subtracting the signal IOUTN from the signal IOUTP relating to the channel CH1.

Similarly, the Q channel waveform forming unit 1523 relating to the channel CH2 includes a Q channel controller 15235, a waveform generator 15236 and an adder 15237.

A Q channel (CH1) and a Q channel (CH2) are input to the Q channel controller 15235 relating to the channel CH2. Based on the Q channel (CH1) and Q channel (CH2), the Q channel controller 15235 relating to the channel CH2 generates control signals relating to the channel CH2. The control signals include signals QCC and QCCB (an inverted signal of QCC) for generating a Q channel baseband signal based on the Q channel (CH2), and a signal QAC indicating whether the Q channel (CH1) and Q channel (CH2) are identical or not.

Based on the control signals relating to the channel CH2, the waveform generator 15236 relating to the channel CH2 generates signals IOUTP and IOUTN relating to the channel CH2.

Based on the signals IOUTP and IOUTN relating to the channel CH2, the adder 15237 relating to the channel CH2 generates a Q channel baseband signal relating to the channel CH2. For example, the adder 15237 relating to the channel CH2 generates the Q channel baseband signal relating to the channel CH2 by subtracting the signal IOUTN from the signal IOUTP relating to the channel CH2.

<2-1-3-3> Waveform Generator

Referring to FIG. 26, a waveform generator of the Q channel waveform forming unit according to the second embodiment will be described. FIG. 26 is a circuit diagram illustrating the waveform generator of the Q channel waveform forming unit.

As illustrated in FIG. 26, the waveform generator 15236 includes a digital-to-analog converter (DAC) 361, a digital-to-analog converter 362, and an amplitude controller 363.

The digital-to-analog converter 361 includes drivers 3610 (in FIG. 26, drivers 3610-0 to 3610-$v$). Signals QCC[0] to QCC[v] are input to the drivers 3610-0 to 3610-$v$.

The driver 3610 includes a PMOS transistor T5, a resistor R5, a resister R6 and an NMOS transistor T6. A power supply voltage is supplied to a first end (source) of the PMOS transistor T5. A second end (drain) of the PMOS transistor T5 is connected to a first end of the resistor R5. A signal QCC is supplied to the gate electrode of the PMOS transistor T5. A second end of the resistor R5 is connected to a node N3. A first end (drain) of the NMOS transistor T6 is connected to a first end of the resistor R6. A second end (source) of the NMOS transistor T6 is supplied with a ground voltage, and the signal QCC is supplied to the gate electrode of the NMOS transistor T6. A second end of the resistor R6 is connected to the node N3. The drivers 3610-0 to 3610-$v$ receive signals QCC[0] to QCC[v] as the signals QCC.

Besides, the driver 3610 includes the PMOS transistor T5 and NMOS transistor T6 to which the signal QCC is input. Thus, either the PMOS transistor T5 or the NMOS transistor T6 is in an ON state.

The digital-to-analog converter 362 includes drivers 3620 (in FIG. 26, drivers 3620-0 to 3620-$v$). Signals QCCB[0] to QCCB[v] are input to the drivers 3620-0 to 3620-V.

The driver 3620 includes a PMOS transistor T7, a resistor R7, a resister R8 and an NMOS transistor T8. A power supply voltage is supplied to a first end (source) of the PMOS transistor T7. A second end (drain) of the PMOS transistor T7 is connected to a first end of the resistor R7. A signal QCCB is supplied to the gate electrode of the PMOS transistor T7. A second end of the resistor R7 is connected to a node N4. A first end (drain) of the NMOS transistor T8 is connected to a first end of the resistor R8. A second end (source) of the NMOS transistor T8 is supplied with a ground voltage, and the signal QCCB is supplied to the gate electrode of the NMOS transistor TB. A second end of the resistor R8 is connected to the node N4. The drivers 3620-0 to 3620-$v$ receive signals QCCB[0] to QCCB[v] as the signals QCCB.

Besides, the driver 3620 includes the PMOS transistor T7 and NMOS transistor T8 to which the signal QCCB is input. Thus, either the PMOS transistor T7 or the NMOS transistor T8 is in an ON state.

The amplitude controller 363 includes variable resistors VR4, VR5 and VR6, and a switch SW2. The variable resistor VR4 has a first end connected to the node N3 and has a second end connected to the node N4. The variable resistor VR5 has a first end connected to the node N3 and has a second end connected to a first end of the switch SW2. The variable resistor R6 has a first end connected to a second end of the switch SW2 and has a second end connected to the node N4. Based on a signal QAC, the switch SW2 controls a connection between the variable resistors VR5 and VR6. For example, when it is determined that the data of neighboring channels are identical, the switch SW2 is set in an OFF state by the signal QAC. When it is determined that the data of the neighboring channels are different, the switch SW2 is set in an ON state by the signal QAC.

An output of the node N3 is the signal QOUTP. Similarly, an output of the node N4 is the signal QOUTN.

In the meantime, by properly varying the resistance values of the variable resistors VR1 to VR6, the amplitudes of the I channel baseband signal and Q channel baseband signal can be varied.

<2-2> Operation

Figure 27:
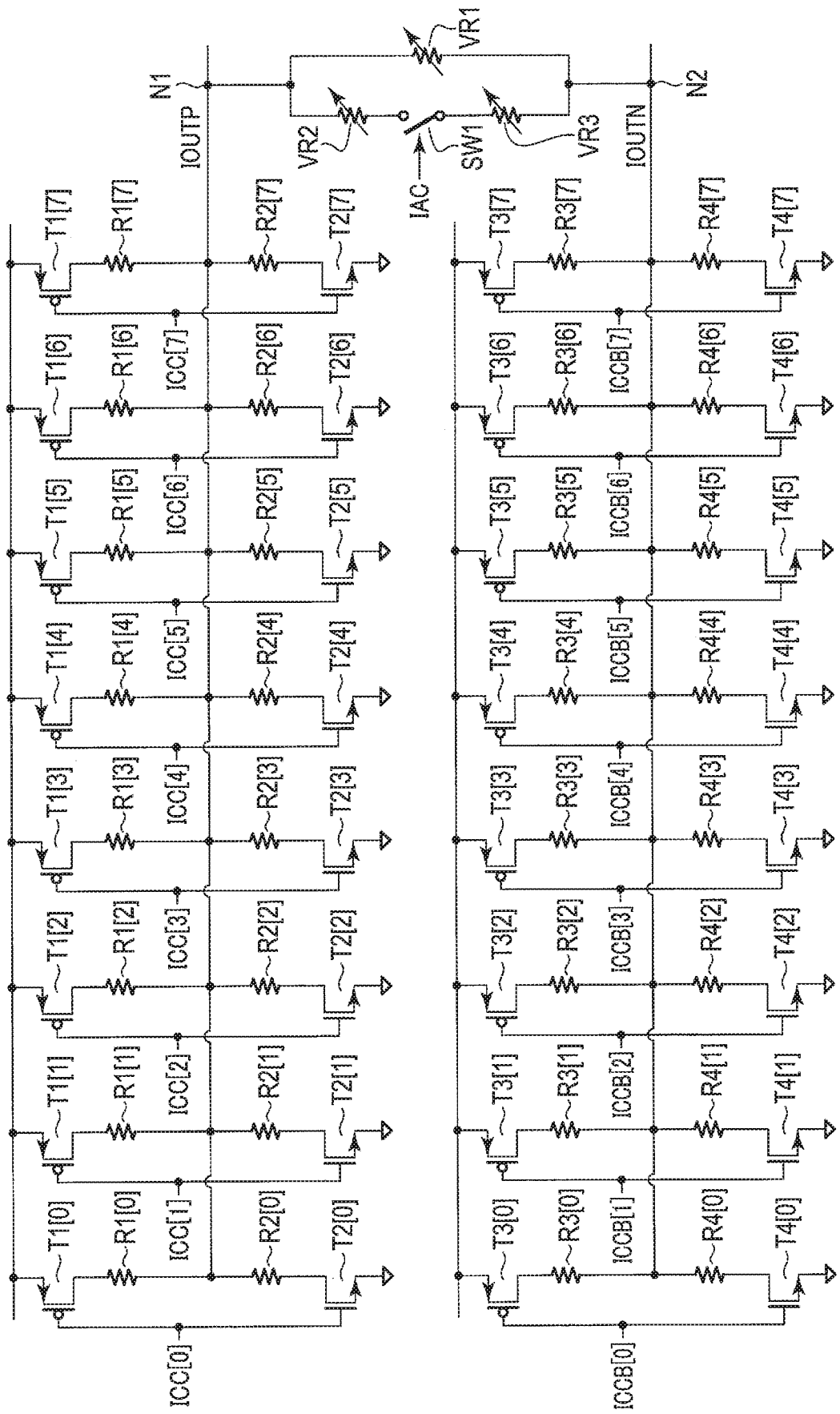
FIG. 27 is a circuit diagram illustrating a waveform generator of the I channel waveform forming unit.

Next, referring to FIG. 27 to FIG. 44, the operation of the I channel waveform forming unit will be described. FIG. 27 is a circuit diagram illustrating the waveform generator of the I channel waveform forming unit. FIG. 28 is a view illustrating a relationship between control signals and an I channel baseband signal. FIG. 29 to FIG. 44 are circuit diagrams illustrating the operation of the waveform generator of the I channel waveform forming unit. In this description, attention is paid to the operation of the I channel waveform forming unit relating to the channel CH1.

As illustrated in FIG. 27, by way of example, a case is described in which each of the digital-to-analog converter 261 and digital-to-analog converter 262 includes eight drivers.

For example, the case is assumed in which an I channel (CH1) is a data sequence "0101", and an I channel (CH2) that is parallel to the I channel (CH1) is a data sequence "1001". In this case, since a first half "01" of the I channel (CH1) is different from that of the I channel (CH2), the I channel waveform forming unit 1522 relating to the channel CH1 decreases the amplitude of the I channel baseband signal. Since a second half "01" of the I channel (CH1) is identical to that of the I channel (CH2), the I channel waveform forming unit 1522 relating to the channel CH1 increases the amplitude of the I channel baseband signal.

FIG. 28 illustrates a relationship between concrete control signals in this case and the I channel baseband signal. In FIG. 28, the abscissa axis is a time axis, and the ordinate axis of the I channel baseband signal indicates "IOUTP-IOUTN". In FIG. 28, for the purpose of simplicity, the signal ICCB that is the inverted signal of the signal ICC is omitted. In addition, in FIG. 28, a resolution at a time when the IAC is "SMALL" is indicated by Vmin, a resolution at a time when the IAC is "LARGE" is indicated by Vminl, and the range of the baseband signal is indicated by Vmax.

As illustrated in FIG. 28, the first half "01" of the I channel (CH1) is generated during time instant t10 to time instant t26. The second half "01" of the I channel (CH1) is generated during time instant t27 to time instant t42.

The I channel controller (CH1) 15225 generates respective control signals, based on a clock (e.g. 12.8 GHz). As illustrated in FIG. 28, signals ICC[0] to [7] are signals obtained by dividing the clock by 8. Although not illustrated, signals ICCB[0] to [7], which are inverted signals of the signals ICC[0] to [7], are also signals which are obtained by dividing the clock by 8.

In this manner, when each of the digital-to-analog converter 261 and digital-to-analog converter 262 includes the eight drivers, a baseband signal corresponding to one data can be generated in every 8 cycles of the clock. Specifically, when each of the digital-to-analog converter 261 and digital-to-analog converter 262 includes a k-number of drivers (k is an integer), a baseband signal corresponding to one data can be generated in every k cycles of the clock.

Hereinafter, the operations of the digital-to-analog converter 261 and digital-to-analog converter 262 at time instant t10 to time instant t27 in FIG. 28 will be described more concretely.

To begin with, at time instant t10 to time instant t19, the I channel waveform forming unit generates an I channel baseband signal in the case of data which is different from data of the neighboring channel and is "0" data.

[Time Instant t10 to Time Instant t11]

At time instant t10 to time instant t11, the signal IAC is "SMALL", signals ICC[0] to ICC[3], and ICCB[4] to ICCB[7] are "L" level, and signals ICC[4] to ICC[7], and ICCB[0] to ICCB[3] are "H" level (L<H).

Figure 29:
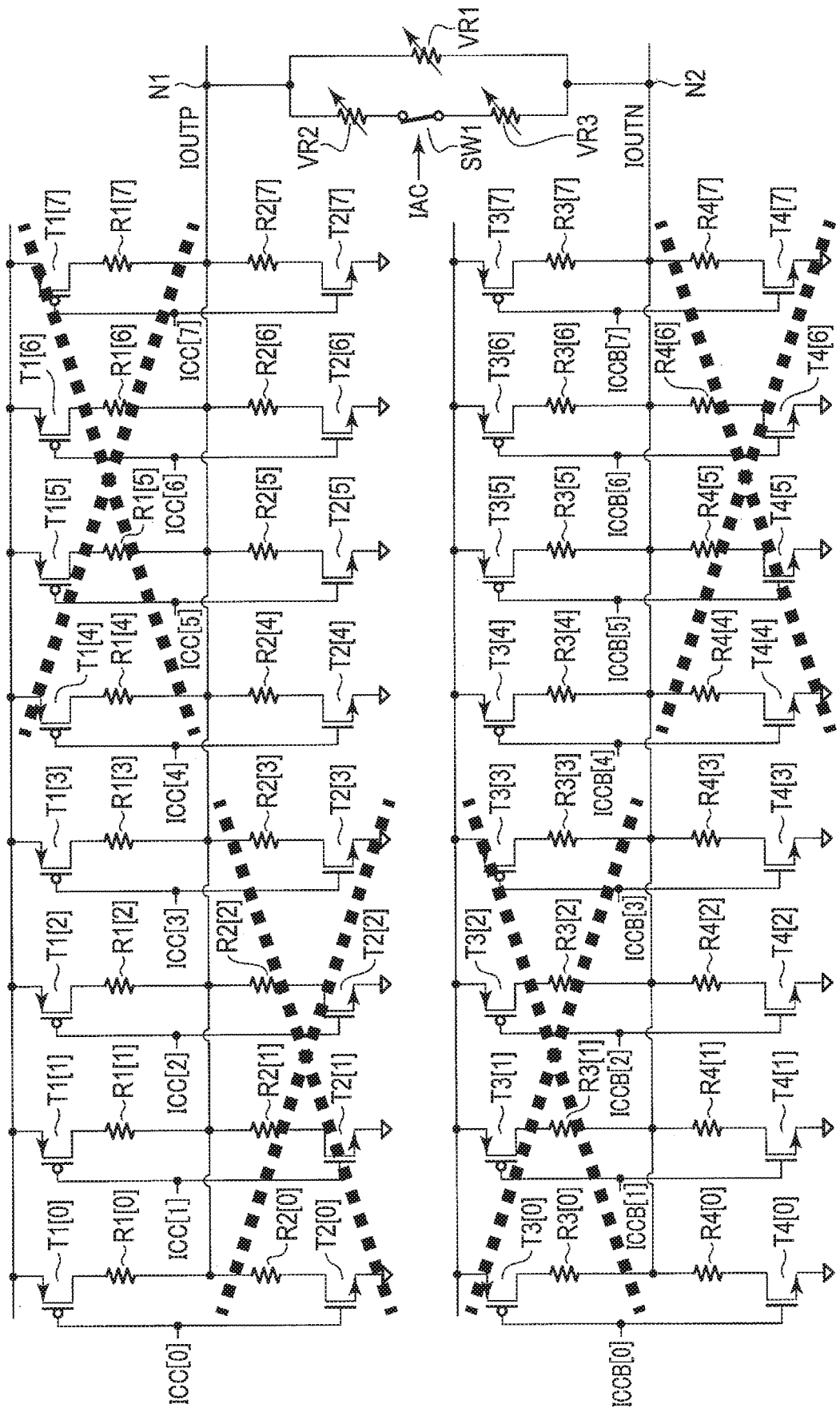
FIG. 29 is a circuit diagram illustrating an operation of the waveform generator of the I channel waveform forming unit.

Thereby, as illustrated in FIG. 29, the transistors T1[0] to T1[3], T2[4] to T2[7], T3[4] to T3[7], T4[0] to T4[3] and switch SW1 enter the ON state, and the transistors T1[4] to T1[7], T2[0] to T2[3], T3[0] to T3[3], and T4[4] to T4[7] enter the OFF state. In this manner, in the digital-to-analog converter 261, the number of charge transistors in the ON state is four, and the number of discharge transistors in the ON state is four. In addition, in the digital-to-analog converter 262, the number of charge transistors in the ON state is four, and the number of discharge transistors in the ON state is four. Thus, since IOUTP and IOUTN are equal, the baseband signal takes a reference value.

[Time Instant t11 to Time Instant t12]

As illustrated in FIG. 28, at time instant t11 to time instant t12, the signal ICC[0] rises to "H" level and ICCB[0] lowers to "L" level.

Figure 30:
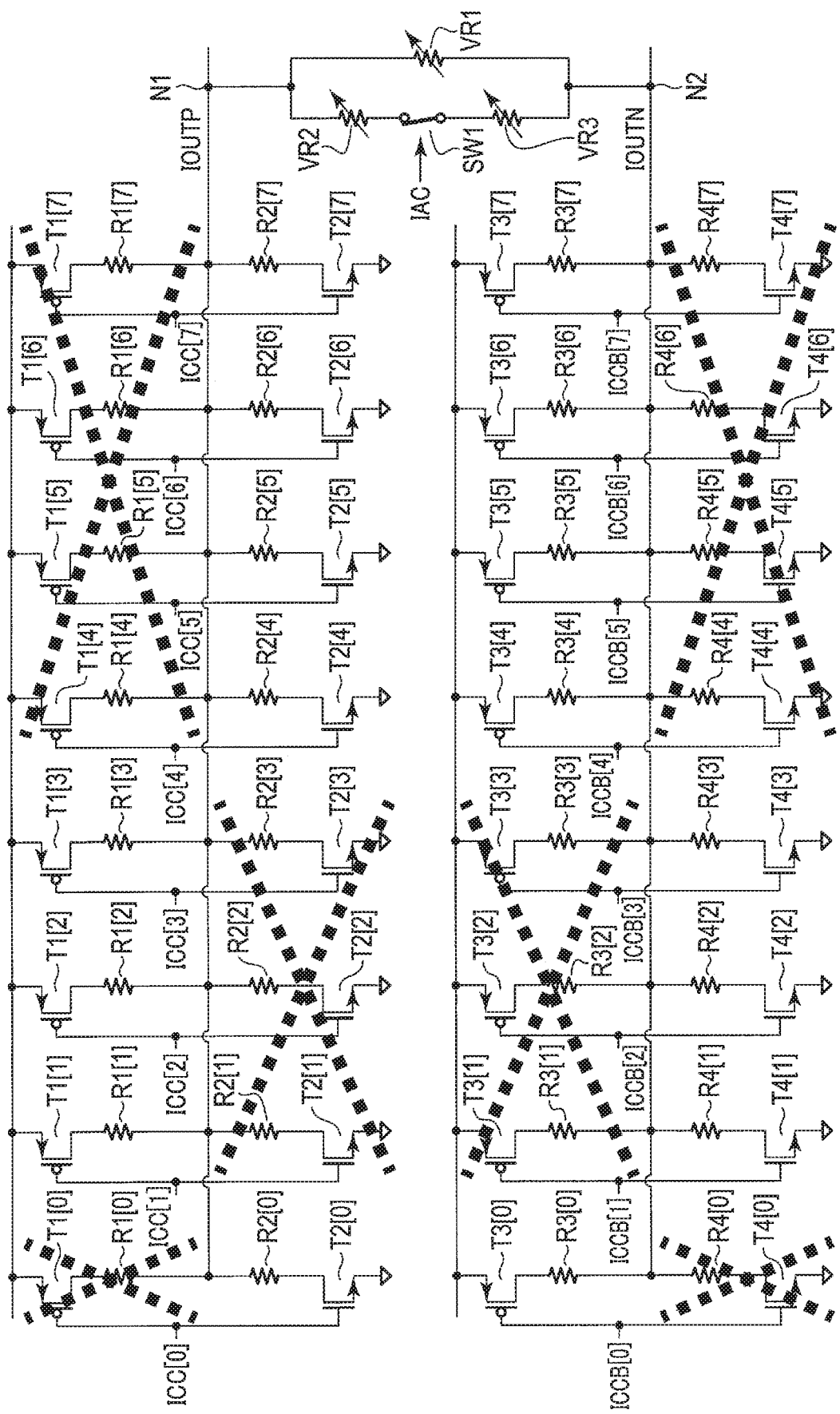
FIG. 30 is a circuit diagram illustrating the operation of the waveform generator of the I channel waveform forming unit.

Thereby, as illustrated in FIG. 30, the transistors T1[1] to T1[3], T2[0], T2[4] to T2[7], T3[0], T3[4] to T3[7], T4[1] to T4[3] and switch SW1 enter the ON state, and the transistors T1[0], T1[4] to T1[7], T2[1] to T2[3], T3[1] to T3[3], T4[0], and T4[4] to T4[7] enter the OFF state. In this manner, in the digital-to-analog converter 261, the number of charge transistors in the ON state is three, and the number of discharge transistors in the ON state is five. In addition, in the digital-to-analog converter 262, the number of charge transistors in the ON state is five, and the number of discharge transistors in the ON state is three. Thus, IOUTN becomes greater than IOUTP. Thereby, the baseband signal decreases by Vmin.

[Time Instant t12 to Time Instant t13]

As illustrated in FIG. 28, at time instant t12 to time instant t13, the signal ICC[1] rises to "H" level and ICCB[1] lowers to "L" level.

Figure 31:
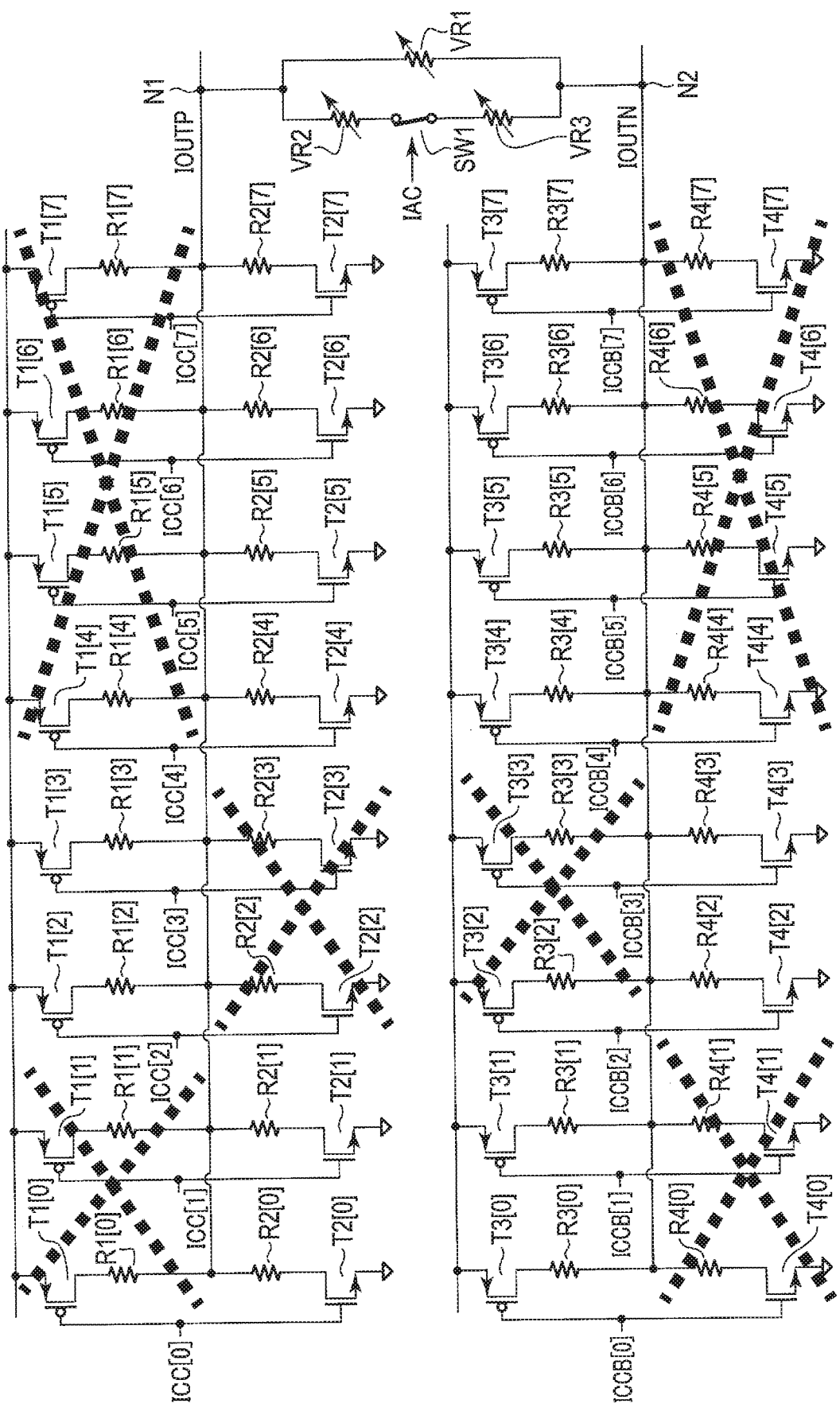
FIG. 31 is a circuit diagram illustrating the operation of the waveform generator of the I channel waveform forming unit.

Thereby, as illustrated in FIG. 31, the transistors T1[2], T1[3], T2[0], T2[1], T2[4] to T2[7], T3[0], T3[1], T3[4] to T3[7], T4[2], T4[3] and switch SW1 enter the ON state, and the transistors T1[0], T1[1], T1[4] to T1[7], T2[2], T2[3], T3[2], T3[3], T4[0], T4[1], and T4[4] to T4[7] enter the OFF state. In this manner, in the digital-to-analog converter 261, the number of charge transistors in the ON state is two, and the number of discharge transistors in the ON state is six. In addition, in the digital-to-analog converter 262, the number of charge transistors in the ON state is six, and the number of discharge transistors in the ON state is two. Thus, compared to time instant t11 to time instant t12, IOUTN becomes further greater than IOUTP. Thereby, the baseband signal further decreases by Vmin.

[Time Instant t13 to Time Instant t14]

As illustrated in FIG. 28, at time instant t13 to time instant t14, the signal ICC[2] rises to "H" level and ICCB[2] lowers to "L" level.

Figure 32:
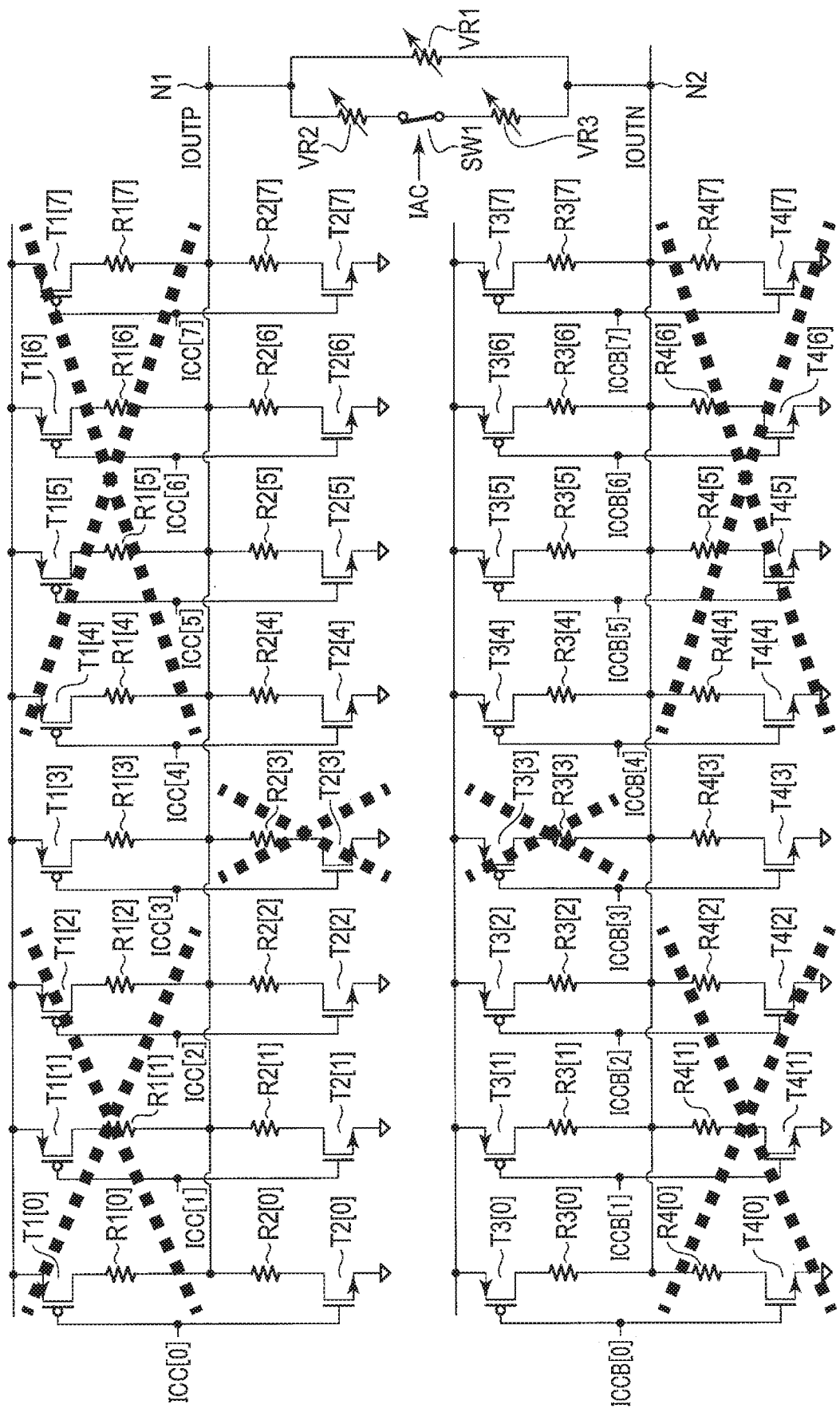
FIG. 32 is a circuit diagram illustrating the operation of the waveform generator of the I channel waveform forming unit.

Thereby, as illustrated in FIG. 32, the transistors T1[3], T2[0] to T2[2], T2[4] to T2[7], T3[0] to T3[2], T3[4] to T3[7], T4[3] and switch SW1 enter the ON state, and the transistors T1[0] to T1[2], T1[4] to T1[7], T2[3], T3[3], T4[0] to T4[2], and T4[4] to T4[7] enter the OFF state. In this manner, in the digital-to-analog converter 261, the number of charge transistors in the ON state is one, and the number of discharge transistors in the ON state is seven. In addition, in the digital-to-analog converter 262, the number of charge transistors in the ON state is seven, and the number of discharge transistors in the ON state is one. Thus, compared to time instant t12 to time instant t13, IOUTN becomes further greater than IOUTP. Thereby, the baseband signal further decreases by Vmin.

[Time Instant t14 to Time Instant t15]

As illustrated in FIG. 28, at time instant t14 to time instant t15, the signal ICC[3] rises to "H" level and ICCB[3] lowers to "L" level.

Figure 33:
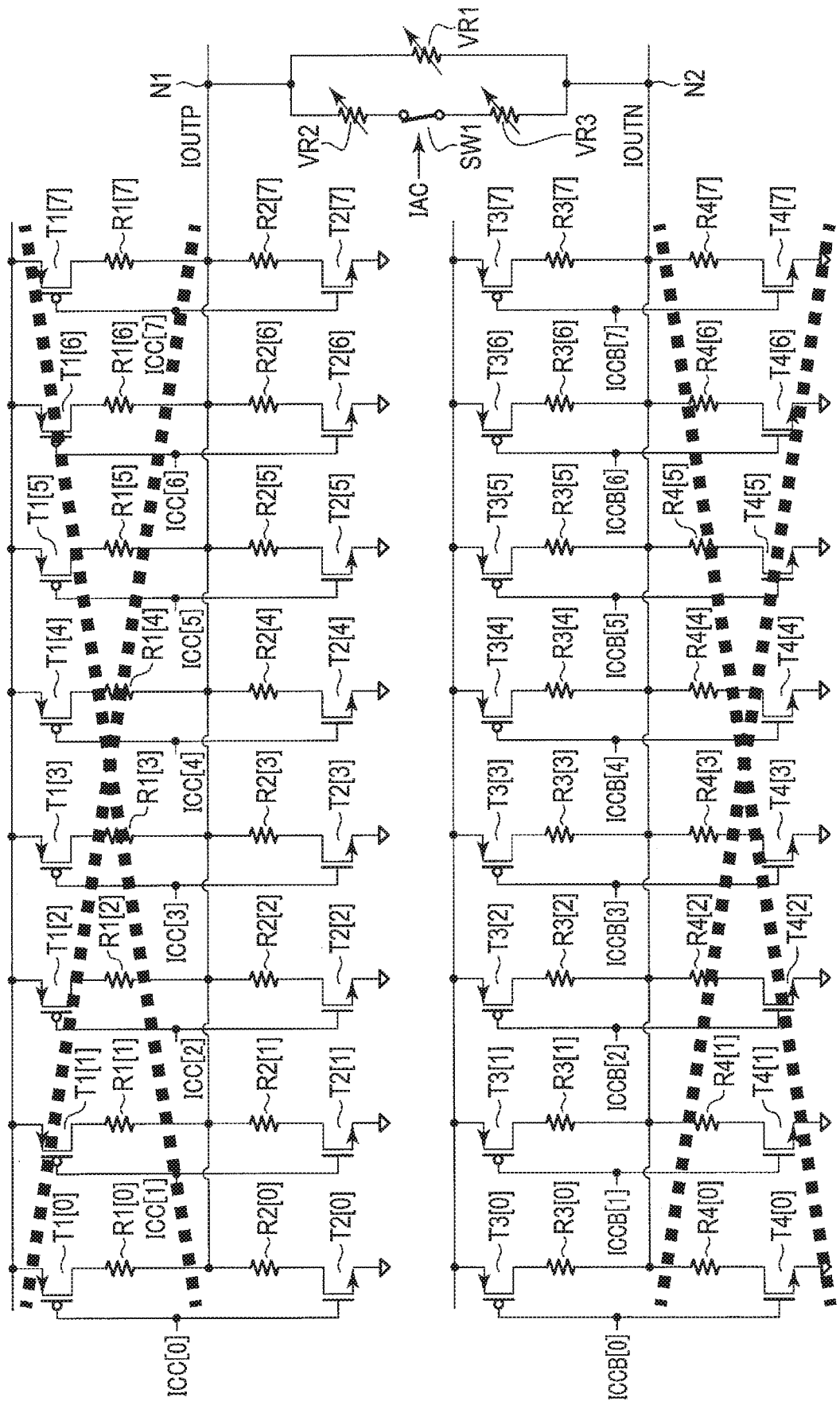
FIG. 33 is a circuit diagram illustrating the operation of the waveform generator of the I channel waveform forming unit.

Thereby, as illustrated in FIG. 33, the transistors T2[0] to T2[7], T3[0] to T3[7], and switch SW1 enter the ON state, and the transistors T1[0] to T1[7], and T4[0] to T4[7] enter the OFF state. In this manner, in the digital-to-analog converter 261, the number of charge transistors in the ON state is zero, and the number of discharge transistors in the ON state is eight. In addition, in the digital-to-analog converter 262, the number of charge transistors in the ON state is eight, and the number of discharge transistors in the ON state is zero. Thus, compared to time instant t13 to time instant t14, IOUTN becomes further greater than IOUTP. Thereby, the baseband signal further decreases by Vmin.

[Time Instant t15 to Time Instant t16]

As illustrated in FIG. 28, at time instant t15 to time instant t16, the signal ICC[4] lowers to "L" level, and ICCB[4] rises to "H" level.

Figure 34:
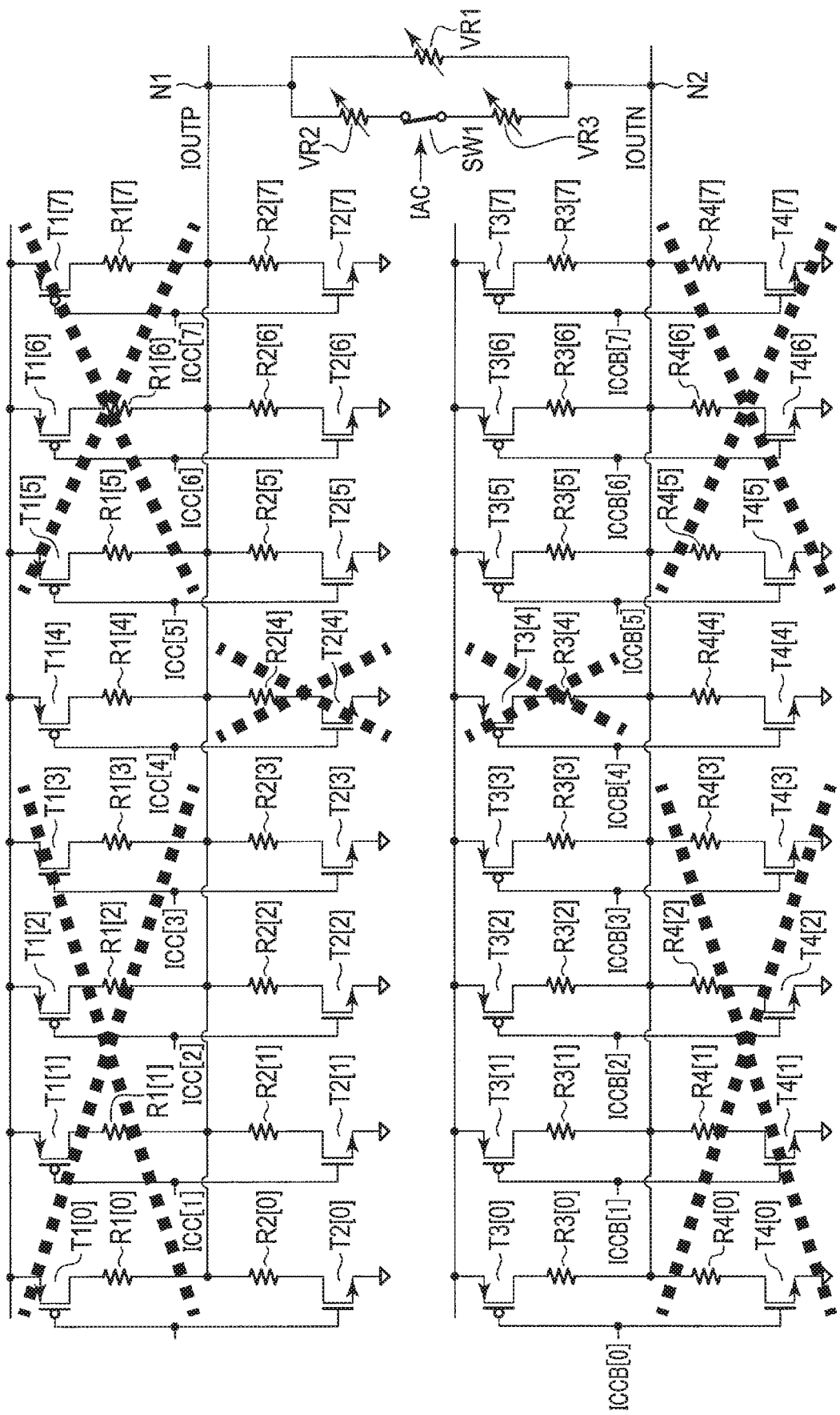
FIG. 34 is a circuit diagram illustrating the operation of the waveform generator of the I channel waveform forming unit.

Thereby, as illustrated in FIG. 34, the transistors T1[4], T2[0] to T2[3], T2[5] to T2[7], T3[0] to T3[3], T3[5] to T3[7], T4[4] and switch SW1 enter the ON state, and the transistors T1[0] to T1[3], T1[5] to T1[7], T2[4], T3[4], T4[0] to T4[3], and T4[5] to T4[7] enter the OFF state. In this manner, in the digital-to-analog converter 261, the number of charge transistors in the ON state is one, and the number of discharge transistors in the ON state is seven. In addition, in the digital-to-analog converter 262, the number of charge transistors in the ON state is seven, and the number of discharge transistors in the ON state is one. Thus, compared to time instant t14 to time instant t15, the difference between IOUTP and IOUTN becomes smaller. Thereby, the baseband signal increases by Vmin.

[Time Instant t16 to Time Instant t17]

As illustrated in FIG. 28, at time instant t16 to time instant t17, the signal ICC[5] lowers to "L" level, and ICCB[5] rises to "H" level.

Thereby, as illustrated in FIG. 35, the transistors T1[4], T1[5], T2[0] to T2[3], T2[6], T2[7], T3[0] to T3[3], T3[6], T3[7], T4[4], T4[5] and switch SW1 enter the ON state, and the transistors T1[0] to T1[3], T1[6], T1[7], T2[4], T2[5], T3[4], T3[5], T4[0] to T4[3], T4[6] and T4[7] enter the OFF state. In this manner, in the digital-to-analog converter 261, the number of charge transistors in the ON state is two, and the number of discharge transistors in the ON state is six. In addition, in the digital-to-analog converter 262, the number of charge transistors in the ON state is six, and the number of discharge transistors in the ON state is two. Thus, compared to time instant t15 to time instant t16, the difference between IOUTP and IOUTN becomes further smaller. Thereby, the baseband signal increases by Vmin.

[Time Instant t17 to Time Instant t18]

As illustrated in FIG. 28, at time instant t17 to time instant t18, the signal ICC[6] lowers to "L" level, and ICCB[6] rises to "H" level.

Thereby, as illustrated in FIG. 36, the transistors T1[4] to T1[6], T2[0] to T2[3], T2[7], T3[0] to T3[3], T3[7], T4[4] to T4[6], and switch SW1 enter the ON state, and the transistors T1[0] to T1[3], T1[7], T2[4] to T2[6], T3[4] to T3[6], T4[0] to T4[3], and T4[7] enter the OFF state. In this manner, in the digital-to-analog converter 261, the number of charge transistors in the ON state is three, and the number of discharge transistors in the ON state is five. In addition, in the digital-to-analog converter 262, the number of charge transistors in the ON state is five, and the number of discharge transistors in the ON state is three. Thus, compared to time instant t16 to time instant t17, the difference between IOUTP and IOUTN becomes further smaller. Thereby, the baseband signal increases by Vmin.

[Time Instant t18 to Time Instant t19]

As illustrated in FIG. 28, at time instant t18 to time instant t19, the signal ICC[7] lowers to "L" level, and ICCB[7] rises to "H" level.

Figure 37:
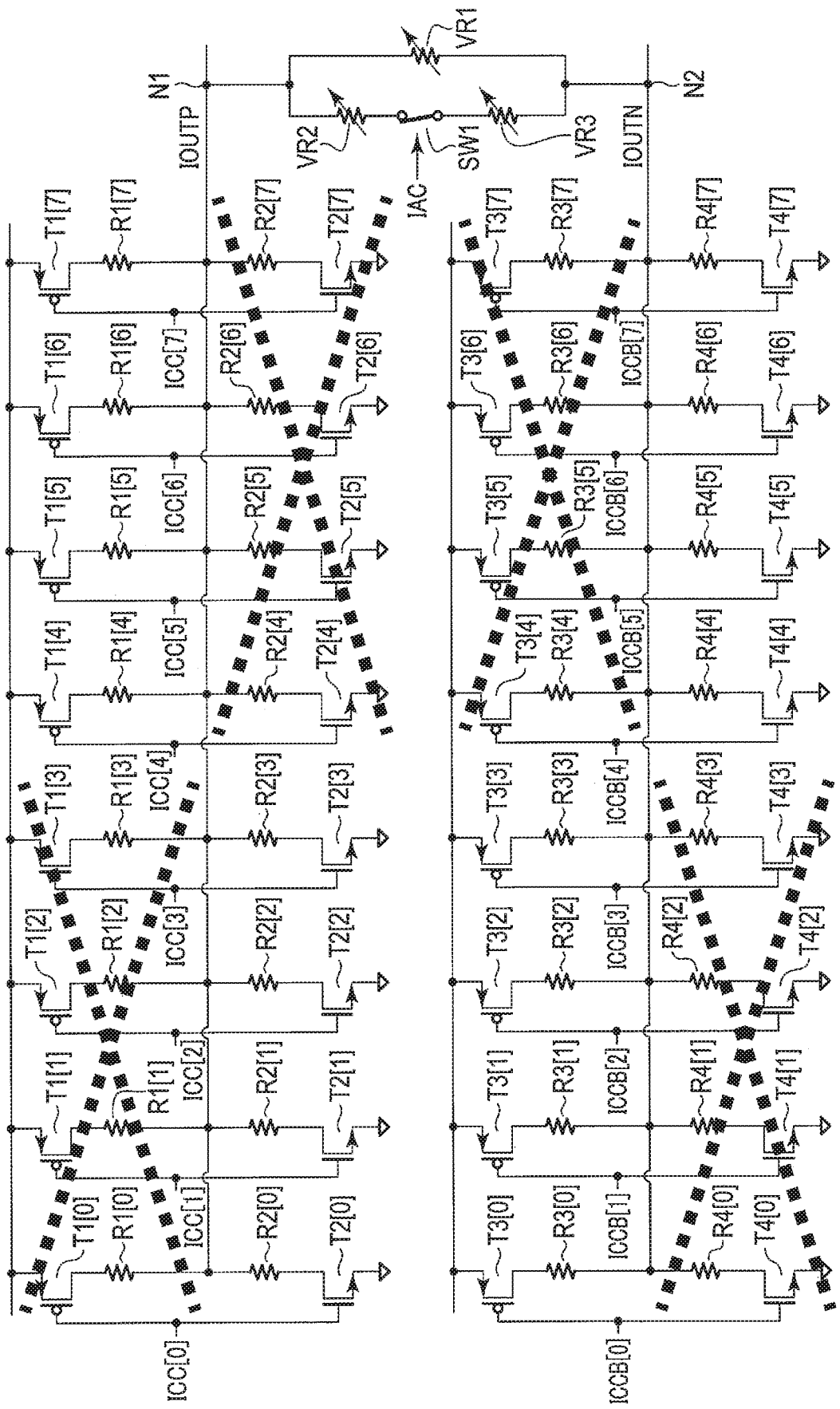
FIG. 37 is a circuit diagram illustrating the operation of the waveform generator of the I channel waveform forming unit.

Thereby, as illustrated in FIG. 37, the transistors T1[4] to T1[7], T2[0] to T2[3], T3[0] to T3[3], T4[4] to T4[7], and switch SW1 enter the ON state, and the transistors T1[0] to T1[3], T2[4] to T2[7], T3[4] to T3[7], and T4[0] to T4[3] enter the OFF state. In this manner, in the digital-to-analog converter 261, the number of charge transistors in the ON state is four, and the number of discharge transistors in the ON state is four. In addition, in the digital-to-analog converter 262, the number of charge transistors in the ON state is four, and the number of discharge transistors in the ON state is four. Thus, since IOUTP and IOUTN are equal, the baseband signal takes the reference value.

The I channel waveform forming unit operates as described above at time instant t10 to time instant t19. Thereby, the I channel baseband signal in the case of the data, which is different from data of the neighboring channel and is "0" data, is generated. In the meantime, when the I channel baseband signal in the case of the data, which is identical to the data of the neighboring channel and is "0" data, is generated, the signal IAC is set to "LARGE", and the switch SW1 is set in the OFF state.

Subsequently, at time instant t19 to time instant t27, the I channel waveform forming unit generates an I channel baseband signal in the case of data which is different from data of the neighboring channel and is "1" data.

[Time Instant t19 to Time Instant t20]

As illustrated in FIG. 28, at time instant t19 to time instant t20, the signal ICC[0] lowers to "L" level and ICCB[0] rises to "H" level.

Figure 38:
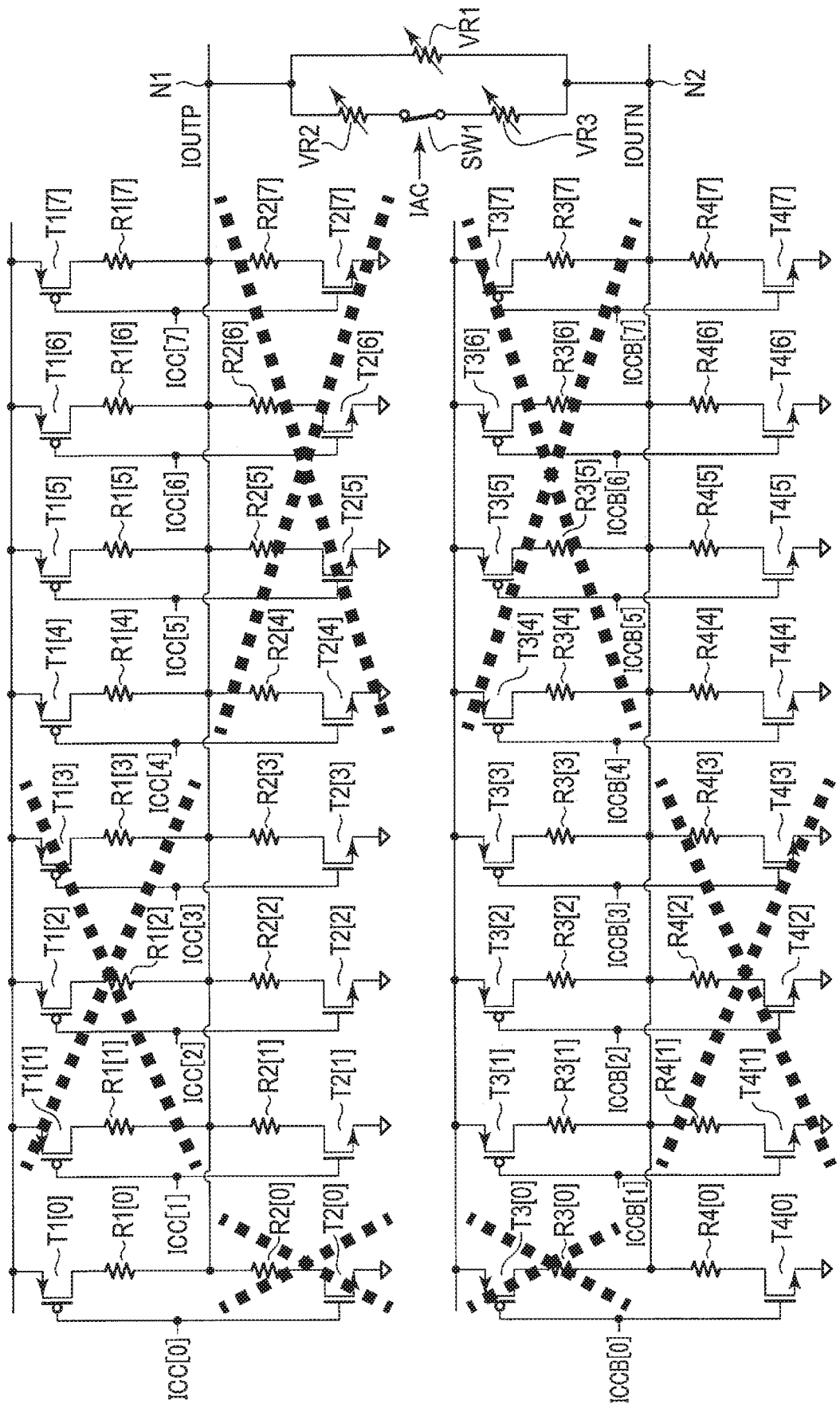
FIG. 38 is a circuit diagram illustrating the operation of the waveform generator of the I channel waveform forming unit.

Thereby, as illustrated in FIG. 38, the transistors T1[0], T1[4] to T1[7], T2[1] to T2[3], T3[1] to T3[3], T4[0], T4[4] to T4[7] and switch SW1 enter the ON state, and the transistors T1[1] to T1[3], T2[0], T2[4] to T2[7], T3[0], T3[4] to T3[7], T4[1] to T4[3] enter the OFF state. In this manner, in the digital-to-analog converter 261, the number of charge transistors in the ON state is five, and the number of discharge transistors in the ON state is three. In addition, in the digital-to-analog converter 262, the number of charge transistors in the ON state is three, and the number of discharge transistors in the ON state is five. Thus, IOUTP becomes greater than IOUTN. Thereby, the baseband signal increases by Vmin.

[Time Instant t20 to Time Instant t21]

As illustrated in FIG. 28, at time instant t20 to time instant t21, the signal ICC[1] lowers to "L" level and ICCB[1] rises to "H" level.

Figure 39:
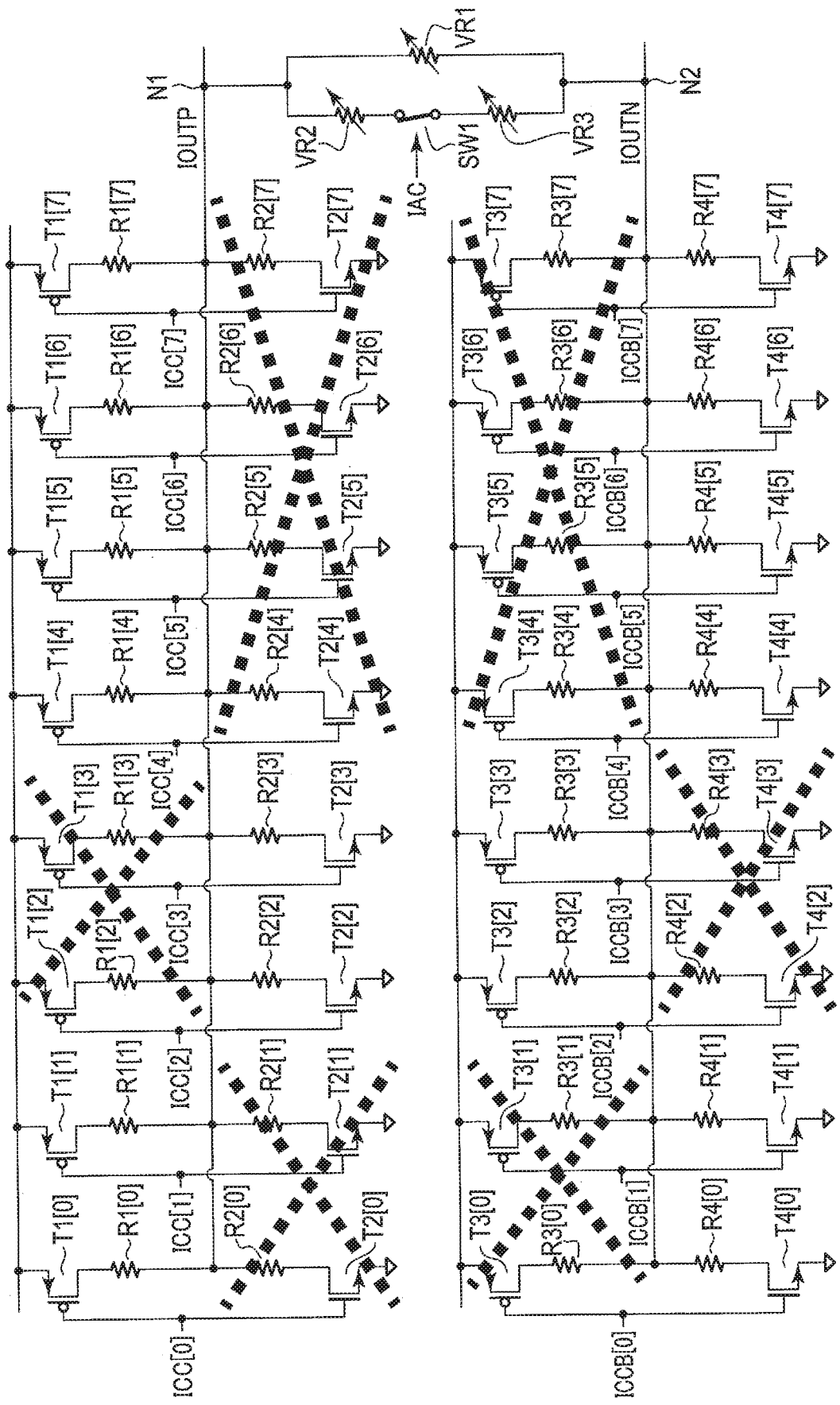
FIG. 39 is a circuit diagram illustrating the operation of the waveform generator of the I channel waveform forming unit.

Thereby, as illustrated in FIG. 39, the transistors T1[0], T1[1], T1[4] to T1[7], T2[2], T2[3], T3[2], T3[3], T4[0], T4[1], T4[4] to T4[7], and switch SW1 enter the ON state, and the transistors T1[2], T1[3], T2[0], T2[1], T2[4] to T2[7], T3[0], T3[1], T3[4] to T3[7], T4[2], T4[3] enter the OFF state. In this manner, in the digital-to-analog converter 261, the number of charge transistors in the ON state is six, and the number of discharge transistors in the ON state is two. In addition, in the digital-to-analog converter 262, the number of charge transistors in the ON state is two, and the number of discharge transistors in the ON state is six. Thus, compared to time instant t19 to time instant t20, IOUTP becomes further greater than IOUTN. Thereby, the baseband signal further increases by Vmin.

[Time Instant t21 to Time Instant t22]

As illustrated in FIG. 28, at time instant t21 to time instant t22, the signal ICC[2] lowers to "L" level and ICCB[2] rises to "H" level.

Figure 40:
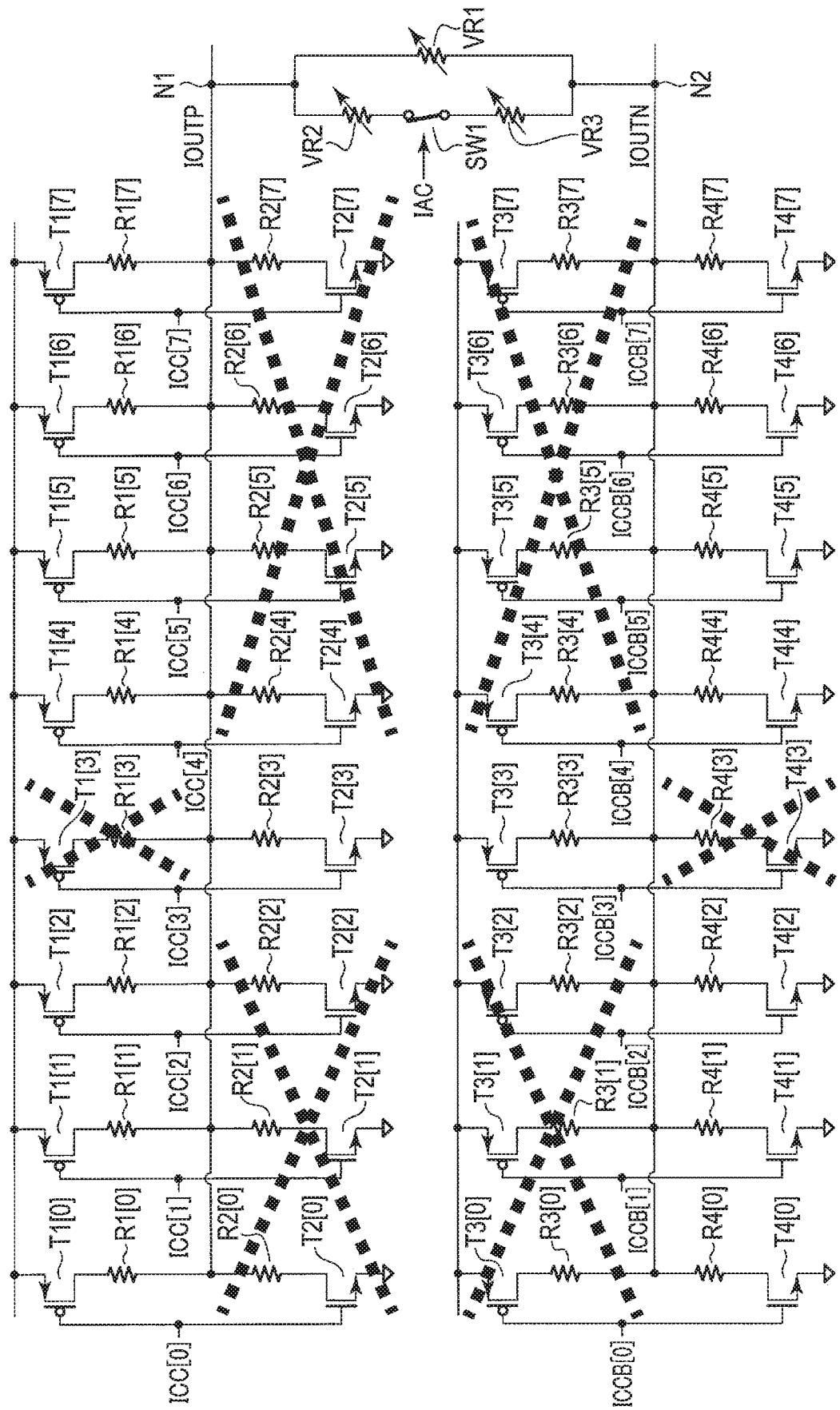
FIG. 40 is a circuit diagram illustrating the operation of the waveform generator of the I channel waveform forming unit.

Thereby, as illustrated in FIG. 40, the transistors T1[0] to T1[2], T1[4] to T1[7], T2[3], T3[3], T4[0] to T4[2], T4[4] to T4[7], and switch SW1 enter the ON state, and the transistors T1[3], T2[0] to T2[2], T2[4] to T2[7], T3[0] to T3[2], T3[4] to T3[7], and T4[3] enter the OFF state. In this manner, in the digital-to-analog converter 261, the number of charge transistors in the ON state is seven, and the number of discharge transistors in the ON state is one. In addition, in the digital-to-analog converter 262, the number of charge transistors in the ON state is one, and the number of discharge transistors in the ON state is seven. Thus, compared to time instant t20 to time instant t21, IOUTP becomes further greater than IOUTN. Thereby, the baseband signal further increases by Vmin.

[Time Instant t22 to Time Instant t23]

As illustrated in FIG. 28, at time instant t22 to time instant t23, the signal ICC[3] lowers to "L" level and ICCB[3] rises to "H" level.

Thereby, as illustrated in FIG. 41, the transistors T1[0] to T1[7], T4[0] to T4[7], and switch SW1 enter the ON state, and the transistors T2[0] to T2[7], and T3[0] to T3[7] enter the OFF state. In this manner, in the digital-to-analog converter 261, the number of charge transistors in the ON state is eight, and the number of discharge transistors in the ON state is zero. In addition, in the digital-to-analog converter 262, the number of charge transistors in the ON state is zero, and the number of discharge transistors in the ON state is eight. Thus, compared to time instant t21 to time instant t22, IOUTP becomes further greater than IOUTN. Thereby, the baseband signal further increases by Vmin.

[Time Instant t23 to Time Instant t24]

As illustrated in FIG. 28, at time instant t23 to time instant t24, the signal ICC[4] rises to "H" level, and ICCB[4] lowers to "L" level.

Figure 42:
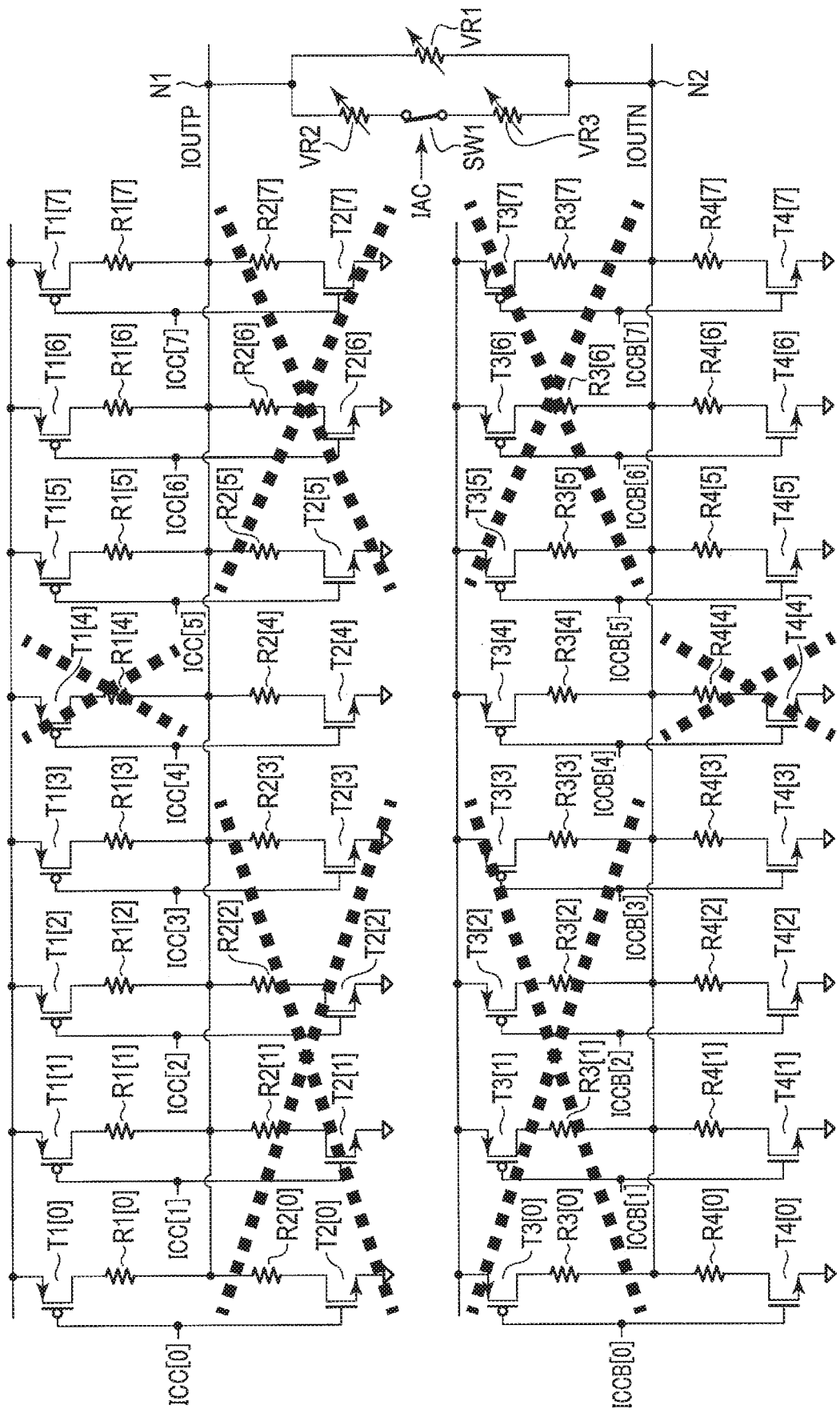
FIG. 42 is a circuit diagram illustrating the operation of the waveform generator of the I channel waveform forming unit.

Thereby, as illustrated in FIG. 42, the transistors T1[0] to T1[3], T1[5] to T1[7], T2[4], T3[4], T4[0] to T4[3], T4[5] to T4[7], and switch SW1 enter the ON state, and the transistors T1[4], T2[0] to T2[3], T2[5] to T2[7], T3[0] to T3[3], T3[5] to T3[7], and T4[4] enter the OFF state. In this manner, in the digital-to-analog converter 261, the number of charge transistors in the ON state is seven, and the number of discharge transistors in the ON state is one. In addition, in the digital-to-analog converter 262, the number of charge transistors in the ON state is one, and the number of discharge transistors in the ON state is seven. Thus, compared to time instant t22 to time instant t23, the difference between IOUTN and IOUTP becomes smaller. Thereby, the baseband signal decreases by Vmin.

[Time Instant t24 to Time Instant t25]

As illustrated in FIG. 28, at time instant t24 to time instant t25, the signal ICC[5] rises to "H" level, and ICCB[5] lowers to "L" level.

Thereby, as illustrated in FIG. 43, the transistors T1[0] to T1[3], T1[6], T1[7], T2[4], T2[5], T3[4], T3[5], T4[0] to T4[3], T4[6], T4[7], and switch SW1 enter the ON state, and the transistors T1[4], T1[5], T2[0] to T2[3], T2[6], T2[7], T3[0] to T3[3], T3[6], T3[7], T4[4] and T4[5] enter the OFF state. In this manner, in the digital-to-analog converter 261, the number of charge transistors in the ON state is six, and the number of discharge transistors in the ON state is two.

In addition, in the digital-to-analog converter 262, the number of charge transistors in the ON state is two, and the number of discharge transistors in the ON state is six. Thus, compared to time instant t23 to time instant t24, the difference between IOUTN and IOUTP becomes further smaller. Thereby, the baseband signal decreases by Vmin.

[Time Instant t25 to Time Instant t26]

As illustrated in FIG. 28, at time instant t25 to time instant t26, the signal ICC[6] rises to "H" level, and ICCB[6] lowers to "L" level.

Figure 44:
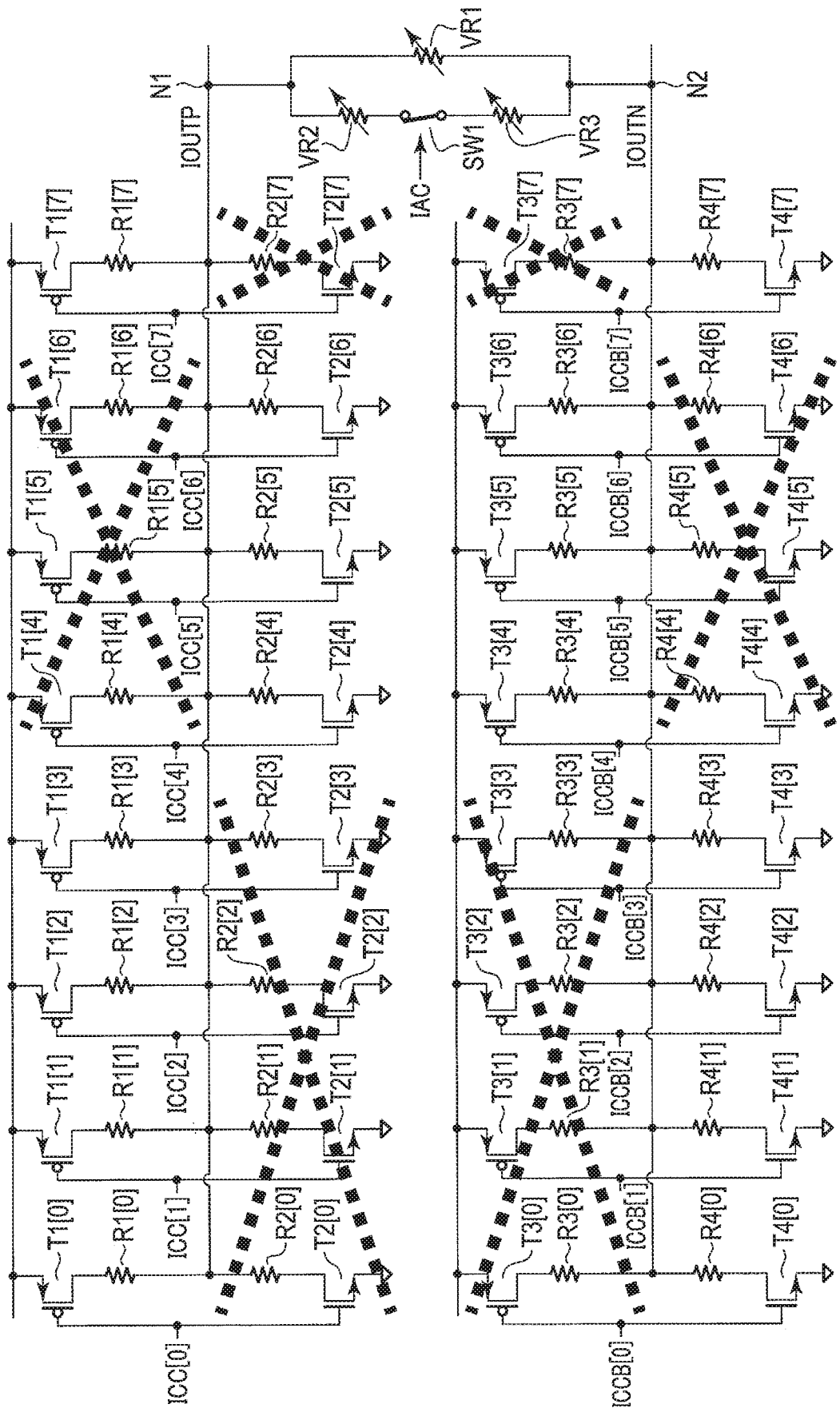
FIG. 44 is a circuit diagram illustrating the operation of the waveform generator of the I channel waveform forming unit.

Thereby, as illustrated in FIG. 44, the transistors T1[0] to T1[3], T1[7], T2[4] to T2[6], T3[4] to T3[6], T4[0] to T4[3], T4[7], and switch SW1 enter the ON state, and the transistors T1[4] to T1[6], T2[0] to T2[3], T2[7], T3[0] to T3[3], T3[7], and T4[4] to T4[6] enter the OFF state. In this manner, in the digital-to-analog converter 261, the number of charge transistors in the ON state is five, and the number of discharge transistors in the ON state is three. In addition, in the digital-to-analog converter 262, the number of charge transistors in the ON state is three, and the number of discharge transistors in the ON state is five. Thus, compared to time instant t24 to time instant t25, the difference between IOUTN and IOUTP becomes further smaller. Thereby, the baseband signal decreases by Vmin.

[Time Instant t26 to Time Instant t27]

As illustrated in FIG. 28, at time instant t26 to time instant t27, the signal ICC[7] rises to "H" level, and ICCB[7] lowers to "L" level.

Thereby, as illustrated in FIG. 29, the transistors T1[0] to T1[3], T2[4] to T2[7], T3[4] to T3[7], T4[0] to T4[3] and switch SW1 enter the ON state, and the transistors T1[4] to T1[7], T2[0] to T2[3], T3[0] to T3[3], and T4[4] to T4[7] enter the OFF state. In this manner, in the digital-to-analog converter 261, the number of charge transistors in the ON state is four, and the number of discharge transistors in the ON state is four. In addition, in the digital-to-analog converter 262, the number of charge transistors in the ON state is four, and the number of discharge transistors in the ON state is four. Thus, since IOUTP and IOUTN are equal, the baseband signal takes the reference value.

The I channel waveform forming unit operates as described above at time instant t19 to time instant t27. Thereby, the I channel baseband signal in the case of the data, which is different from data of the neighboring channel and is "1" data, is generated. In the meantime, when the I channel baseband signal in the case of the data, which is identical to the data of the neighboring channel and is "1" data, is generated, the signal IAC is set to "LARGE", and the switch SW1 is set in the OFF state.

Although the operation of the I channel waveform forming unit was described here, the same applies to the operation of the Q channel waveform forming unit, so a description of the operation of the Q channel waveform forming unit is omitted.

<2-3> Advantageous Effects

According to the above-described embodiment, the I channel waveform forming unit and Q channel waveform forming unit convert digital data to analog waveforms (baseband signals), based on the control signals obtained by dividing the clock. Thereby, the baseband signal can properly be generated.

Here, in order to describe the advantageous effects of the present embodiment, a comparative example will be described.

In the comparative example of the present embodiment, the digital-to-analog converter operates in synchronism with the clock. Specifically, the control signals which control the digital-to-analog converter are also synchronized with the clock. Thus, the digital-to-analog converter operates at high speed. In addition, the circuit configuration of this digital-to-analog converter becomes complex.

However, the digital-to-analog converter according to the present embodiment operates, based on the control signals obtained by dividing the clock. Thus, compared to the comparative example, the digital-to-analog converter according to this embodiment may operate at low speed. As a result, the digital-to-analog converter of the present embodiment can properly generate a baseband signal, although this digital-to-analog converter does not have a complex circuit configuration.

<3> Third Embodiment

A third embodiment will be described. In a third embodiment, a bridge which limits a transmission band will be described. Incidentally, the basic configuration and basic operation of the apparatus according to the third embodiment are the same as those of the apparatus according to each of the above-described embodiments. Thus, a description is omitted of matters described in each of the above-described embodiments and matters which are easily guessable from each of the above-described embodiments.

<3-1> Configuration

<3-1-1> NAND Package Configuration

Referring to FIG. 45, a NAND package 20 according to the third embodiment will be described. FIG. 45 is a view illustrating a relationship between the memory sets of the NAND package 20 according to the third embodiment, and sub-channels.

In the memory sets 200 of the NAND package 20 according to the third embodiment, channels are set in accordance with the distance from the controller 10.

Specifically, channels of sub-channels with higher frequencies are allocated to the memory sets 200 in the order beginning with the memory set 200 closer to the controller 10. Concretely, channels CHs to CH1 are allocated in this order to the memory sets 200-1 to 200-s.

In addition, each memory set 200 is configured not to relay a sub-channel SC, which has a higher frequency that the sub-channel SC relating to the channel allocated to the memory set 200 itself, to a subsequent memory set 200. For example, this is realized by adjusting the band width by the amplifier 211 of the bridge 210.

<3-1-2> Amplifier

Next, referring to FIG. 46, the amplifier 211 according to the third embodiment will be described. FIG. 46 is a circuit diagram illustrating the amplifier 211 according to the third embodiment.

As illustrated in FIG. 46, the amplifier 211 includes NMOS transistors 2111, 2117, 2122 and 2123, PMOS transistors 2112, 2115, 2124 and 2127, resistors 2113 and 2125, variable resistors 2116, 2128 and 2119, capacitances 2114 and 2126, a variable capacitance 2118, and variable current sources 2120, 2121, 2129 and 2130.

The NMOS transistor 2111 has a first end (drain) connected to a node N10, and has a second end (source) connected to a node N11. First data is input to the gate of the NMOS transistor 2111 from the controller 10 or an immediately preceding memory set 200.

The NMOS transistor 2117 has a first end (drain) connected to a node N13, has a second end (source) connected to a node N14, and has a gate connected to the node N10.

The PMOS transistor 2112 has a first end (source) connected to a node N12, and has a second end (drain) connected to the node N10. A ground potential is input to the gate of the PMOS transistor 2112.

The PMOS transistor 2115 has a first end (source) connected to the node N12, has a second end (drain) connected to the node N13, and has a gate connected to a node N15.

The resistor 2113 has a first end grounded, and has a second end connected to the node N15.

The capacitance 2114 has a first electrode connected to the node N10, and has a second electrode connected to the node N15.

The variable resistor 2116 has a first end connected to the node N10, and has a second end connected to the node N13.

The variable current source 2120 has a first end connected to the node N11, and has a second end grounded.

The variable current source 2121 has a first end connected to the node N14, and has a second end grounded.

The NMOS transistor 2123 has a first end (drain) connected to a node N18, and has a second end (source) connected to a node N16. Second data (a differential signal relative to the first data) is input to the gate of the NMOS transistor 2123 from the controller 10 or an immediately preceding memory set 200.

The NMOS transistor 2122 has a first end (drain) connected to a node N17, has a second end (source) connected to the node N14, and has a gate connected to the node N18.

The PMOS transistor 2127 has a first end (source) connected to the node N12, and has a second end (drain) connected to the node N18. A ground voltage is input to the gate of the PMOS transistor 2127.

The PMOS transistor 2124 has a first end (source) connected to the node N12, has a second end (drain) connected to the node N17, and has a gate connected to a node N19.

The resistor 2125 has a first end grounded, and has a second end connected to the node N19.

The capacitance 2126 has a first electrode connected to the node N18, and has a second electrode connected to the node N19.

The variable resistor 2128 has a first end connected to the node N17, and has a second end connected to the node N18.

The variable current source 2130 has a first end connected to the node N16, and has a second end grounded.

The variable current source 2129 has a first end connected to the node N14, and has a second end grounded.

The variable capacitance 2118 has a first electrode connected to the node N11, and a second electrode connected to the node N16.

The variable resistor 2119 has a first end connected to the node N11, and a second end connected to the node N16.

For example, a power supply voltage is supplied to the node N12.

The variable current sources 2120, 2121, 2129 and 2130 adjust the current amount in the amplifier 211 and control the band width.

Thus, third data, in which the band width of the first data input to the gate of the NMOS transistor 2111 is limited, is output from the node N13.

Similarly, fourth data (third data and differential signal), in which the band width of the second data input to the gate of the NMOS transistor 2123 is limited, is output from the node N13.

<3-2> Advantageous Effects

According to the above-described embodiment, each memory set 200 does not relay a sub-channel SC, which has a higher frequency that the sub-channel SC relating to the channel allocated to the memory set 200 itself, to a subsequent memory set 200.

Specifically, in this embodiment, as the distance from the controller 10 becomes greater, the transmission band width becomes narrower. By limiting the frequency band which is transferred to the subsequent memory sets 200, an increase in power consumption can be suppressed.

The amplifier 212 may also have the same configuration and operation as the amplifier 211. In addition, instead of the amplifier 211, only the amplifier 212 may have the function of limiting the frequency band. As regards the operation of the amplifier 212, the amplifier 212 generates a transmission signal by eliminating a sub-channel having a higher frequency than a sub-channel, which is to be received by a rear-stage bridge 210 (transmission destination of the signal) of the amplifier 212, from the reception signal.

<4> Fourth Embodiment

A fourth embodiment will be described. In the fourth embodiment, the controller and the generation method of the central frequency in the NAND package will be described. Incidentally, the basic configuration and basic operation of the apparatus according to the fourth embodiment are the same as those of the apparatus according to each of the above-described embodiments. Thus, a description is omitted of matters described in the above-described embodiments and matters which are easily guessable from the above-described embodiments.

<4-1> Configuration

<4-1-1> Outline

To begin with, referring to FIG. 47, the outline of the fourth embodiment will be described. FIG. 47 is a view illustrating the outline of the fourth embodiment.

In the memory system 1 according to the fourth embodiment, the central frequency is generated in the NAND package 20, based on the central frequency used in the controller 10.

Specifically, as illustrated in FIG. 47, the NAND interface 15 includes a signal generator 155, a modulator 152 and a symbol clock generator 156.

The signal generator 155 generates a central frequency fs for a channel CHs. Then, the signal generator 155 supplies the central frequency fs to the modulator 152 and symbol clock generator 156.

The modulator 152 generates a modulation signal, based on the central frequency fs.

The symbol clock generator 156 generates a symbol clock fs/M, based on the central frequency fs.

The NAND interface 15 generates a time signal, based on the generated modulation signal, and supplies the time signal to each bridge 210 of the NAND package 20 via a data path. In addition, the NAND interface 15 supplies the generated symbol clock to each bridge 210 of the NAND package 20 via a clock path.

The bridge 210 relating to a channel CHx includes a demodulator 214.

The demodulator 214 converts the symbol clock fs/M, which the demodulator 214 received via the clock path, to the central frequency fs. Then, using the central frequency fs, the demodulator 214 demodulates a signal based on the time signal received via the data path.

Besides, the same applies to the bridges 210 relating to the other channels.

<4-1-2> Concrete Example of NAND Interface

Next, referring to FIG. 48, a description is given of a concrete configuration of the NAND interface 15 according to the fourth embodiment. FIG. 48 is a block diagram illustrating a part of the NAND interface 15.

As illustrated in FIG. 48, the NAND interface 15 includes a serial/parallel converter 151, converters 152 (in FIG. 48, 152-1 to 152-*s*), a parallel/serial converter 154, a signal generator 155, a symbol clock generator 156, and signal generators 157 (in FIG. 48, 157-1 to 157-*s*).

The signal generator 155 generates a central frequency fs, based on a reference signal fref. Then, the signal generator 155 supplies the central frequency fs to the signal generator 157-*s* and symbol clock generator 156.

The signal generators 157-1 to 175-*s*–1 generate central frequencies f1 to fs-1, respectively, based on the reference signal fref. Then, the signal generators 157-1 to 157-*s*–1 supply the central frequencies f1 to fs-1 to the modulators 152-1 to 152-*s*–1.

The signal generator 157-*s* receives the central frequency fs, and supplies the central frequency fs to the modulator 152-*s*.

The modulators 152 are provided in association with respective channels, and receive data corresponding to the respective channels. The carrier generator 1524 (see FIG. 10) of the modulator 152 receives the central frequency. Then, based on the received data and central frequency, the modulator 152 performs modulation.

The symbol clock generator 156 generates the symbol clock fs/M, based on the central frequency fs. Then, the symbol clock generator 156 supplies the symbol clock fs/M to the NAND package 20.

Besides, the symbol clock generator 156 and signal generators 157 are, for example, frequency dividers.

<4-1-3> Concrete Example of the Demodulator

Next, referring to FIG. 49, a description is given of a concrete configuration of the demodulator 214 included in the bridge 210 according to the fourth embodiment. FIG. 49 is a block diagram illustrating a part of the demodulator 214 included in the bridge 210. Here, only the demodulator 214 relating to the channel CHs will be described.

As illustrated in FIG. 49, the demodulator 214 includes a symbol clock converter 2141, a multiplier 2142, a demodulator 2144 and a parallel/serial converter 2145.

The symbol clock converter 2141 converts the symbol clock fs/M, which the symbol clock converter 2141 received via the clock path, to the central frequency fs. Then, the symbol clock converter 2141 supplies the central frequency fs to the multiplier 2142.

The multiplier 2142 receives the time signal via the data path. In the meantime, as illustrated in FIG. 13, the mixer 213 is provided in front of the demodulator 214, and only the time signal relating to the sub-channel SC necessary for the demodulator 214 is supplied from the mixer 213. The multiplier 2142 executes division of the time signal by using the central frequency fs.

The demodulator 2144 executes demodulation of the divided time signal. The demodulator 2144 supplies the demodulation signal to the parallel/serial converter 2145. This demodulation signal is a parallel signal of the I channel and Q channel.

The parallel/serial converter 2145 executes parallel/serial conversion of the demodulation signal, and generates reception data.

<4-1-4> Concrete Example of the Symbol Clock Converter

Next, referring to FIG. 50, a description is given of a concrete configuration of the symbol clock converter 2141 according to the fourth embodiment. FIG. 50 is a block diagram illustrating the symbol clock converter 2141.

As illustrated in FIG. 50, the symbol clock converter 2141 includes an injection-locked oscillator 410 and a converter 411.

The injection-locked oscillator 410 is composed of a GVCO (Gated Voltage Controlled Oscillator). The injection-locked oscillator 410 includes an edge detector 4101, a NAND arithmetic unit 4102, an inverter 4103 and an inverter 4104.

The edge detector 4101 detects an edge of the symbol clock, and outputs a detection result. Specifically, if the edge detector 4101 detects a rising edge of the symbol clock, the edge detector 4101 outputs a signal of "H" level.

The detection result from the edge detector 4101 is input to a first input terminal of the NAND arithmetic unit 4102, and a signal from the inverter 4103 is input to a second input terminal of the NAND arithmetic unit 4102. Then, the NAND arithmetic unit 4102 executes a NAND operation of the signals which are input to the first input terminal and second input terminal, and outputs an arithmetic operation result.

The inverter 4104 generates an inversion signal which is obtained by inverting the arithmetic operation result of the NAND arithmetic unit 4102. Then, the inverter 4104 supplies the inversion signal to the inverter 4103.

The inverter 4103 generates an inversion signal which is obtained by inverting the signal received from the inverter 4104. Then, the inverter 4103 supplies the inversion signal to the NAND arithmetic unit 4102.

The converter 411 generates a central frequency, based on the arithmetic operation result (output) of the NAND arithmetic unit 4102.

<4-2> Advantageous Effects

In the memory system 1 according to the above-described embodiment, the central frequency is generated in the NAND package 20, based on the central frequency used in the controller 10.

A method is conceivable in which central frequencies are independently generated from the controller 10 and NAND package 20. In this case, a jitter occurring while the central frequency is being generated in the controller 10 is not transmitted to the NAND package 20. It is thus possible that the data from the controller 10 cannot properly be received.

On the other hand, in the above-described embodiment, the central frequency is generated in the NAND package 20, based on the central frequency used in the controller 10. Thus, a jitter occurring while the central frequency is being generated in the controller 10 is transmitted to the NAND package 20.

However, if the identical central frequency is simply used in the controller 10 and NAND package 20, a problem may arise.

Hereinafter, a comparative example will be described in order to describe the advantageous effects of the present embodiment.

In the comparative example, a PLL (Phase locked loop) is adopted in place of the injection-locked oscillator 410 of the symbol clock converter 2141.

When the PLL is adopted, there is a possibility that synchronism between the data and clock is disturbed due to factors of VCO phase noise and narrow-band transmission characteristics with respect to the input signal. For example, as illustrated in FIG. 51, there is a possibility that an output delays relative to an input. In this case, a BER (Bit Error Rate) may deteriorate.

On the other hand, in the above-described embodiment, the symbol clock converter 2141, which generates the central frequency from the symbol clock, includes the injection-locked oscillator 410.

Referring to FIG. 52, the relationship between the input and output in the injection-locked oscillator 410 will be described. FIG. 52 is a view illustrating the relationship between the input and output in the injection-locked oscillator 410.

As illustrated in FIG. 52, the injection-locked oscillator 410 performs a gating operation in accordance with the rising of the symbol clock. Specifically, the injection-locked oscillator 410 performs the gating operation at every input edge. In this manner, the injection-locked oscillator 410 can instantaneously generate an output signal in relation to the input signal. There is little influence of VCO phase noise occurring in the injection-locked oscillator 410.

In addition, as illustrated in FIG. 53, the transmission characteristics of the GVCO with respect to the input signal is wider than the transmission characteristics of the PLL with respect to the input signal. Thus, by executing the frequency conversion by the GVCO, it is possible to follow up to a higher frequency band than in the case of the PLL.

According to the above-described embodiment, the NAND package 20 can properly receive a jitter of the controller 10, and can reduce the BER.

<5> Fifth Embodiment

A fifth embodiment will be described. In the fifth embodiment, a generation method of a central frequency in the controller will be described. Incidentally, the basic configuration and basic operation of the apparatus according to the fifth embodiment are the same as those of the apparatus according to each of the above-described embodiments. Thus, a description is omitted of matters described in the above-described embodiments and matters which are easily guessable from the above-described embodiments.

<5-1> Configuration

<5-1-1> Concrete Example of the NAND Interface

Next, referring to FIG. 54, a description is given of a concrete configuration of the NAND interface 15 according to the fifth embodiment. FIG. 54 is a block diagram illustrating a part of the NAND interface 15.

As illustrated in FIG. 54, the NAND interface 15 includes a serial/parallel converter 151, modulators 152 (in FIG. 54, 152-1 to 152-$s$), a parallel/serial converter 154, a symbol clock generator 156, a reference signal generator 158, and signal generators 159 (in FIG. 54, 159-1 to 159-$s$).

The reference signal generator 158 generates a central frequency fs, based on a reference signal fref. Then, the reference signal generator 158 supplies the central frequency fs to the signal generators 159-1 to 159-$s$ and symbol clock generator 156.

Based on control signals, the signal generators 159-1 to 159-$s$ generate central frequencies f1 to fs. Then, the signal generators 159-1 to 159-$s$ supply the central frequencies f1 to fs to the converters 152-1 to 152-$s$.

The signal generators 159 are, for example, frequency dividers.

<5-1-2> Concrete Example of the Signal Generator 159

Next, referring to FIG. 55, a concrete configuration of the signal generator 159 according to the fifth embodiment will be described. FIG. 55 is a block diagram illustrating a part of the signal generator 159.

As illustrated in FIG. 55, the signal generator 159 includes a GVCO (Gated Voltage Control Oscillator) 590 and a converter 591.

The GVCO 590 includes an edge detector 5901, a NAND arithmetic unit 5902, an inverter 5903 and an inverter 5904.

The edge detector 5901 detects an edge of the control signal, and outputs a detection result. Specifically, if the edge detector 5901 detects a rising edge of the control signal, the edge detector 5901 outputs a signal of "H" level.

The detection result from the edge detector 5901 is input to a first input terminal of the NAND arithmetic unit 5902, and a signal from the inverter 5903 is input to a second input terminal of the NAND arithmetic unit 5902. Then, the NAND arithmetic unit 5902 executes a NAND operation of the signals which are input to the first input terminal and second input terminal, and outputs an arithmetic operation result.

The inverter 5904 generates an inversion signal which is obtained by inverting the arithmetic operation result of the NAND arithmetic unit 5902. Then, the inverter 5904 supplies the inversion signal to the inverter 5903.

The inverter 5903 generates an inversion signal which is obtained by inverting the signal received from the inverter 5904. Then, the inverter 5903 supplies the inversion signal to the NAND arithmetic unit 5902.

The converter 591 generates a central frequency, based on the arithmetic operation result (output) of the NAND arithmetic unit 5902.

<5-2> Advantageous Effects

According to the above-described embodiment, the signal generators 159-1 to 159-$s$−1 generate central frequencies f1 to fs-1, based on the control signal fs/N from the reference signal generator 158 which generates the central frequency fs. In addition, each of the signal generators 159-1 to 159-$s$−1 includes the GVCO.

As also described in the fourth embodiment, in the GVCO, the time from the reception of the input signal to the generation of the output signal is short. Thus, for example, even if a jitter occurs in the reference signal generator 158, the same jitter can be reflected in the signal generators 159. Specifically, the central frequencies, which are generated by the reference signal generator 158 and signal generators 159-1 to 159-$s$−1, have the same jitter. In addition, each bridge 210 generates a central frequency for demodulation by using the symbol clock generated by the reference signal generator 158. Thereby, each bridge 210 generates the central frequency based on the jitter occurring in the reference signal generator 158. However, the central frequency based on the jitter occurring in the reference signal generator 158 is also used for the transmission data corresponding to the channels CH1 to CHs-1. Thus, each bridge 210 can perform demodulation corresponding to the jitter occurring on the controller 10 side.

As described above, in the fifth embodiment, compared to the fourth embodiment, the controller 10 can supply a more precise symbol clock to the NAND package 20. As a result, the NAND package 20 can more properly receive the jitter of the controller 10, and can further reduce the BER.

<6> Others

In each of the above-described embodiments, the memory system 1 was described as being, for instance, a memory card such as an SD™ card, or an SSD (solid state drive). However, the memory system 1 is not limited to these. The embodiments are applicable to any kind of memory system in which a transmitter and a plurality of receivers are connected by wire.

Besides, in each of the above-described embodiments, the example in which the channel baseband signal is multiplied by the central frequency was described. However, the timing of multiplication by the central frequency is not limited to this.

Additionally, in the above-described fourth and fifth embodiments, the example in which the time signal is multiplied by the central frequency was described. However, the timing of multiplication by the central frequency is not limited to this.

Additionally, the hardware configuration described in each of the embodiments is constituted by, for example, circuitry. Specifically, each of the NAND interface 15 (transmitter) and the bridge (receiver) 210 of the NAND package 20 may include circuitry.

Additionally, in each of the embodiments, the case of adopting the modulation method of QPSK was described. However, each embodiment is applicable to other modulation methods.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A transmitter comprising:
   a first circuit configured to execute a first band limitation by waveform shaping in a time region with respect to first data relating to a first channel to generate a first signal;
   a second circuit configured to execute a second band limitation by the waveform shaping in the time region with respect to second data relating to a second channel to generate a second signal, the second channel differing from the first channel;
   a third circuit configured to generate a third signal based on the generated first signal and a first frequency relating to the first channel;
   a fourth circuit configured to generate a fourth signal based on the generated second signal and a second frequency relating to the second channel; and
   a fifth circuit configured to generate a fifth signal by multiplexing the generated third signal and the generated fourth signal.

2. The transmitter of claim 1, wherein the first circuit is configured:
   to generate a first waveform relating to the first data;
   to compare the first data and the second data; and
   to generate the first signal by increasing an amplitude of the first waveform when the first data and the second data are identical, and by decreasing the amplitude of the first waveform when the first data and the second data are different, and the second circuit is configured:
   to generate a second waveform relating to the second data;
   to compare the first data and the second data; and
   to generate the second signal by increasing an amplitude of the second waveform when the first data and the second data are identical, and by decreasing the amplitude of the second waveform when the first data and the second data are different.

3. The transmitter of claim 1, wherein the first circuit is configured to multiply the first data by a Hanning window function when the first circuit executes the first band limitation.

4. The transmitter of claim 1, further comprising:
   a sixth circuit configured to generate a seventh signal based on a sixth signal;
   a seventh circuit configured to generate the first frequency based on the seventh signal; and
   an eighth circuit configured to generate the second frequency based on the seventh signal.

5. The transmitter of claim 4, wherein the seventh circuit and the eighth circuit are frequency dividers.

6. The transmitter of claim 4, wherein at least one of the seventh circuit and the eighth circuit is configured to perform frequency conversion by a GVCO (Gated Voltage Control Oscillator).

7. The transmitter of claim 1, further comprising:
   a sixth circuit configured to generate a seventh signal based on a sixth signal;
   a seventh circuit configured to generate the first frequency based on the seventh signal;
   an eighth circuit configured to generate the second frequency based on the seventh signal; and
   a ninth circuit configured to generate an eighth signal based on the seventh signal,
   wherein the eighth signal is used when the fifth signal is demodulated in a receiver.

8. The transmitter of claim 7, wherein the seventh circuit, the eighth circuit, and the ninth circuit are frequency dividers.

9. The transmitter of claim 1, further comprising:
   a tenth circuit configured to generate a tenth signal based on a ninth signal;
   an eleventh circuit configured to generate the first frequency based on the tenth signal; and
   a twelfth circuit configured to generate the second frequency based on the tenth signal.

10. The transmitter of claim 9, further comprising:
    a thirteenth circuit configured to generate an eleventh signal based on the tenth signal,
    wherein the generated eleventh signal is used when the fifth signal is demodulated in a receiver.

11. The transmitter of claim 10, wherein the eleventh circuit, the twelfth circuit, and the thirteenth circuit are frequency dividers.

12. The transmitter of claim 1, wherein the fifth signal is a time signal.

13. The transmitter of claim 1, wherein the transmitter is connected to a receiver with being wired.

* * * * *